US 6,653,217 B1

(12) United States Patent
Lin

(10) Patent No.: US 6,653,217 B1
(45) Date of Patent: Nov. 25, 2003

(54) METHOD OF CONNECTING A CONDUCTIVE TRACE TO A SEMICONDUCTOR CHIP

(76) Inventor: Charles W. C. Lin, 34 Pinewood Grove, Singapore (SG), 738290

( * ) Notice: Subject to any disclaimer, the term of this patent is extended or adjusted under 35 U.S.C. 154(b) by 39 days.

(21) Appl. No.: 09/878,626

(22) Filed: Jun. 11, 2001

Related U.S. Application Data

(63) Continuation-in-part of application No. 09/687,619, filed on Oct. 13, 2000.

(51) Int. Cl.⁷ .............................................. H01L 21/44
(52) U.S. Cl. ...................................... 438/612; 438/106
(58) Field of Search ............................... 438/612, 614, 438/106, 107, 118, 125, 617, 611, 613

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/179 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |

(List continued on next page.)

FOREIGN PATENT DOCUMENTS

| | | | |
|---|---|---|---|
| EP | 0 718 882 A1 | 6/1996 | ......... H01L/23/057 |
| WO | WO 97/38563 | 10/1997 | ............ H05K/1/03 |
| WO | WO 99/57762 | 11/1999 | ........... H01L/23/48 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. application Ser. No. 09/465,024, filed Dec. 16, 1999, entitled "Bumpless Flip Chip Assembly With Solder Via".

U.S. application Ser. No. 09/464,562, filed Dec. 16, 1999, entitled "Bumpless Flip Chip Assembly With Strips And Via–Fill".

(List continued on next page.)

*Primary Examiner*—Phuc T. Dang
(74) *Attorney, Agent, or Firm*—David M. Sigmond

(57) ABSTRACT

A method of connecting a conductive trace to a semiconductor chip includes providing a semiconductor chip, a conductive trace and a base, wherein the chip includes a conductive pad, the conductive trace is proximate to the pad, the base contacts and covers the conductive trace on a side opposite the chip, and the conductive trace and the base are different metals, etching the base to expose the conductive trace, and forming a connection joint that contacts and electrically connects the conductive trace and the pad.

380 Claims, 46 Drawing Sheets

U.S. PATENT DOCUMENTS

| | | | |
|---|---|---|---|
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/344 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/106 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/675 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |
| 6,258,704 B1 * | 7/2001 | Turner | |
| 6,492,252 B1 * | 12/2002 | Lin et al. | |

OTHER PUBLICATIONS

U.S. application Ser. No. 09/464,561, filed Dec. 16, 1999, entitled "Bumpless Flip Chip Assembly With Strips–In–Via And Plating".

U.S. application Ser. No. 09/120,408, filed Jul. 22, 1998, entitled "Flip Chip Assembly With Via Interconnection".

U.S. application Ser. No. 09/643,212, filed Aug. 22, 2000, entitled "Semiconductor Chip Assembly With Simultaneously Electroplated Contact Terminal and Connection Joint".

U.S. application Ser. No. 09/643,214, filed Aug. 22, 2000, entitled "Semiconductor Chip Assembly with Simultaneously Elelctrolessly Plated Contact Terminal and Connection Joint".

U.S. application Ser. No. 09/643,213, filed Aug. 22, 2000, entitled "Method Of Making A Support Circuit For A Semiconductor Chip Assembly".

U.S. application Ser. No. 09/643,445, filed Aug. 22, 2000, entitled "Method Of Making a Semiconductor Chip Assembly".

U.S. application Ser. No. 09/665,928, filed Sep. 20, 2000, entitled "Semiconductor Chip Assembly With Ball Bond Connection Joint".

U.S. application Ser. No. 09/665,931, filed Sep. 20, 2000, entitled "Method Of Making A Support Circuit With A Tapered Through–Hole For A Semiconductor Chip Assembly".

U.S. application Ser. No. 09/677,207, filed Oct. 2, 2000, entitled "Method Of Making A Semiconductor Chip Assembly With A Conductive Trace Subtractively Formed Before And After Chip Attachment".

U.S. application Ser. No. 09/865,367, filed May 24, 2001, entitled "Semiconductor Chip Assembly With Simultaneously Electroplated Contact Terminal and Connection Joint".

U.S. application Ser. No. 09/864,555, filed May 24, 2001, entitled "Semiconductor Chip Assembly with Simultaneously Electrolessly Plated Contact Terminal and Connection Joint".

U.S. application Ser. No. 09/864,773, filed May 24, 2001, entitled "Semiconductor Chip Assembly With Ball Bond Connection Joint".

* cited by examiner

METHOD OF CONNECTING A CONDUCTIVE TRACE TO A SEMICONDUCTOR CHIP

CROSS-REFERENCE TO RELATED APPLICATIONS

This application is a continuation-in-part of U.S. application Ser. No. 09/687,619 filed Oct. 13, 2000, which is incorporated by reference.

BACKGROUND OF THE INVENTION

1. Field of the Invention

The present invention relates to a semiconductor chip assembly, and more particularly to a method of mechanically and electrically connecting a conductive trace to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

U.S. Pat. No. 4,442,967 discloses a method of providing a raised contact portion on a microcircuit. A wire ball is formed on a wire end by applying thermal energy, the wire ball is pressed against a contact area on the microcircuit using thermocompression or thermosonic wire bonding to form a ball bond, a weakened area of the wire is created near the ball bond, and the wire is severed at the weakened area to provide a raised contact portion on the contact area. The contact portions thus obtained are relatively simple and economical compared to electroplated bumps. However, the contact portions do not yet provide an electrical connection to a support circuit. In order to make this connection, additional process steps are necessary, such as thermocompression bonding the contact portions to TAB inner leads, or disposing a conductive adhesive between the contact portions and bond sites in a flip-chip arrangement.

U.S. Pat. No. 4,661,192 discloses a method of bonding chips to support frames by providing ball bonds on chip pads using wire bonding, planarizing the ball bonds, coating the planarized ball bonds with conductive epoxy, and then registering. and bonding the conductive epoxy to corresponding conductive patterns on support frames. Thus, multiple process steps are necessary to electrically connect the chips to the support frames after forming the ball bonds. In addition, care must be taken to ensure that the epoxy does not flow excessively and short the leads.

Conductive adhesives that electrically connect pads on chips to conductive traces on support circuits are well-known in the art. As mentioned above, organic conductive adhesive bumps with conductive fillers in polymer binders have been used, but they do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a chip and a conductive trace that provides a low cost, high performance, high reliability package.

Another objective of the present invention is to provide a convenient, cost-effective method for manufacturing semiconductor chip assemblies as chip scale packages, chip size packages, ball grid arrays or other structures.

In accordance with one aspect of the invention, a method of connecting a conductive trace to a semiconductor chip includes providing a semiconductor chip, a conductive trace and a base, wherein the chip includes a conductive pad, the conductive trace is disposed proximate to the pad, the base contacts and covers the conductive trace on a side opposite the chip, and the conductive trace and the base are different metals, etching the base thereby exposing the conductive trace, and forming a connection joint that contacts and electrically connects the conductive trace and the pad.

Preferably, the method includes electroplating the conductive trace onto the base, mechanically attaching the chip to the conductive trace using an adhesive before etching the base, and etching the adhesive thereby exposing the pad after etching the base and before forming the connection joint.

The method may also include forming the connection joint by providing a ball bond on the conductive trace and the pad using thermocompression or thermosonic wire bonding.

The method may also include applying a selective etch that removes a portion of the base above the pad and forms a pillar in the base that covers and is electrically connected to a portion of the conductive trace, or alternatively, applying a blanket etch that removes all of the base.

The method may further include providing the conductive trace as an inner lead of a TAB lead that fans-out across an outer edge of the chip, or alternatively, as a routing line that fans-in towards the center of the chip.

An advantage of the present invention is that the semiconductor chip assembly need not include solder joints. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1K, 2A–2K and 3A–3K are cross-sectional, top and bottom views, respectively, of a method of connecting a conductive trace to a semiconductor chip in accordance with a first embodiment of the present invention. In this embodiment, the chip is singulated from other chips on a wafer before the conductive trace is connected to it, and the conductive trace is an inner lead of a TAB lead that extends across an outer edge of the chip and provides fan-out routing for the chip.

Figure 1A:
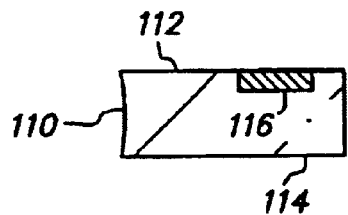
FIGS. 1A–1K are cross-sectional views showing a method of connecting a conductive trace to a semiconductor chip in accordance with a first embodiment of the present invention.
Figure 2A:
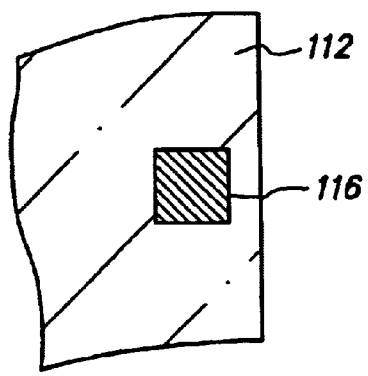
FIGS. 2A–2K are top plan views corresponding to FIGS. 1A–1K, respectively.
Figure 3A:
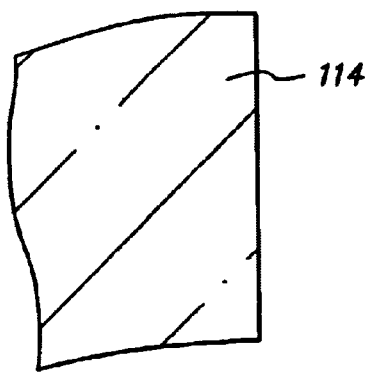
FIGS. 3A–3K are bottom plan views corresponding to FIGS. 1A–1K, respectively.

FIGS. 1A, 2A and 3A are cross-sectional, top and bottom views, respectively, of semiconductor chip 110 which is an integrated circuit in which various transistors, circuits, interconnect lines and the like are formed (not shown). Chip 110 includes upper surface 112 and lower surface 114. Upper surface 112 includes conductive pad 116. Pad 116 is substantially aligned with the insulative housing of chip 110 so that upper surface 112 is essentially flat. Alternatively, if desired, pad 116 can extend above or be recessed below the insulative housing. Pad 116 provides a bonding site to electrically couple chip 110 with external circuitry. Thus, pad 116 can be an input/output pad or a power/ground pad. Pad 116 can have an aluminum base that serves as a surface layer, or alternatively, an aluminum base covered by a surface layer such as gold with an adhesion and/or barrier layer therebetween, depending on the nature of a connection joint that shall subsequently contact the pad. If desired, the aluminum base of pad 116 is cleaned by dipping chip 110 in a solution containing 0.05 M phosphoric acid at room temperature for 1 minute and then rinsed in distilled water before depositing the next layer on the aluminum base. Pad 116 has a length and width of 70 microns. Chip 110 includes many other pads on upper surface 112, and only pad 116 is shown for convenience of illustration. In addition, chip 110 has already been singulated from other chips that it was previously attached to on a wafer.

Figure 1B:
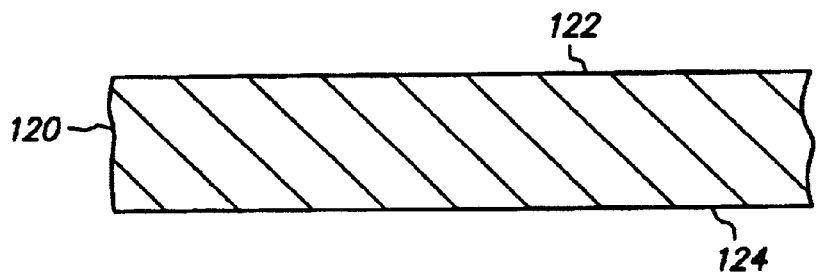
Figure 2B:
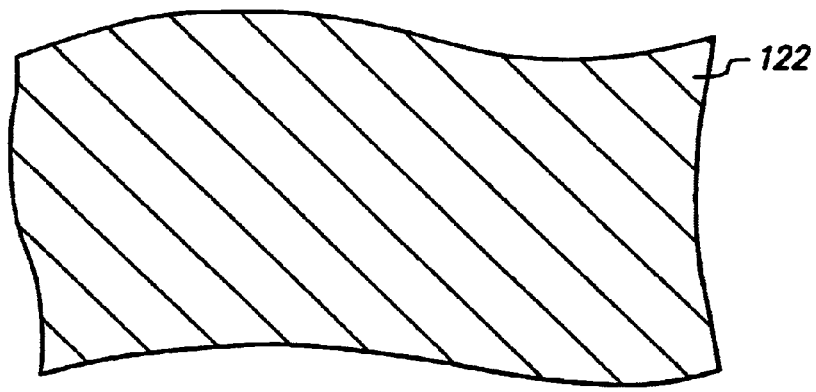
Figure 3B:
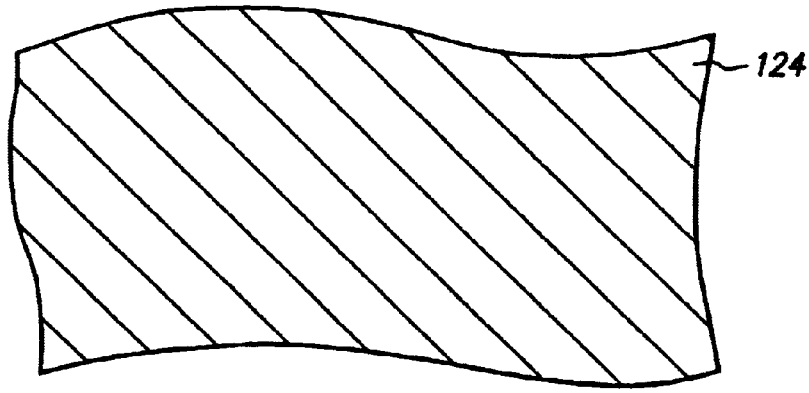

FIGS. 1B, 2B and 3B are cross-sectional, top and bottom views, respectively, of base 120 which includes top surface 122 and bottom surface 124. Base 120 is a copper foil with a thickness of 100 microns.

Figure 1C:
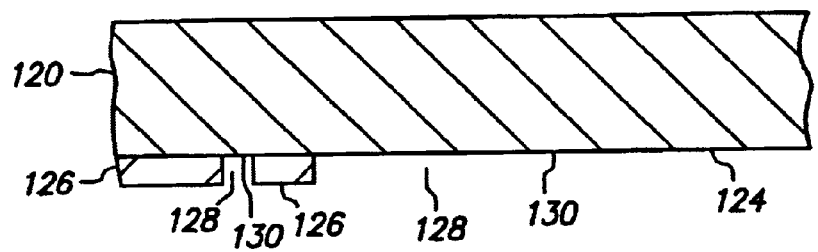
Figure 2C:
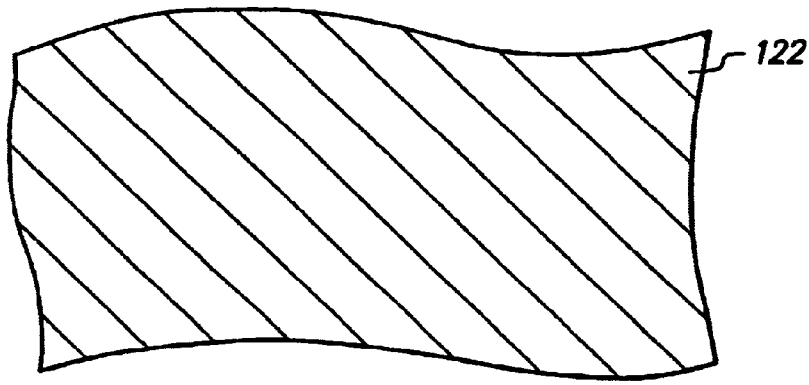
Figure 3C:
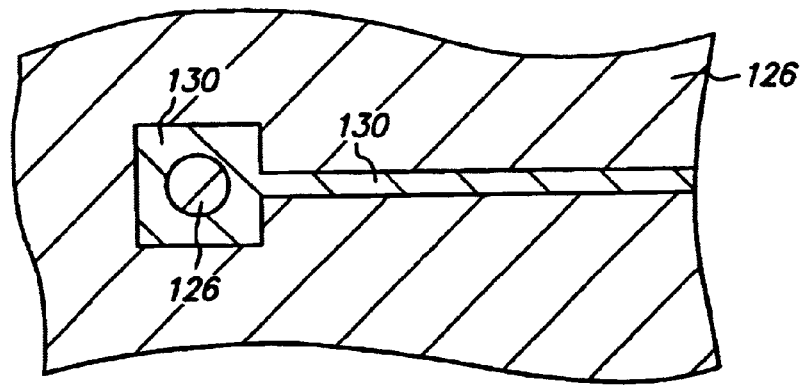

FIGS. 1C, 2C and 3C are cross-sectional, top and bottom views, respectively, of photoresist layer 126 formed on bottom surface 124 of base 120. Photoresist layer 126 is deposited as a continuous layer and then patterned by selectively applying light through a reticle (not shown), applying a developer solution to remove the photoresist portions rendered soluble by the light, and then hard baking, as is conventional. As a result, photoresist layer 126 contains opening 128 that selectively exposes portion 130 of bottom surface 124. Photoresist layer 126 has a thickness of 10 microns.

Figure 1D:
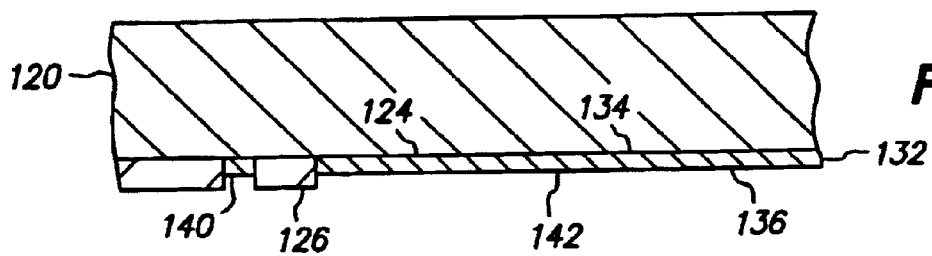
Figure 2D:
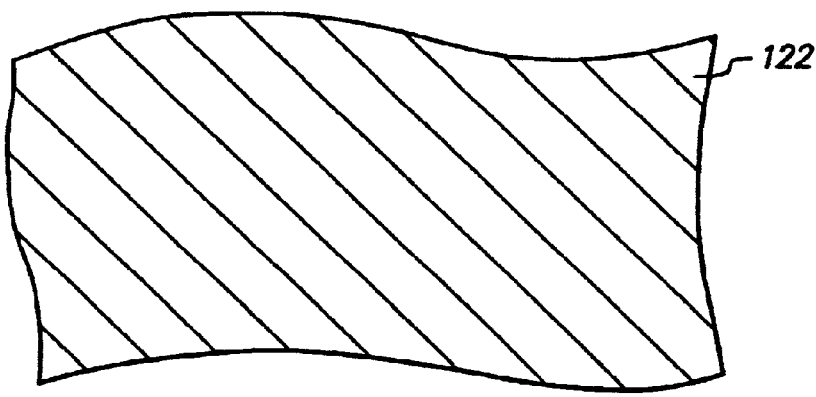
Figure 3D:
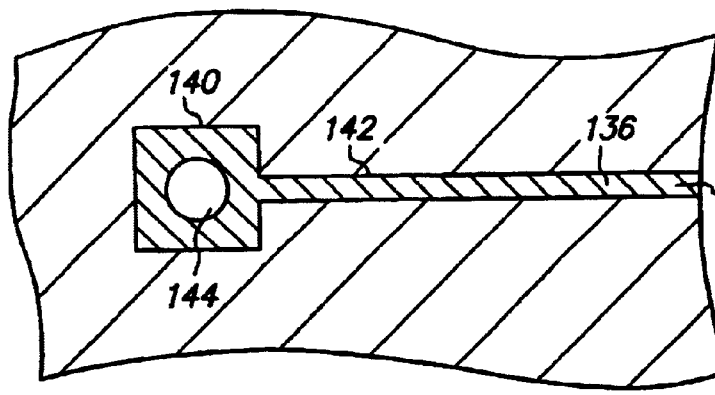

FIGS. 1D, 2D and 3D are cross-sectional, top and bottom views, respectively, of conductive trace 132 formed on base 120. Conductive trace 132 includes top surface 134, bottom surface 136, enlarged rectangular portion 140 and routing portion 142. Conductive trace 132 also includes through-hole 144 that extends between top surface 134 and bottom surface 136 and is centered within and surrounded by enlarged rectangular portion 140. Top surface 134 contacts and is covered by bottom surface 124 of base 120. Likewise, through-hole 144 is covered by bottom surface 124. Bottom surface 136 is exposed, and through-hole 144 is filled by photoresist layer 126. Conductive trace 132 is composed of gold and has a thickness of 5 microns, enlarged rectangular portion 140 has a length and width of 100 microns, routing portion 142 has a width of 20 microns, and through-hole 144 has a diameter of 60 microns.

Conductive trace 132 is formed by an electroplating operation. Thus, conductive trace 132 is formed additively. Initially, a plating bus (not shown) is connected to base 120, current is applied to the plating bus from an external power source, and base 120 is submerged in an electrolytic gold plating bath such as Technic Orotemp at room temperature. As a result, conductive trace 132 electroplates (or grows) on exposed portion 130 of bottom surface 124 of base 120. The electroplating operation continues until conductive trace 132 has the desired thickness. Thereafter, the structure is removed from the electrolytic bath and rinsed in distilled water to remove contaminants.

Figure 1E:
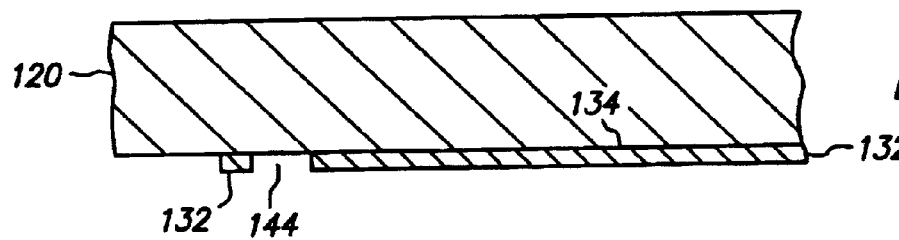
Figure 2E:
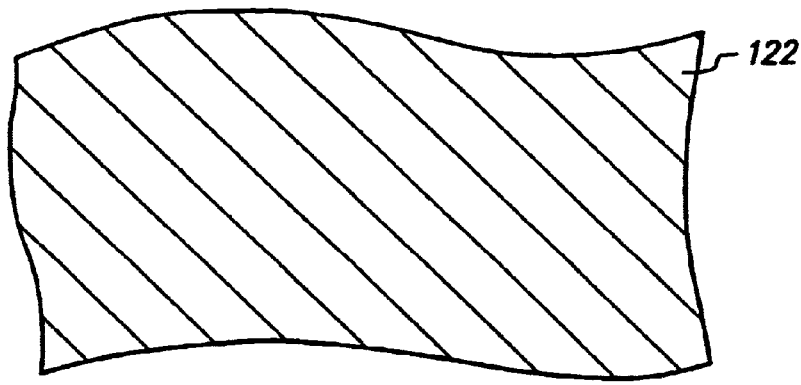
Figure 3E:
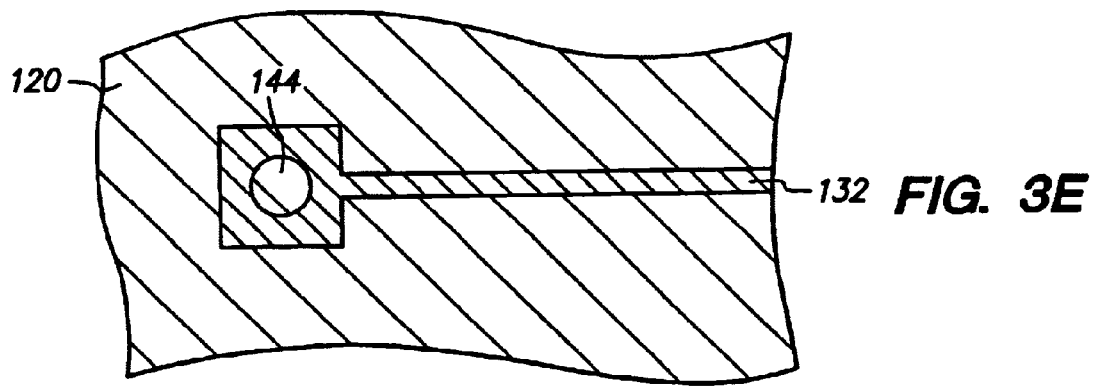

FIGS. 1E, 2E and 3E are cross-sectional, top and bottom views, respectively, of base 120 and conductive trace 132 after photoresist layer 126 is stripped. At this stage, the outer edges of conductive trace 132 and the sidewalls of through-hole 144 are exposed, however conductive trace 132 remains attached to base 120, and top surface 134 and through-hole 144 remain covered by base 120.

Figure 1F:
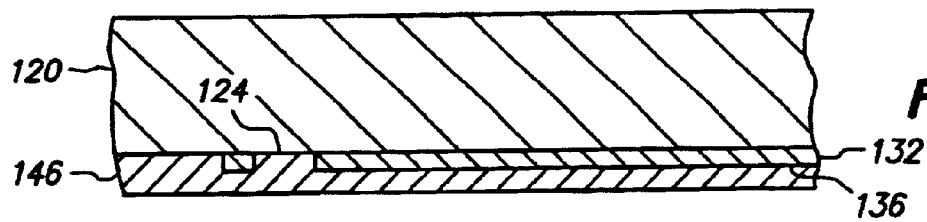
Figure 2F:
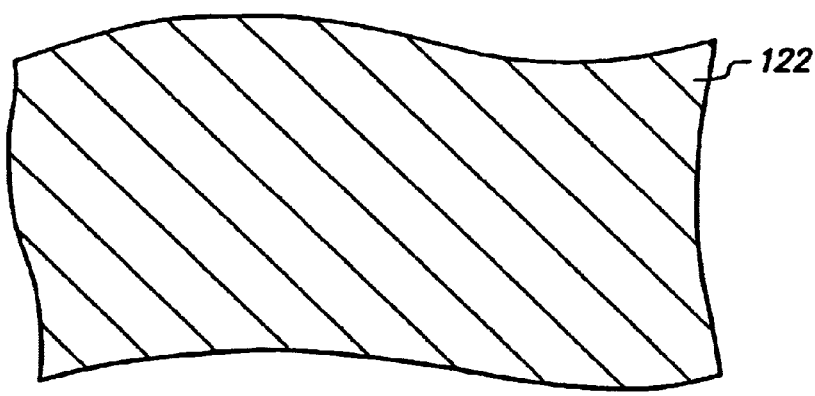
Figure 3F:
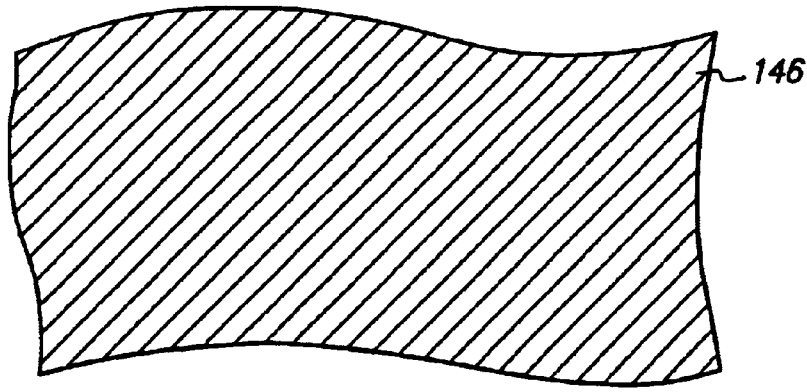

FIGS. 1F, 2F and 3F are cross-sectional, top and bottom views, respectively, of adhesive 146 attached to base 120 and conductive trace 132. Adhesive 146 is an insulative thermoplastic polyimide film with a glass transition temperature (Tg) of 400° C. Adhesive 146 is applied to bottom surface 136 of conductive trace 132 as a liquid resin such as polyamic acid using stencil printing. The liquid resin flows over the outer edges of conductive trace 132 and into through-hole 144. As a result, the liquid resin covers the exposed surfaces of conductive trace 132 and the exposed portions of bottom surface 124 of base 120 outside conductive trace 132 and within through-hole 144. Thereafter, the liquid resin is cured to form adhesive 146 as a polyimide film that extends 30 microns beneath bottom surface 124 and 25 microns beneath bottom surface 136.

Figure 1G:
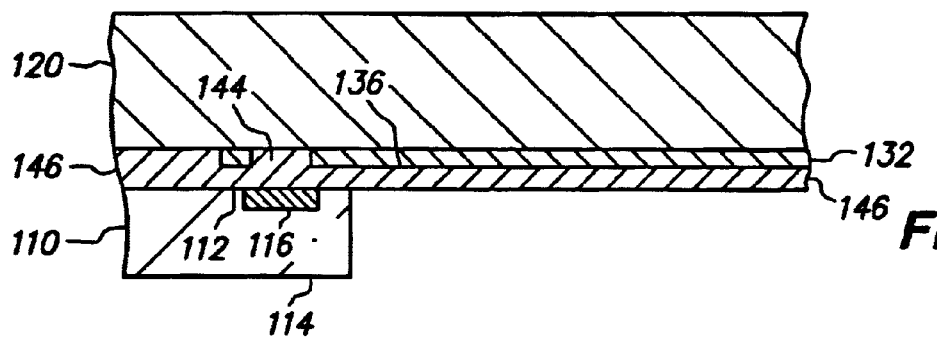
Figure 2G:
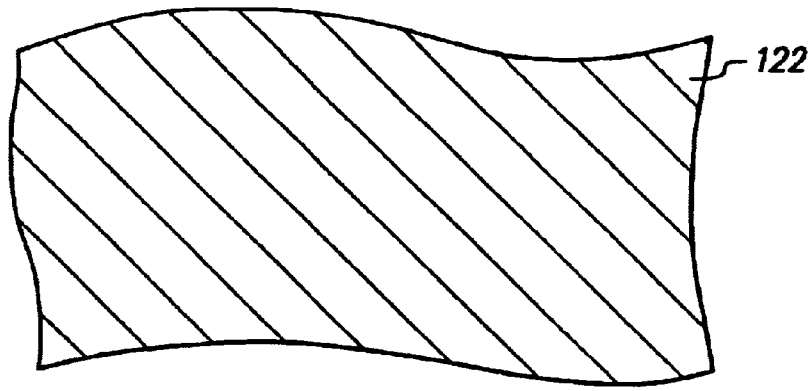
Figure 3G:
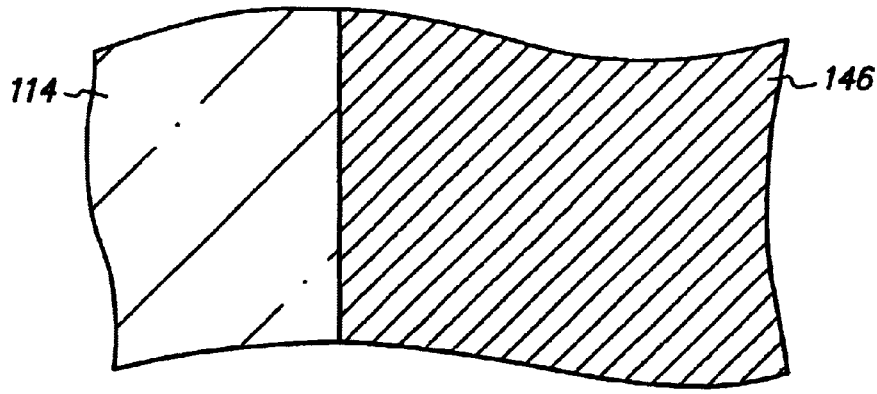

FIGS. 1G, 2G and 3G are cross-sectional, top and bottom views, respectively, of chip 110 mechanically attached to conductive trace 132 by adhesive 146. Adhesive 146 is disposed between and contacts upper surface 112 of chip 110 and bottom surface 136 of conductive trace 132. Thus, chip 110 and conductive trace 132 do not contact one another. Preferably, adhesive 146 is sandwiched between upper surface 112 and bottom surface 136 using relatively low pressure while adhesive 146 is heated to its glass transition temperature and becomes molten. In addition, chip 110 and conductive trace 132 are positioned relative to one another so that pad 116 is aligned with through-hole 144. That is, at least a portion of pad 116, and preferably a majority of pad 116, is directly beneath through-hole 144. Since the 70 micron length and width of pad 116 exceed the 60 micron diameter of through-hole 144, all of pad 116 cannot be directly beneath through-hole 144. Instead, a central portion of pad 116 is directly beneath through-hole 144 and a peripheral portion of pad 116 is outside through-hole 144. Pad 116 and through-hole 144 can be aligned using an automated pattern recognition system. Thereafter, adhesive 146 is cooled and solidifies to form a solid adhesive layer that is 25 microns thick between upper surface 112 and bottom surface 136 and mechanically fastens chip 110 to conductive trace 132. At this stage, through-hole 144 is covered from above by base 120 and filled with and covered from below by adhesive 146, pad 116 is covered from above by adhesive 146, and pad 116 is separated from conductive trace 132 by the thickness of adhesive 146.

Figure 1H:
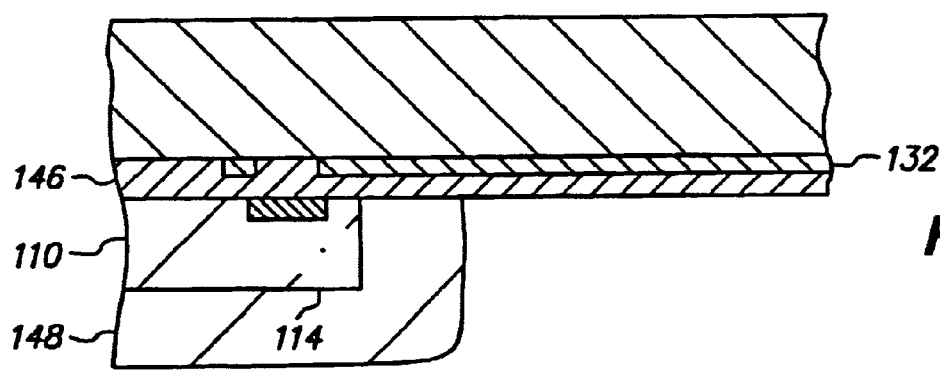
Figure 2H:
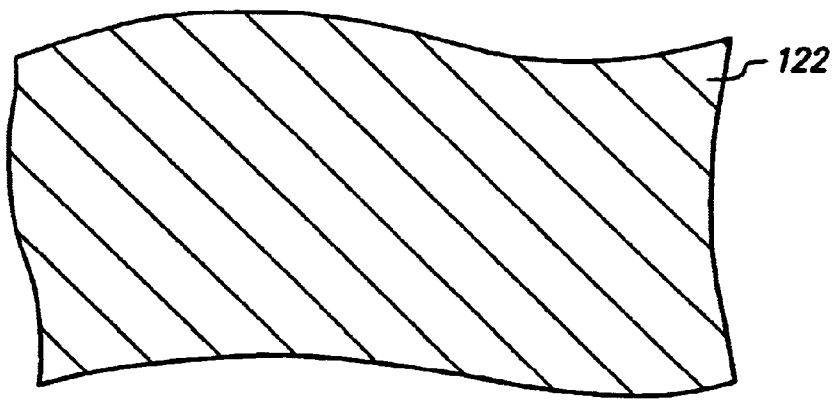
Figure 3H:
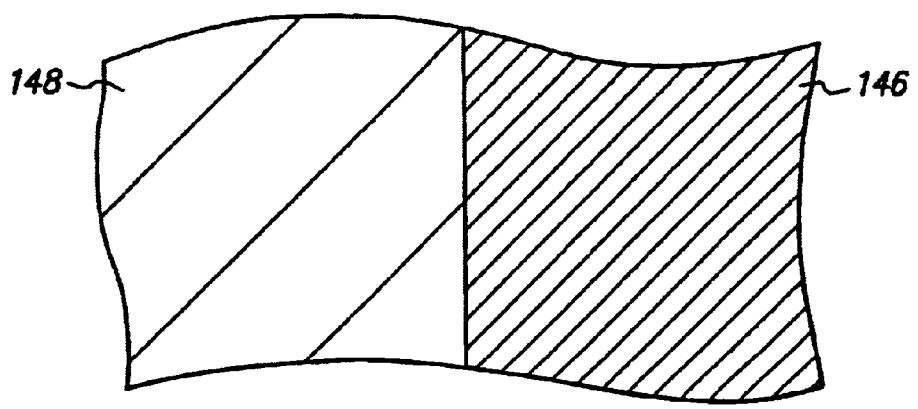

FIGS. 1H, 2H and 3H are cross-sectional, top and bottom views, respectively, of encapsulant 148 formed on lower surface 114 of chip 110. Preferably, encapsulant 148 is initially an epoxy in paste form that includes an epoxy resin, a curing agent, an accelerator and a filler. The filler is an inert material such as silica (powdered fused quartz) that provides thermal coefficient of expansion matching. The epoxy paste is coated onto the outer edges (one shown) and lower surface 114 of chip 110 as well as the surface of adhesive 146 opposite to conductive trace 132 and outside chip 110. Thereafter, the epoxy paste is cured or hardened at relatively low temperature in the range of 100–250° C. to form a solid adherent protective layer. Encapsulant 148 provides backside environmental protection such as moisture resistance and particle protection for chip 110 and has a thickness of 100 microns.

Figure 1I:
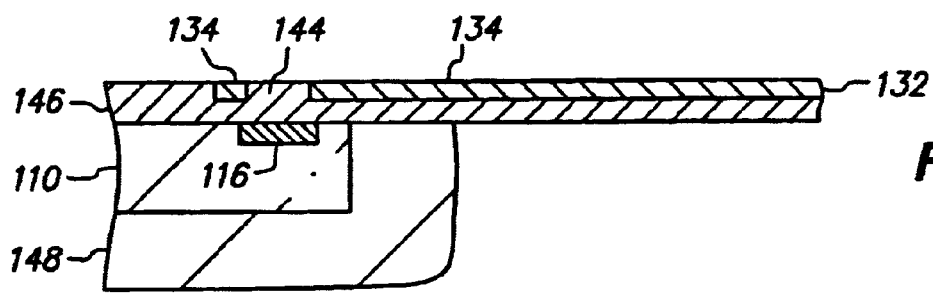
Figure 2I:
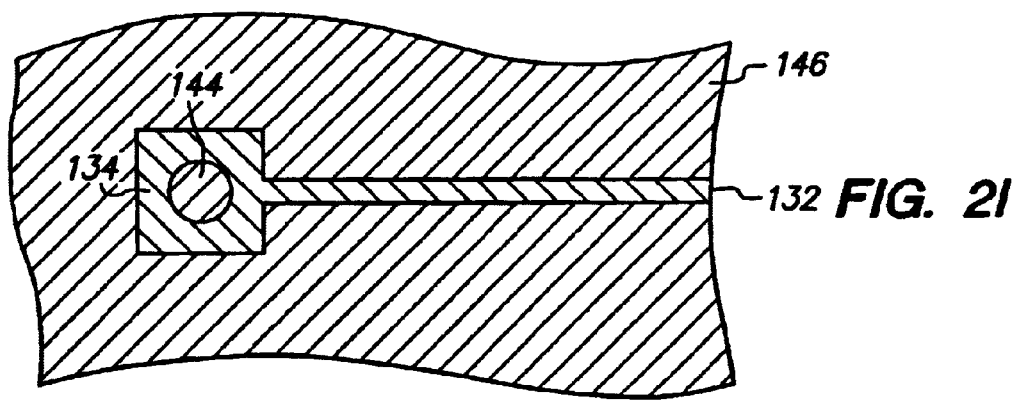
Figure 3I:
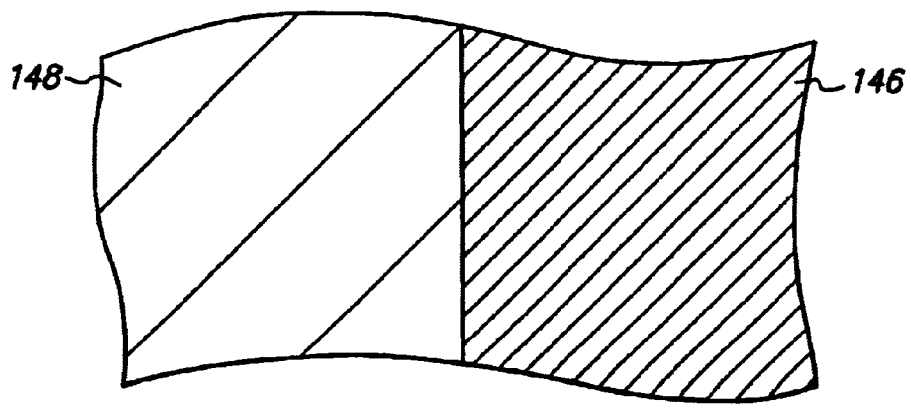

FIGS. 1I, 2I and 3I are cross-sectional, top and bottom views, respectively, of chip 110, conductive trace 132, adhesive 146 and encapsulant 148 after base 120 is removed. A "front-side" wet chemical etch is applied to top surface 122 of base 120. For instance, the wet chemical etch can be sprayed on top surface 122, or the structure can be dipped in the wet chemical etch since chip 110 is protected by encapsulant 148. The wet chemical etch is highly selective of copper with respect to gold, polyimide and epoxy. Therefore, no appreciable amount of conductive trace 132, adhesive 146 or encapsulant 148 is removed. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing base 120 to the wet chemical etch in order to completely remove base 120 without excessively exposing conductive trace 132 to the wet chemical etch can be established through trial and error. Advantageously, since the wet chemical etch is not selective of gold, there is a wide window of acceptable etch times and little or no endpoint concern.

The wet chemical etch completely removes base 120. As a result, the entire top surface 134 of conductive trace 132 is exposed, and likewise, through-hole 144 is exposed. At this stage, adhesive 146 continues to cover pad 116, fill through-hole 144, and provides critical mechanical support for conductive trace 132 which would otherwise be a dangling lead.

Figure 1J:
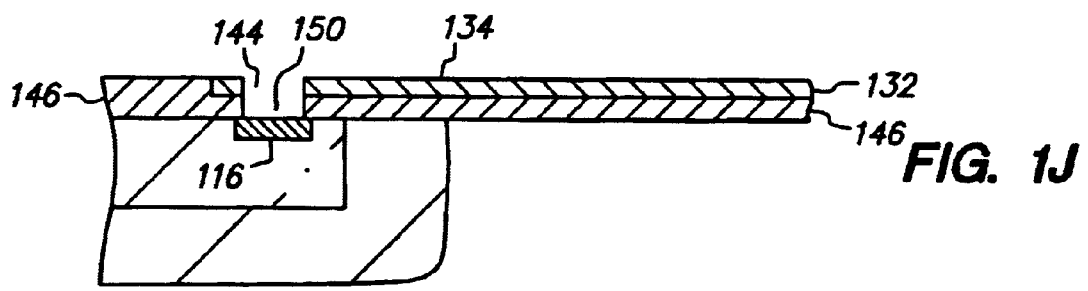
Figure 2J:
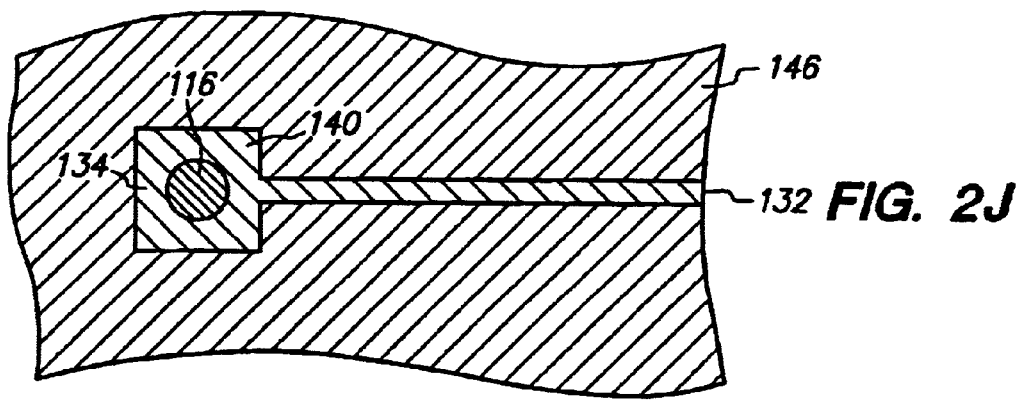
Figure 3J:
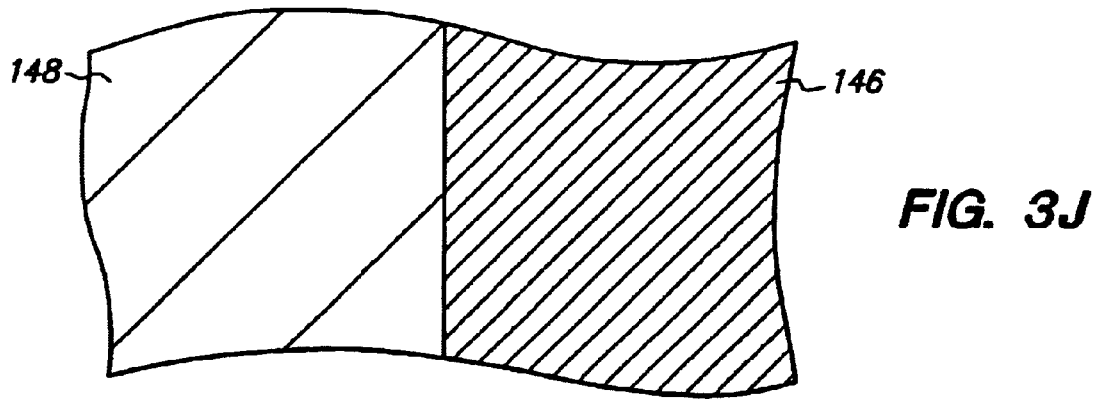

FIGS. 1J, 2J and 3J are cross-sectional, top and bottom views, respectively, of opening 150 formed in adhesive 146. In particular, any adhesive 146 in through-hole 144 is removed, and a portion of adhesive 146 directly below through-hole 144 is also removed to form opening 150 in adhesive 146. As a result, through-hole 144 and opening 150 extend through conductive trace 132 and adhesive 146, respectively, and expose pad 116. Opening 150 can be provided by applying a suitable etch that is highly selective of adhesive 146 with respect to pad 116 and conductive trace 132. The preferred etch depends on the thickness of adhesive 146.

In this instance, a selective laser etch is applied. Using projection laser ablation, a metal mask (not shown) is positioned above top surface 134 such that an opening in the metal mask is aligned with through-hole 144, and a laser is directed to the side of the metal mask opposite top surface 134. Accordingly, the metal mask targets the laser at through-hole 144. After the laser removes whatever adhesive 146 is inside or directly below through-hole 144, the laser strikes pad 116. In addition, the laser strikes a portion of the top surface of enlarged rectangular portion 140 adjacent to through-hole 144 due to registration and alignment inaccuracies. However, the laser does not strike the peripheral edges of enlarged rectangular portion 140 or outside enlarged rectangular portion 140, nor does the laser deform or remove an appreciable amount of pad 116 or enlarged rectangular portion 140. Instead, pad 116 and enlarged rectangular portion 140 provide an etch stop for the laser. As a result, the laser essentially provides an extension or pattern transfer of through-hole 144 through adhesive 146. Through-hole 144 and opening 150 each have 60 micron diameters, are axially aligned with one another, and together expose pad 116.

Figure 1K:
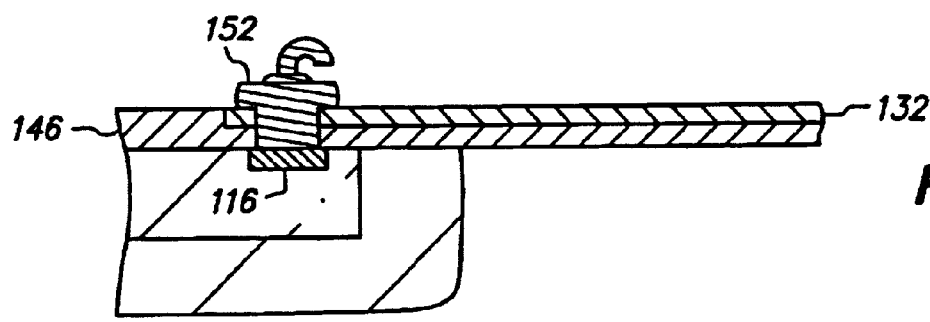
Figure 2K:
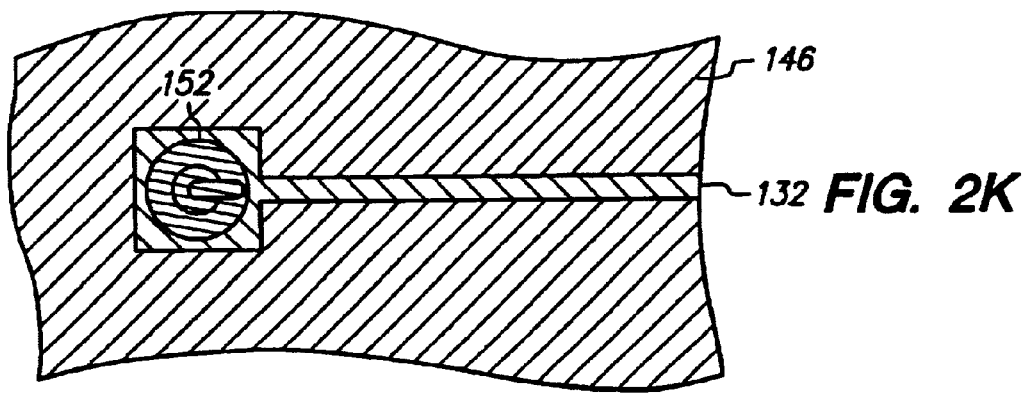
Figure 3K:
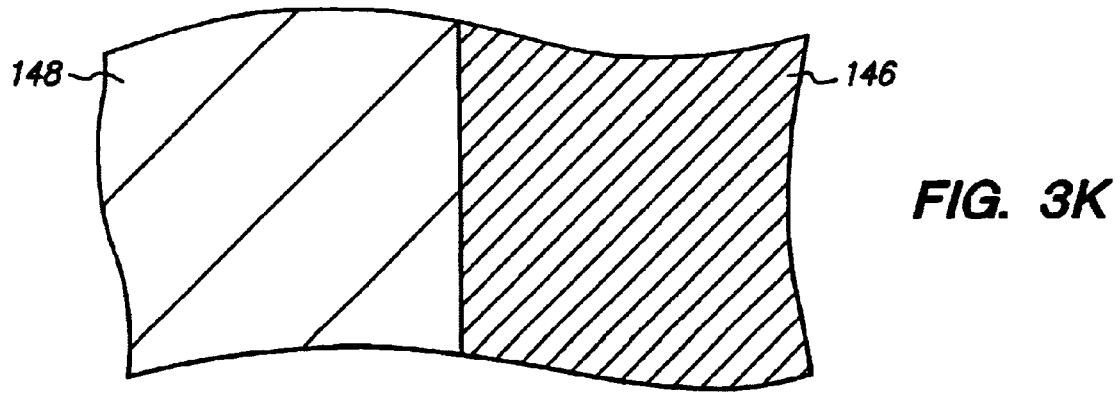

FIGS. 1K, 2K and 3K are cross-sectional, top and bottom views, respectively, of the fully completed assembly after connection joint 152 is formed. Connection joint 152 is formed in through-hole 144, extends through opening 150 in adhesive 146, and contacts pad 116 and conductive trace 132, thereby electrically connecting pad 116 and conductive trace 132. In particular, connection joint 152 contacts the central portion of pad 116 directly beneath through-hole 144, the sidewalls of opening 150, the sidewalls of through-hole 144, and a portion of the top surface of enlarged rectangular portion 140 of conductive trace 132 that is adjacent to through-hole 144. Moreover, connection joint 152 only contacts pad 116, conductive trace 132 and adhesive 146, is the only conductor in through-hole 144, and has an exposed top surface. Connection joint 152 is a gold ball bond formed by thermosonic wire bonding, although thermocompression wire bonding can also be used. Connection joint 152 provides a robust, permanent electrical connection between pad 116 and conductive trace 132.

FIGS. 4A–4E are enlarged cross-sectional views showing a method of making connection joint 152.

Figure 4A:
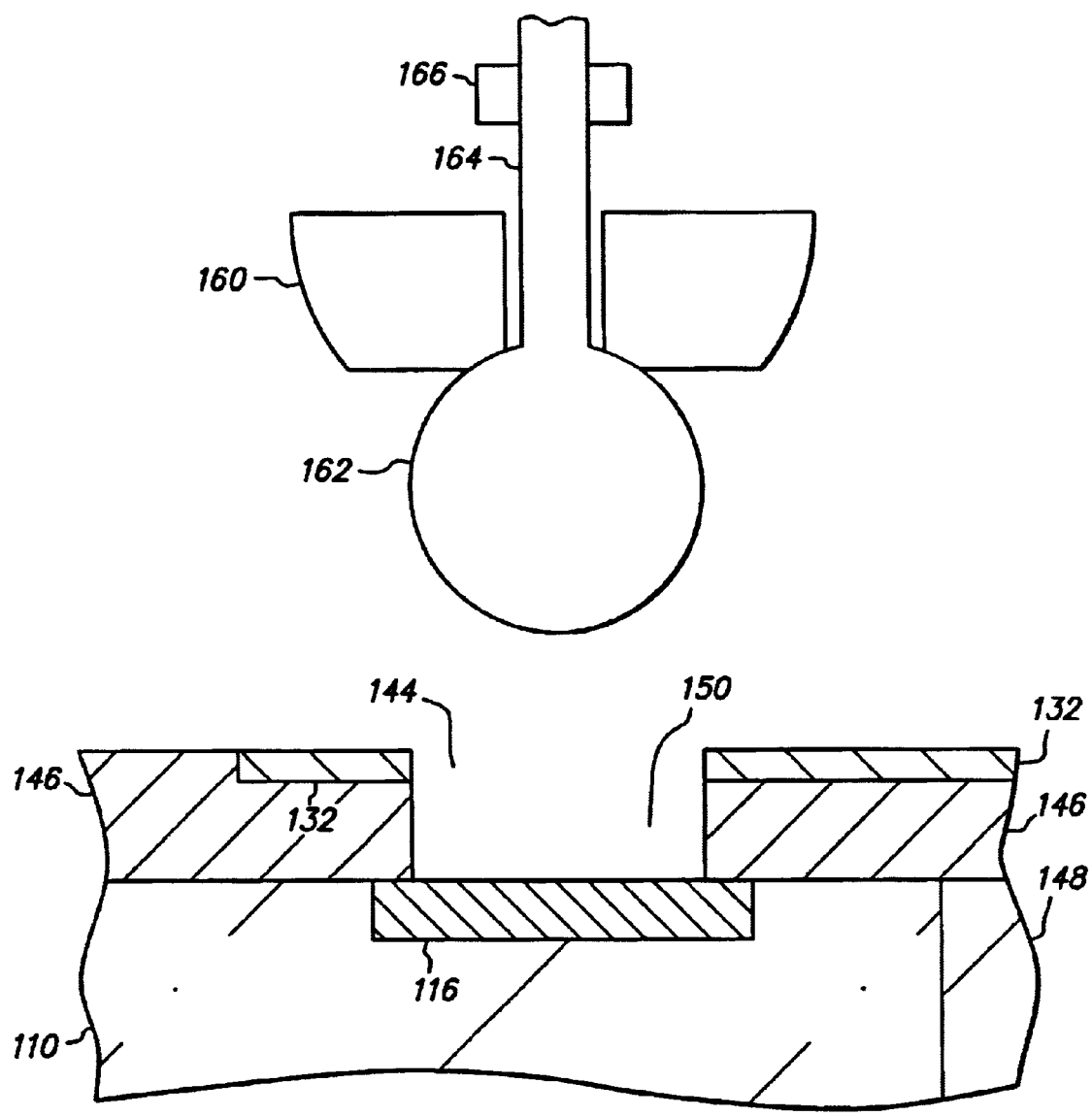
FIGS. 4A–4E are enlarged cross-sectional views showing a method of making the connection joint in FIG. 1K.

FIG. 4A shows the partially completed assembly after capillary 160 and wire ball 162 are positioned above through-hole 144. Capillary 160 is part of a conventional thermosonic wire bonding apparatus. Capillary 160 has a conical shape and can be composed of alumina, tungsten carbide, ceramic, artificial ruby or various refractory metals. Wire ball 162 is composed of gold and protrudes from the bottom of capillary 160. Wire ball 162 is formed at the end of gold wire 164 by applying thermal energy, such as electronic flame-off or a hydrogen gas flame jet, as is conventional. Wire 164 is fed from a spool (not shown) through clamp 166 and a bore in capillary 160. Clamp 166 is closed to hold wire 164 in place. Wire ball 162 has a diameter of 60 microns, and wire 164 has a diameter of 25 microns. Wire ball 162 is suitably sized so that the subsequently connection joint 152 fills through-hole 144 and opening 150. This can be determined through arithmetic calculations.

Figure 4B:
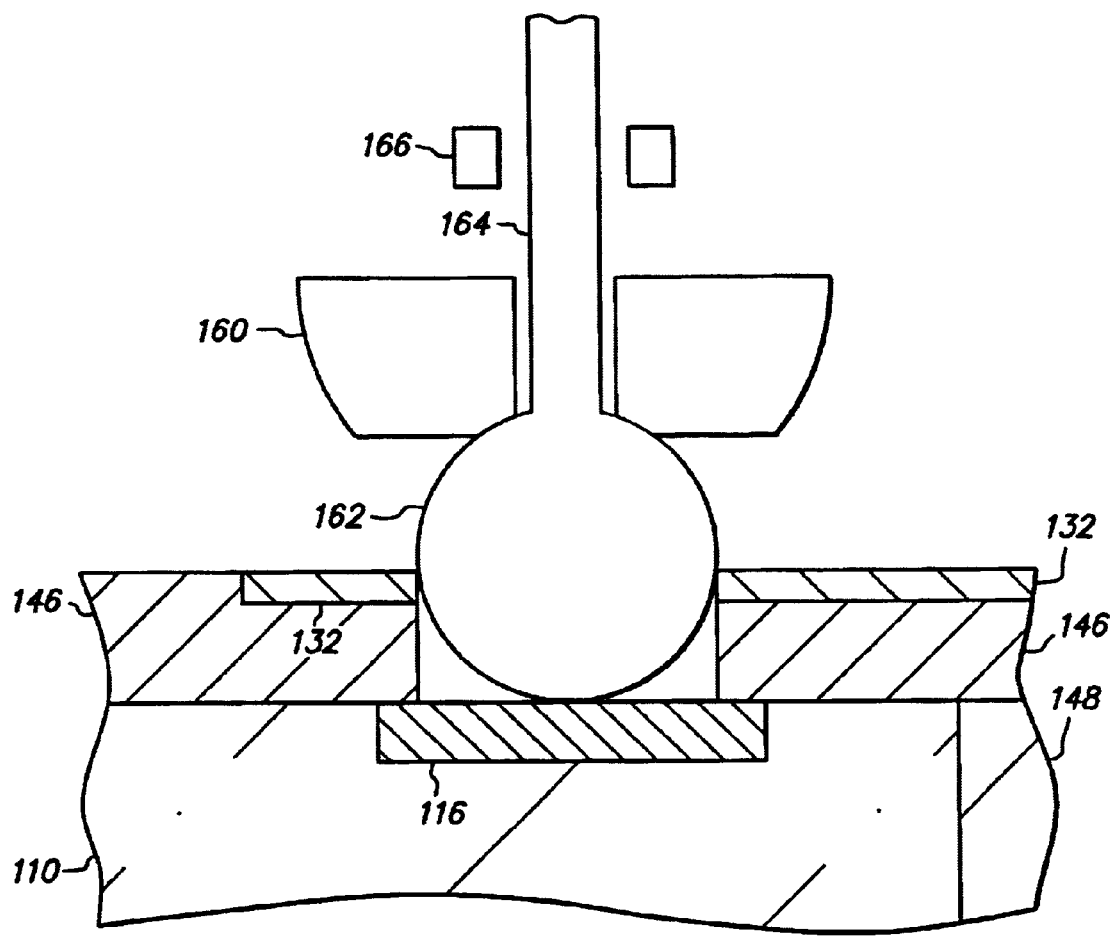

FIG. 4B shows the partially completed assembly after capillary 160 moves downward towards pad 116 such that wire ball 162 enters through-hole 144 and opening 150 and contacts pad 116 and conductive trace 132. Clamp 166 opens before the movement begins so that wire 164 unwinds from its spool as capillary 160 moves. In addition, capillary 160 is heated to about 150 to 200° C. and provides horizontal ultrasonic oscillatory motions with a frequency of about 60 to 120 kHz. The combination of heat from capillary 160 and the recent flaming operation place wire ball 162 in a soft state which is easy to deform. However, the temperature of wire ball 162 does not reach the glass transition temperature of adhesive 146 which remains a solid adhesive film.

Figure 4C:
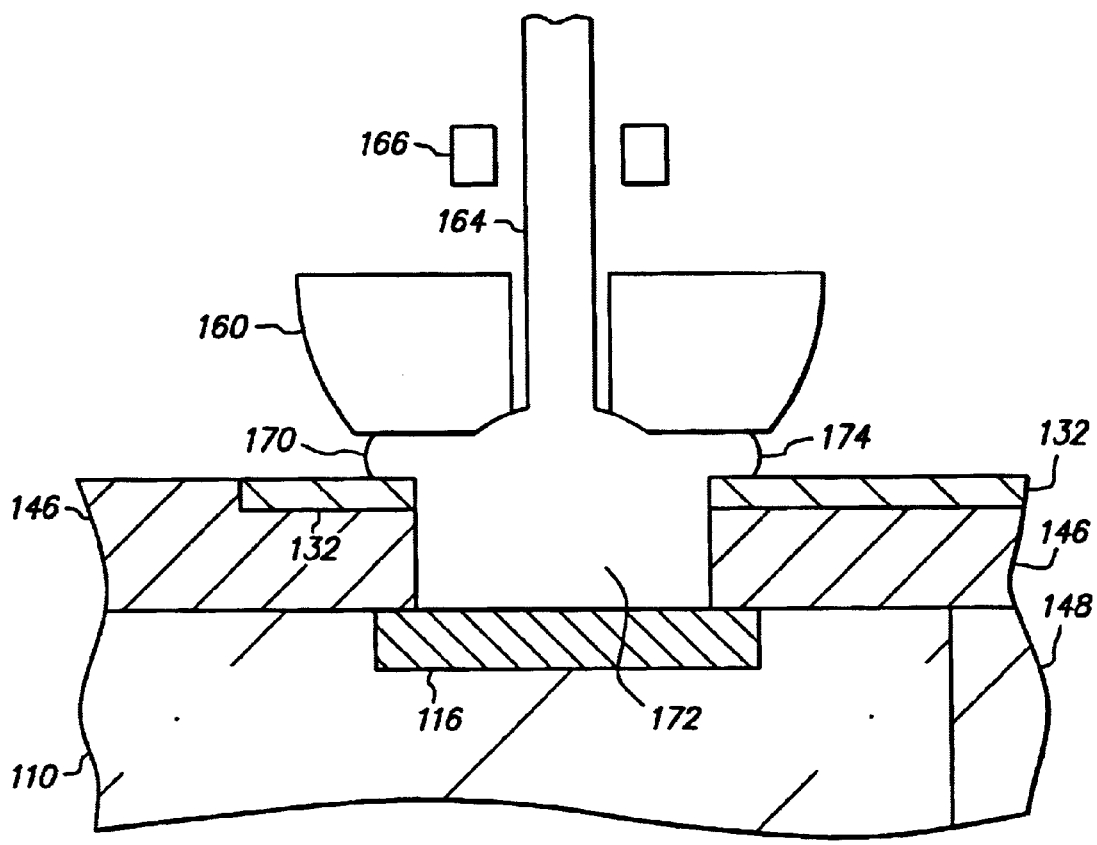

FIG. 4C shows the partially completed assembly after capillary 160 moves further downward towards pad 116 such that wire ball 162 deforms into mushroom-shaped ball bond 170 that fills through-hole 144 and opening 150. More particularly, since wire ball 162 is still in a soft state which is easy to deform, and capillary 160 exerts a downward force of about 25 to 45 grams while continuing to oscillate ultrasonically, wire ball 162 squeezes into through-hole 144 and opening 150 and deforms into mushroom-shaped ball bond 170 that includes stem 172 and pileus or cap 174. Stem 172 fills through-hole 144 and opening 150 and contacts pad 116 and the sidewalls of through-hole 144 and opening 150. Cap 174 extends above conductive trace 132 and contacts a portion of the top surface of enlarged rectangular portion 140 that is adjacent to through-hole 144 without contacting the peripheral edges of enlarged rectangular portion 140 and without contacting routing portion 142 of conductive trace 132. Clamp 166 remains open so that wire 164 continues to unwind from its spool as capillary 160 moves. Furthermore, the combination of heat, pressure and ultrasonic vibration forms a gold-aluminum alloy between ball bond 170 and pad 116 and a fused gold joint between ball bond 170 and conductive trace 132.

Figure 4D:
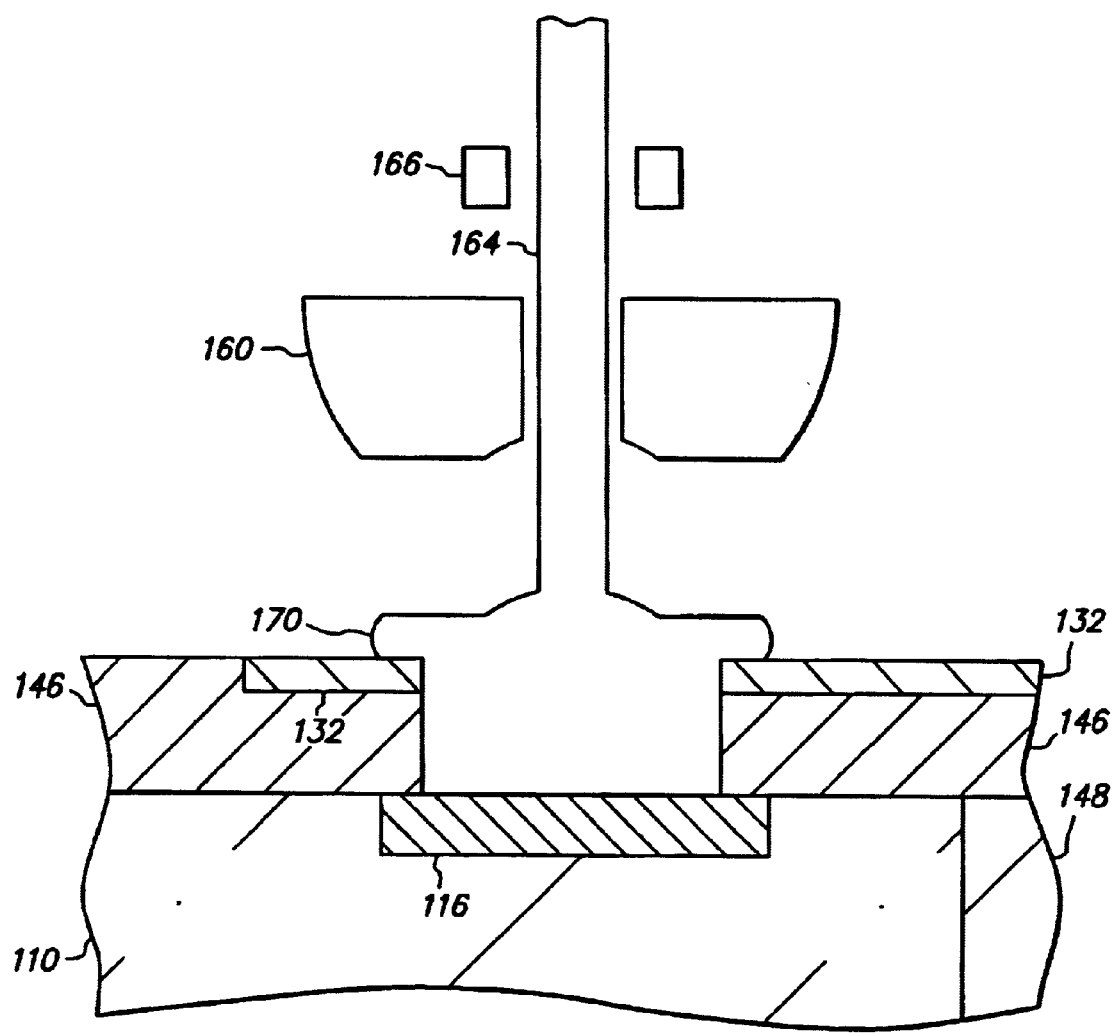

FIG. 4D shows the partially completed assembly after capillary 160 moves upward away from pad 116 and mushroom-shaped ball bond 170 while clamp 166 remains open and wire 164 slides through capillary 160 without exerting upward pressure on ball bond 170. In addition, ball bond 170 begins to cool and solidify.

Figure 4E:
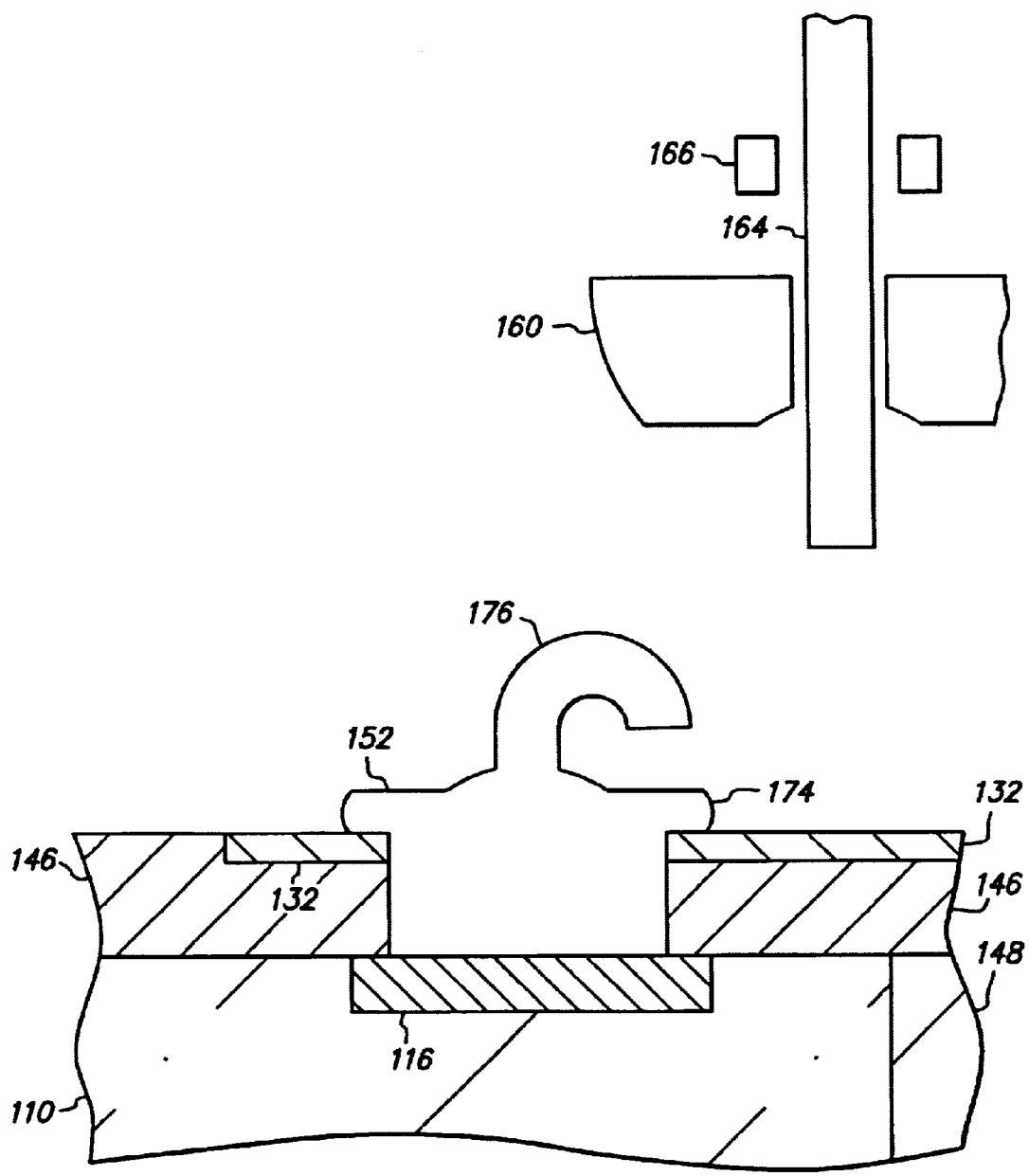
Figure 6A:
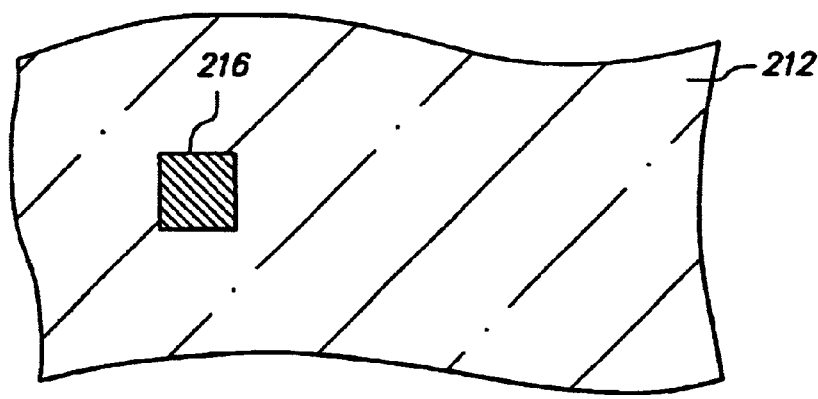
FIGS. 6A–6N are top plan views corresponding to FIGS. 5A–5N, respectively.
Figure 7A:
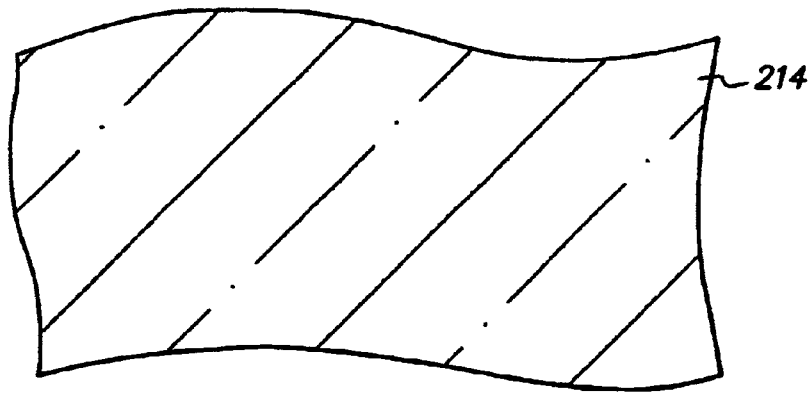
FIGS. 7A–7N are bottom plan views corresponding to FIGS. 5A–5N, respectively.
Figure 6B:
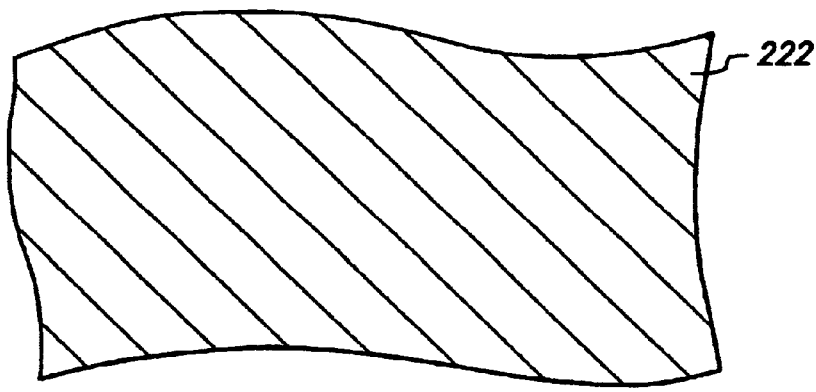
Figure 7B:
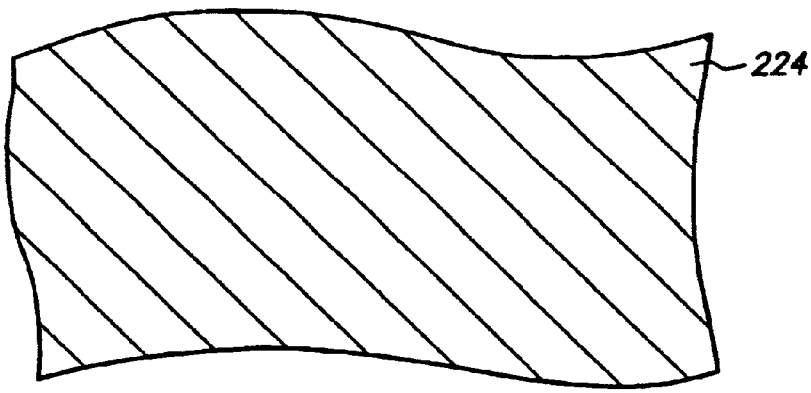
Figure 6C:
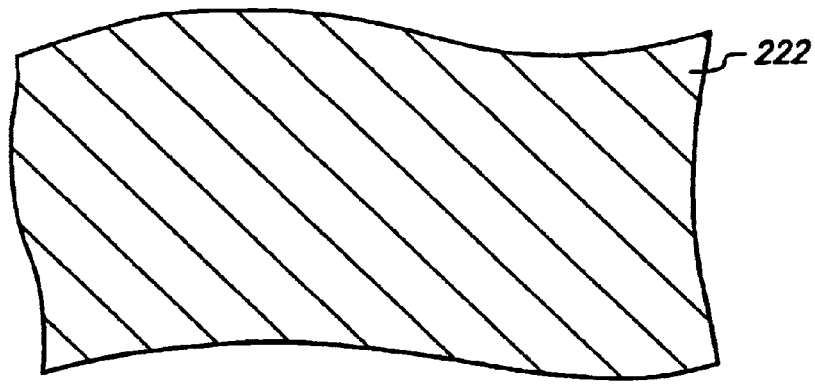
Figure 7C:
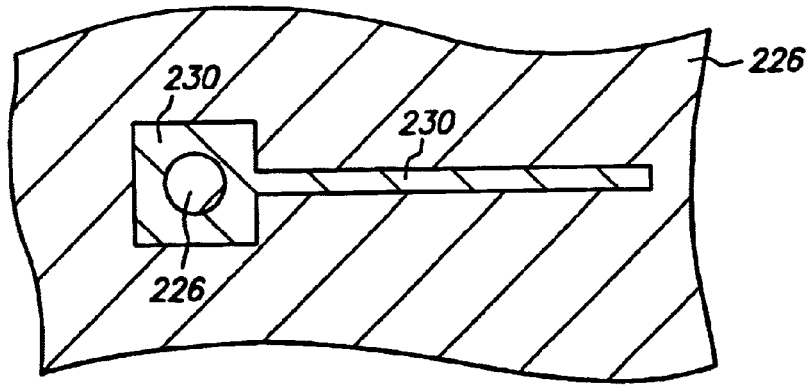
Figure 6D:
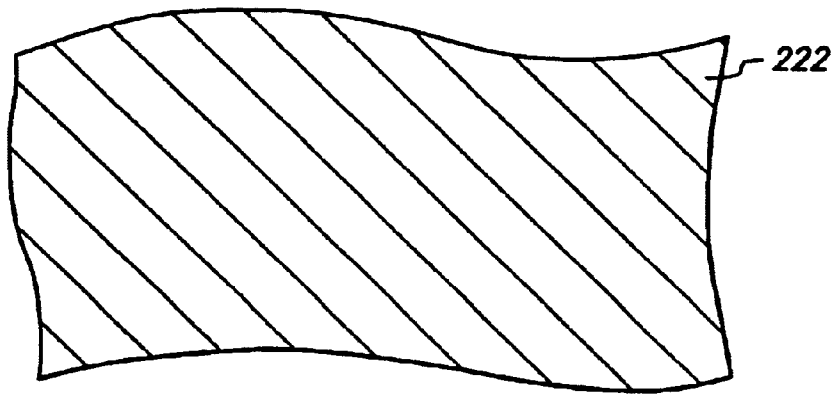
Figure 7D:
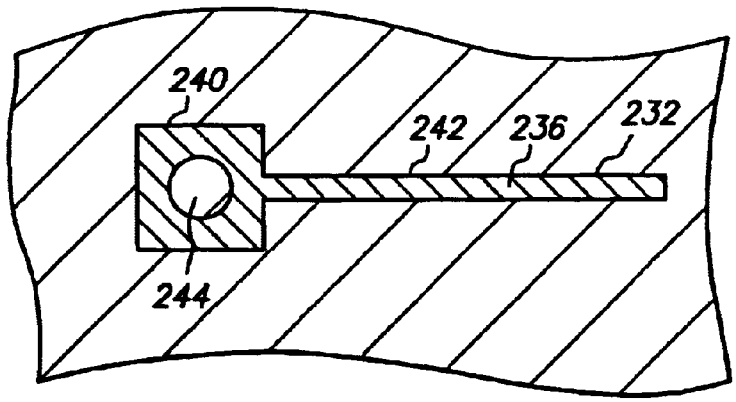
Figure 6E:
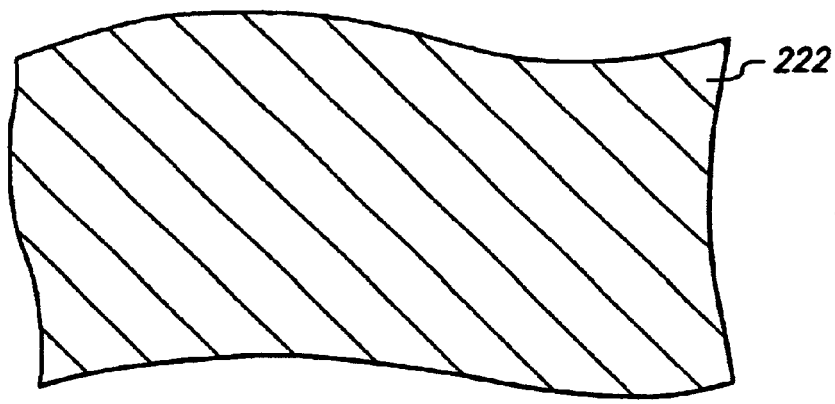
Figure 7E:
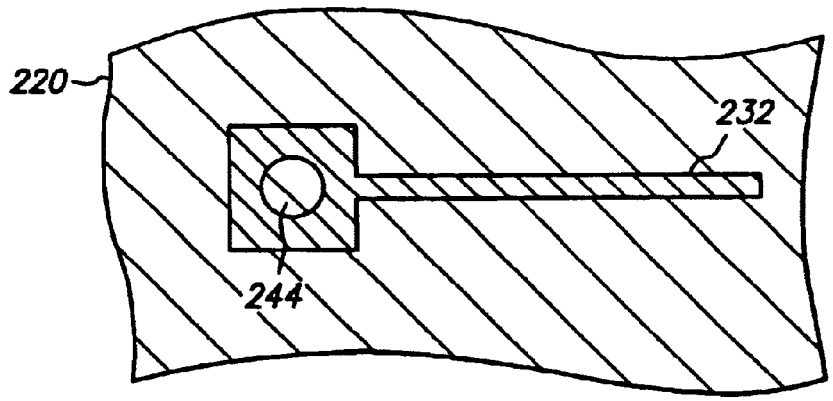
Figure 6F:
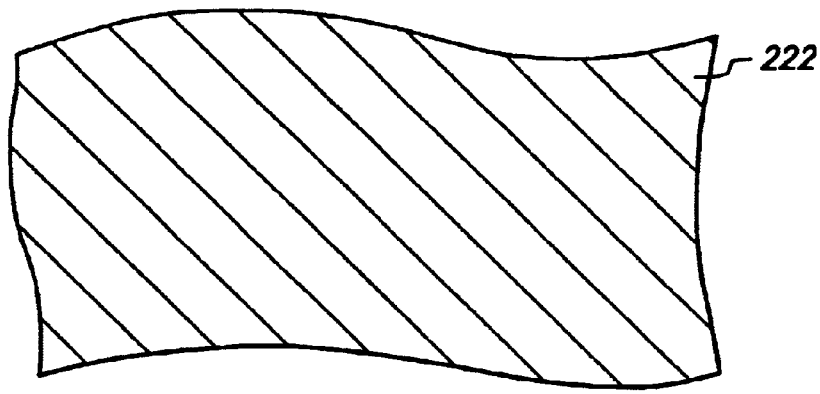
Figure 7F:
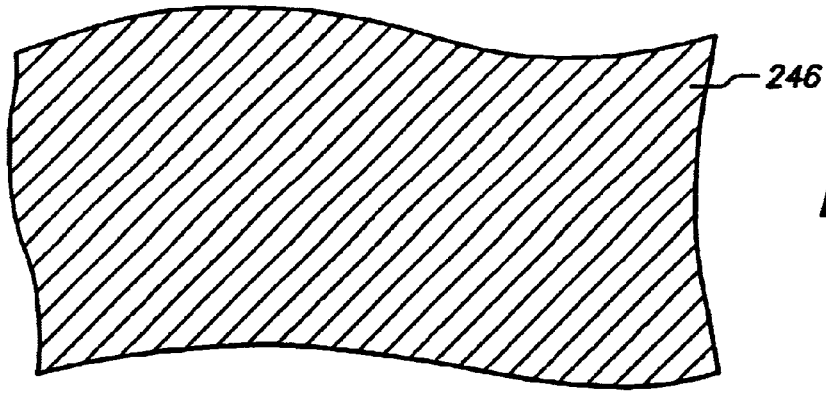
Figure 6G:
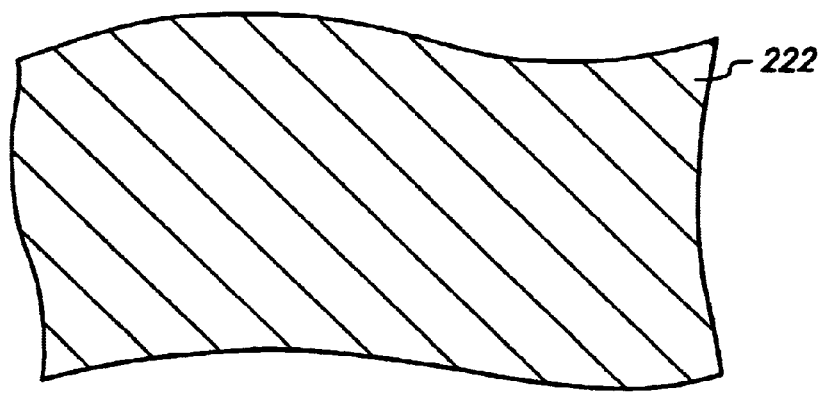
Figure 7G:
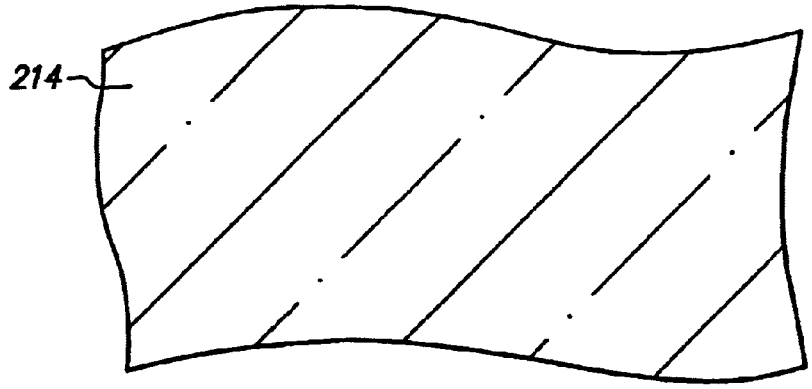
Figure 6H:
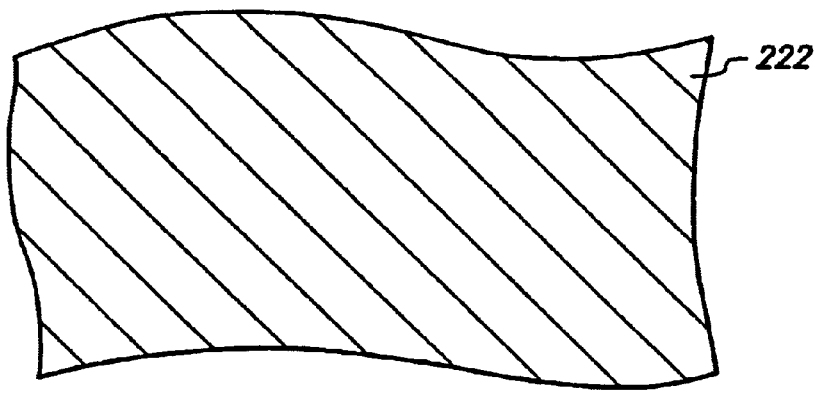
Figure 7H:
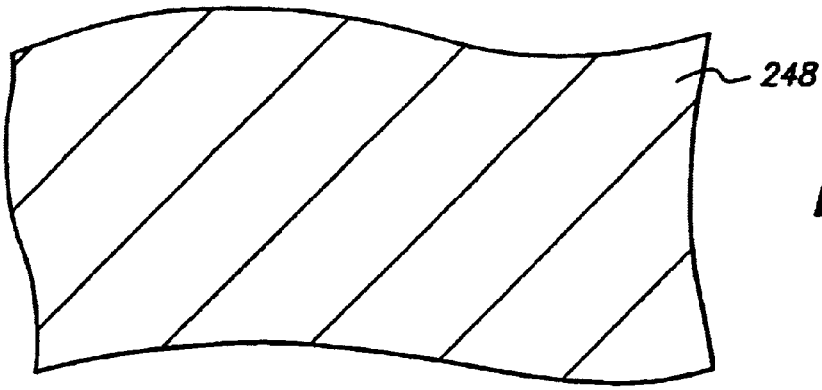

FIG. 4E shows the completed assembly after ball bond 170 solidifies to form connection joint 152, clamp 166 closes, and capillary 160 moves in a horizontal loop and then downward with a force of 70 to 90 grams in order to cut wire 164 at is edge in proximity to cap 174 thereby disconnecting wire 164 from connection joint 152. As a result, connection joint 152 has a mushroom-shape with an inconsequential inverted U-shaped tail 176 that extends above cap 174. Of importance, connection joint 152 forms an alloyed metallic bond to pad 116 and conductive trace 132 at essentially the same time during a single thermosonic ball bonding operation.

At this stage, the manufacture of a semiconductor chip assembly that includes chip 110 and conductive trace 132 can be considered complete. Conductive trace 132 is mechanically and electrically coupled to chip 110 by adhesive 146 and connection joint 152, respectively. Conductive trace 132 extends beyond an outer edge of chip 110 and provides horizontal fan-out routing between pad 116 and external circuitry. Advantageously, conductive trace 132 is a single continuous metal segment that is the inner lead (or inner end) of a TAB lead.

The semiconductor chip assembly includes other conductive traces embedded in adhesive 146, and only a single conductive trace 132 is shown for convenience of illustration. The conductive traces are each connected to a respective pad on chip 110 by a respective connection joint in a respective through-hole. Furthermore, the conductive traces each extend across an outer edge of chip 110 proximate to their respective pads to provide horizontal fan-out routing for their respective pads. The conductive traces are electrically isolated from one another by adhesive 146 after base 120 is removed. Advantageously, since base 120 provides a plating bus for forming the conductive traces, and the connection joints are formed by ball bonding, there is no plating bus or related circuitry that need be disconnected or severed from chip 110 or the conductive traces after base 120 is removed and the connection joints are formed.

FIGS. 5A–5N, 6A–6N and 7A–7N are cross-sectional, top and bottom views, respectively, of a method of connecting a conductive trace to a semiconductor chip in accordance with a second embodiment of the present invention. In this embodiment, the chip is one of many chips on a wafer when the conductive trace is connected to the pad, and then the chip is singulated from other chips on the wafer to form a chip size package. In addition, the conductive trace provides fan-in routing for the pad. Furthermore, the entire base is not removed, instead, a portion of the base over the pad is removed while another portion of the base remains to form a pillar that is electrically connected to the conductive trace and provides vertical routing for the pad. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, base 220 corresponds to base 120, etc.

FIGS. 5A–5H, 6A–6H and 7A–7H depict manufacturing steps generally similar to those in FIGS. 1A–1H, 2A–2H and 3A–3H, except as follows.

First, chip 210 is one of many chips on a wafer. Chip 210 has yet to be singulated from other chips on the wafer is not singulated until after it is mechanically and electrically connected to conductive trace 232, whereas chip 110 is singulated before it is mechanically or electrically connected to conductive trace 132.

Second, base 220 has a thickness of 150 microns, whereas base 120 has a thickness of 100 microns. Base 220 is thicker since, as described below, a portion of base 220 remains connected to conductive trace 232 after connection joint 252 is formed and provides vertical routing for pad 216.

Third, conductive trace 232 fans-in towards the center of chip 210, whereas conductive trace 132 fans-out across an outer edge of chip 110.

Fourth, conductive trace 232 is not an inner lead of a TAB lead, whereas conductive trace 132 is an inner lead of a TAB lead.

Fifth, adhesive 246 is 10 microns thick (between chip 210 and conductive trace 232), whereas adhesive 146 is 25 microns thick (between chip 110 and conductive trace 132). Adhesive 246 is thinner since it need not support a conductive trace that fans-out beyond the chip.

Sixth, encapsulant 248 contacts only bottom surface 214 of chip 210 since the four outer edges of chip 210 are not exposed until singulation occurs, whereas encapsulant 148 contacts both the outer edges and bottom surface 114 of chip 110.

Figure 5A:
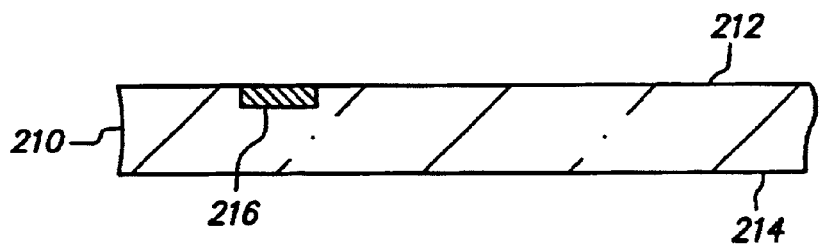
FIGS. 5A–5N are cross-sectional views showing a method of connecting a conductive trace to a semiconductor chip in accordance with a second embodiment of the present invention.
Figure 5B:
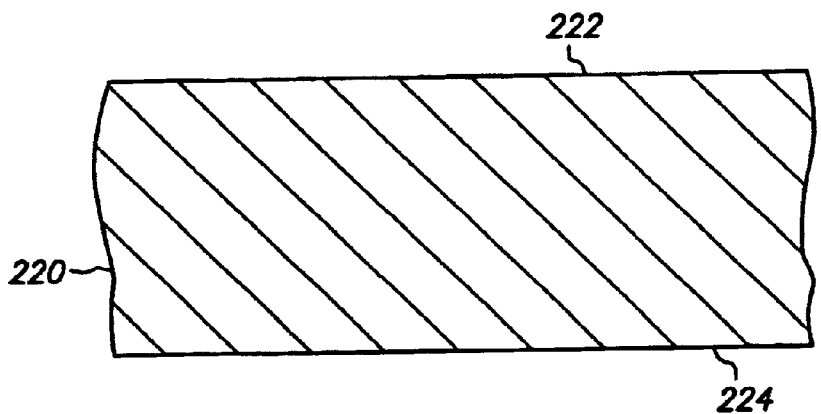
Figure 5C:
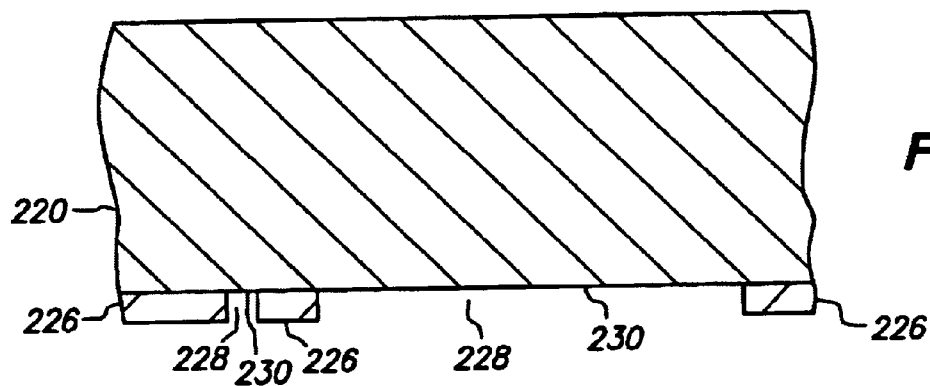
Figure 5D:
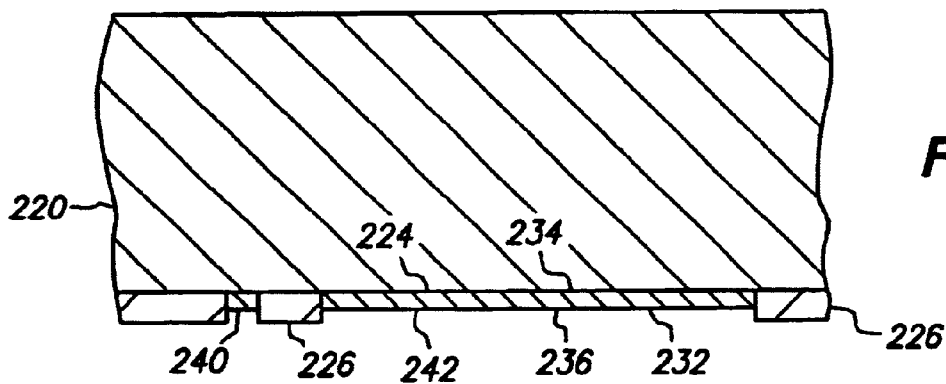
Figure 5E:
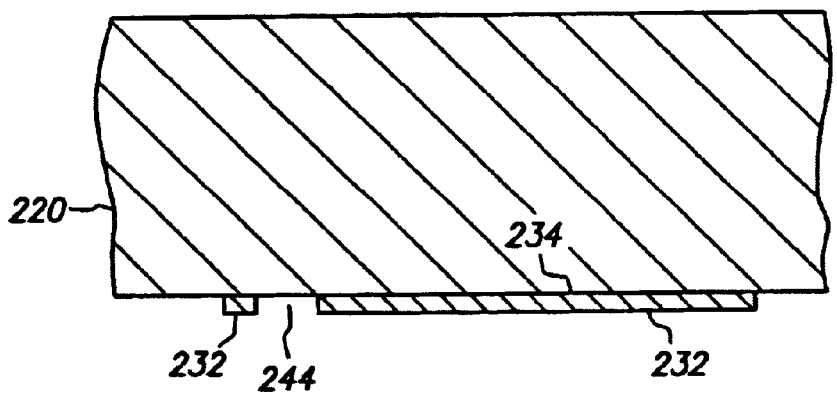
Figure 5F:
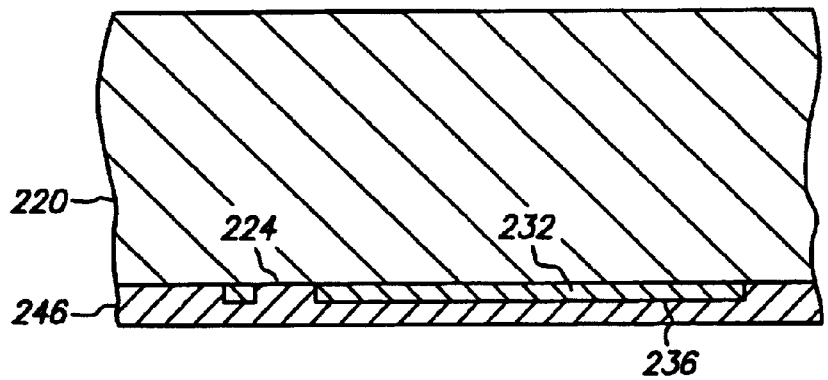
Figure 5G:
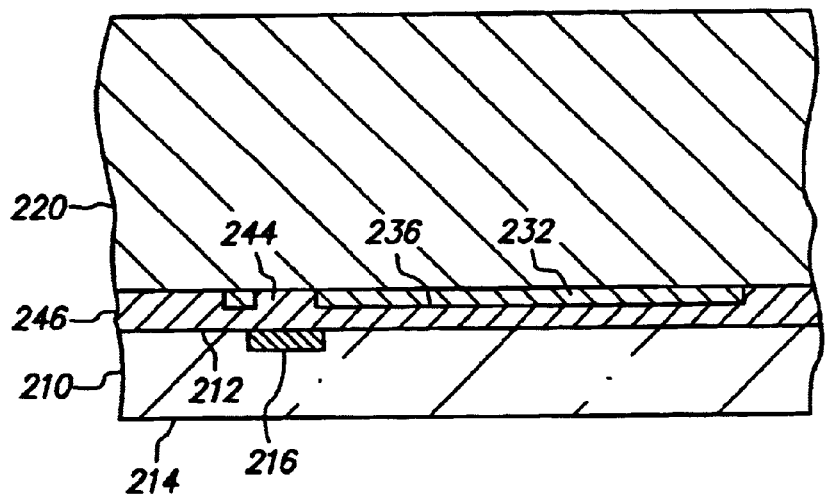
Figure 5H:
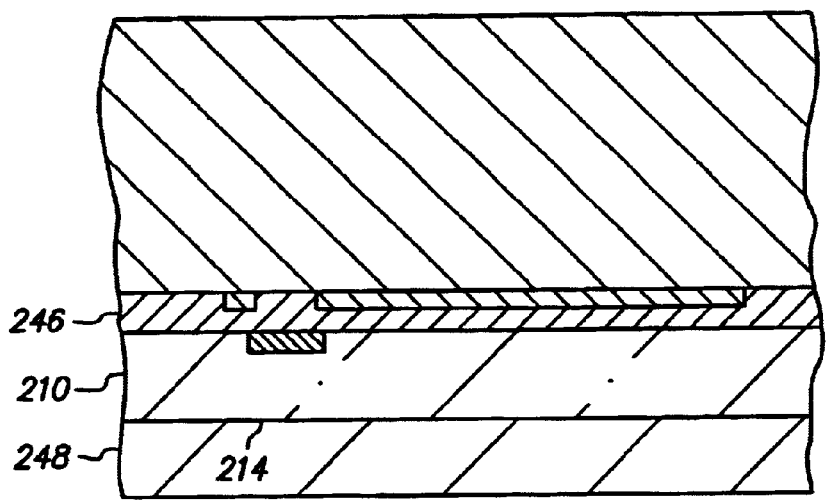
Figure 5I:
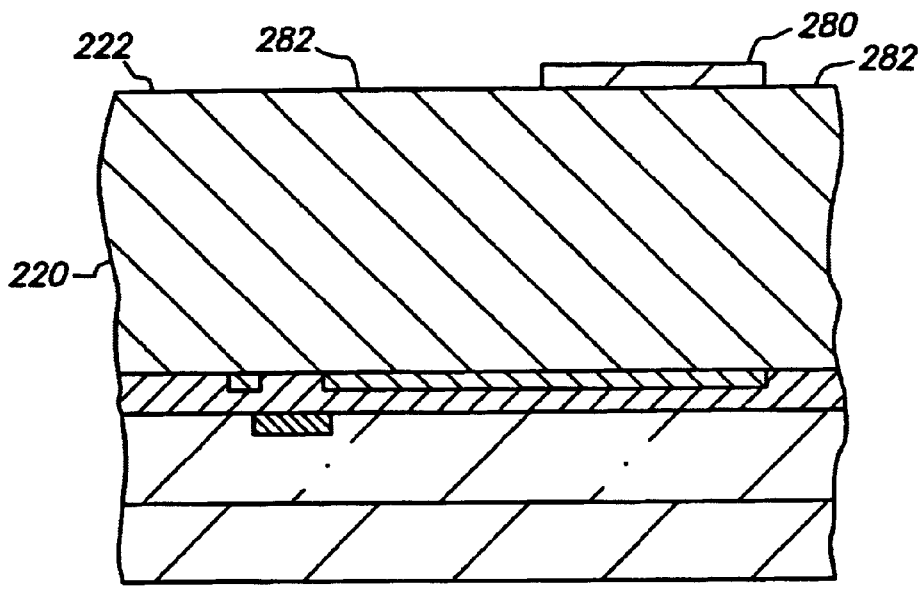
Figure 6I:
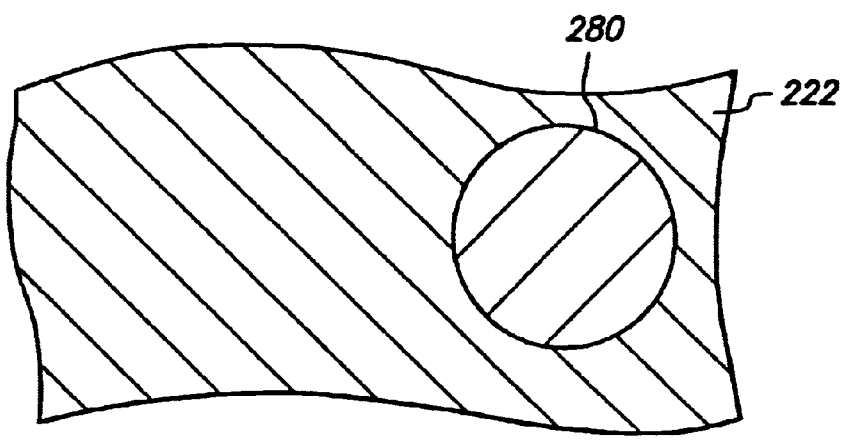
Figure 7I:
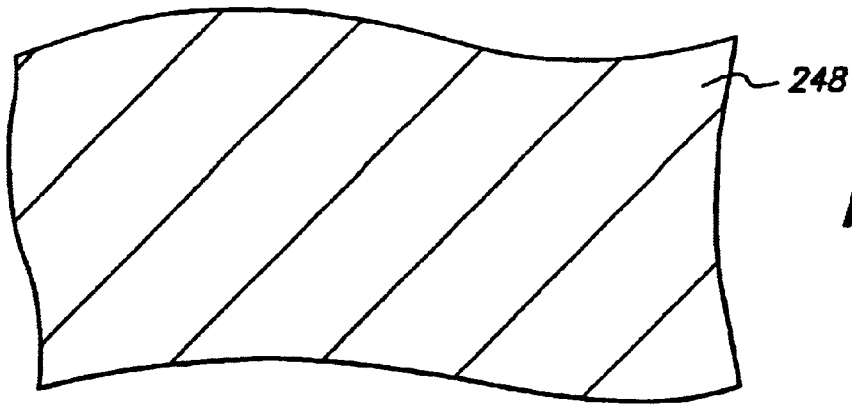

FIGS. 5I, 6I and 7I are cross-sectional, top and bottom views, respectively, of photoresist layer 280 formed on top surface 222 of base 220. Photoresist layer 280 is deposited as a continuous layer and then patterned by selectively applying light through a reticle (not shown), applying a developer solution to remove the photoresist portions rendered soluble by the light, and then hard baking, as is conventional. As a result, photoresist layer 280 contains an opening that selectively exposes portion 282 of top surface 222. Photoresist layer 280 has a thickness of 10 microns.

Figure 5J:
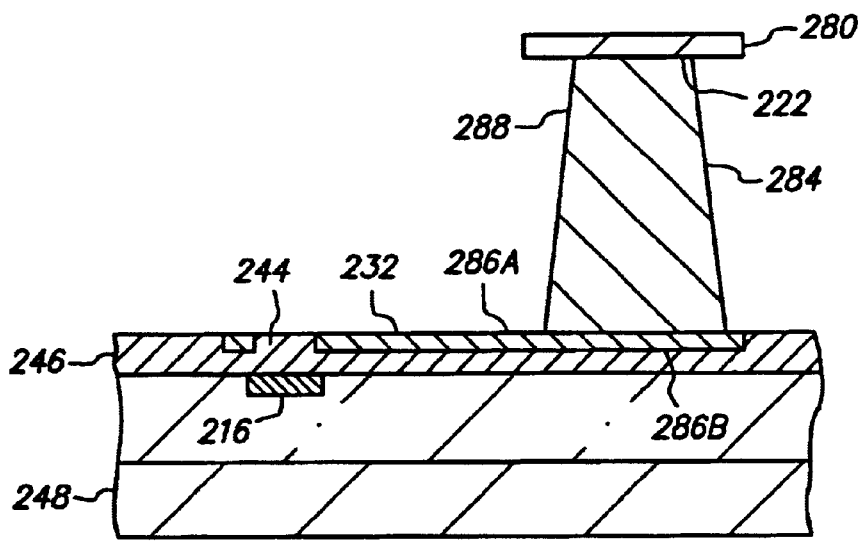
Figure 6J:
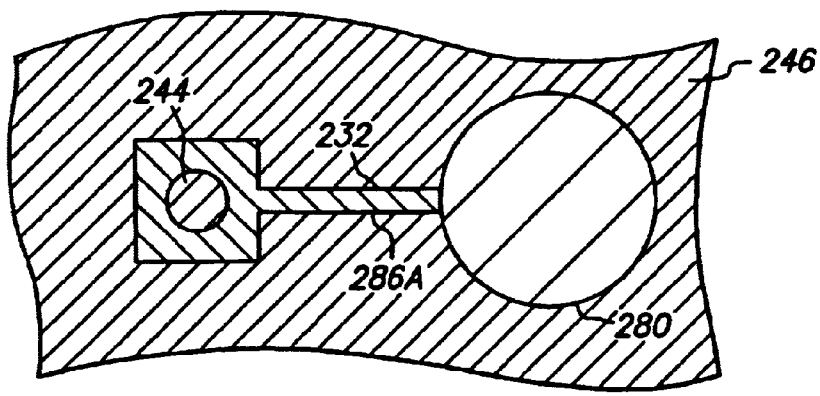
Figure 7J:
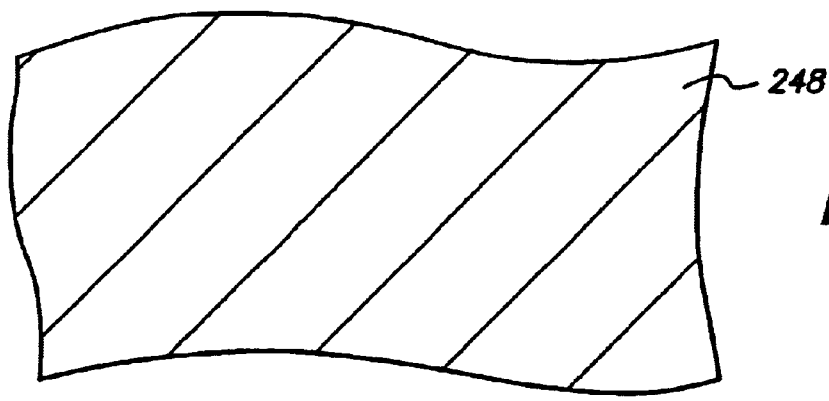

FIGS. 5J, 6J and 7J are cross-sectional, top and bottom views, respectively, of the partially completed assembly after a portion of base 220 above through-hole 244 is removed and a remaining portion of base 220 forms pillar 284. A "front-side" wet chemical etch is applied to exposed portion 282 of top surface 222 using photoresist layer 280 as an etch mask. For instance, the wet chemical etch can be sprayed on photoresist layer 280 and exposed portion 282, or the structure can be dipped in the wet chemical etch since the back-side is protected by encapsulant 248. Thus, pillar 284 is formed subtractively. The wet chemical etch is highly selective of copper with respect to gold, polyimide and epoxy. Therefore, no appreciable amount of conductive trace 232, adhesive 246 or encapsulant 248 is removed. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride.

The wet chemical etch etchs completely through exposed portion 282 of base 220. As a result, the wet chemical etch exposes first portion 286A of conductive trace 232 that includes enlarged rectangular portion 240 and a portion of routing portion 242 adjacent thereto, and pillar 284 covers and remains electrically connected to second portion 286B of conductive trace 232. Accordingly, the combination of conductive trace 232 and pillar 284 forms routing line 288. Likewise, the wet chemical etch exposes through-hole 244 and portions of adhesive 246 inside through-hole 244, outside pillar 284 and outside first portion 286A of conductive trace 232. Pillar 284 extends 150 microns above conductive trace 232.

Furthermore, since the wet chemical etch undercuts (i.e., laterally etches) base 220 beneath photoresist layer 280, pillar 284 tapers inwardly with increasing height. A suitable taper is between 45 and slightly less than 90 degrees, such as approximately 75 degrees. Pillar 284 has a diameter of 400 microns at its base that decreases with increasing height and is narrowest at top surface 222, and pillar 284 has a flat top surface at what remains of top surface 222. The optimal etch time for exposing portion 282 of top surface 222 to the wet chemical etch in order to form pillar 284 with the desired dimensions can be established through trial and error. At this stage, adhesive 246 continues to cover pad 216, fill through-hole 244, and provides critical mechanical support for routing line 288 which would otherwise be a dangling lead.

Figure 5K:
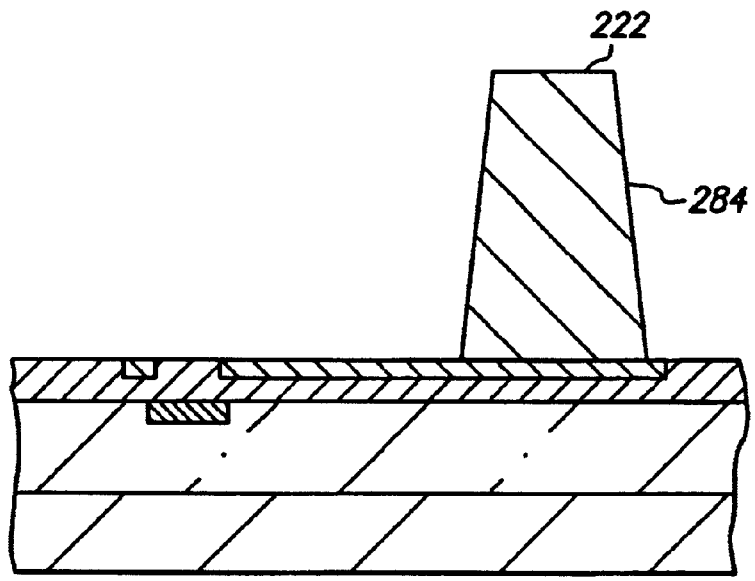
Figure 6K:
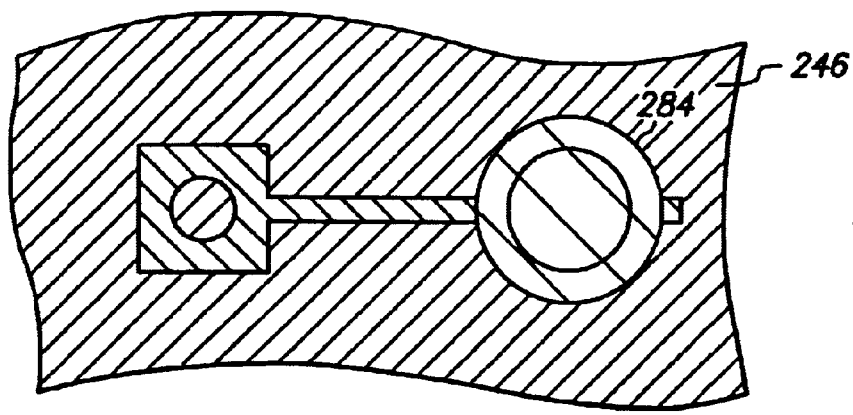
Figure 7K:
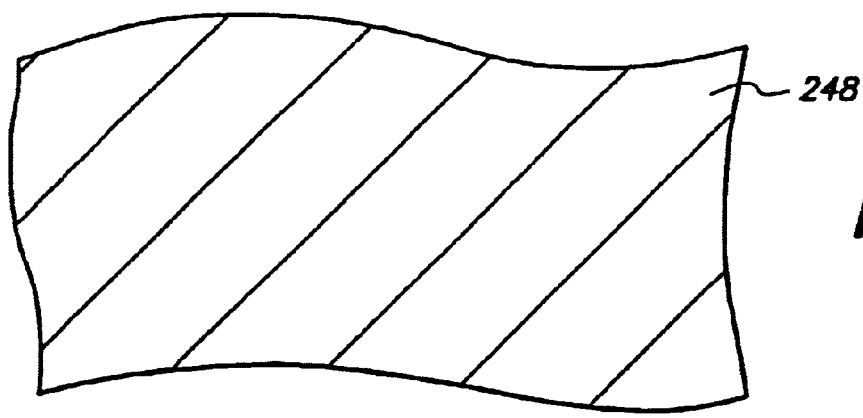

FIGS. 5K, 6K and 7K are cross-sectional, top and bottom views, respectively, of the partially completed assembly after photoresist layer 280 is stripped.

Figure 5L:
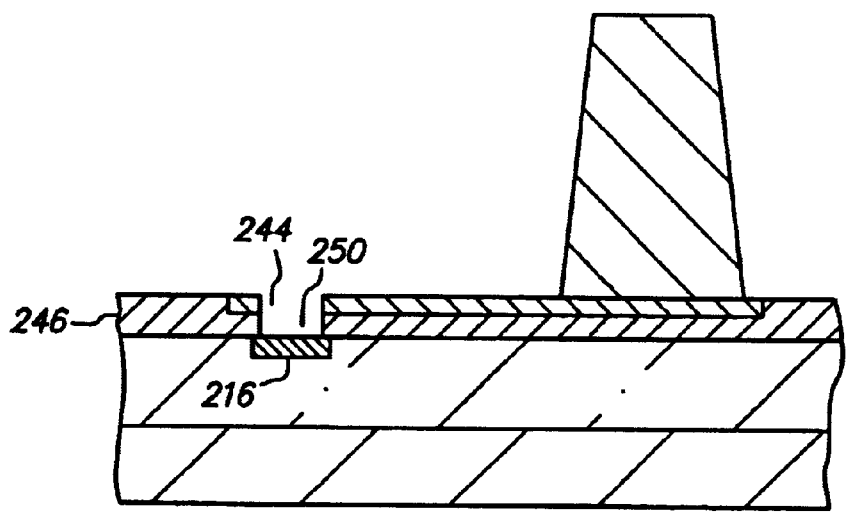
Figure 6L:
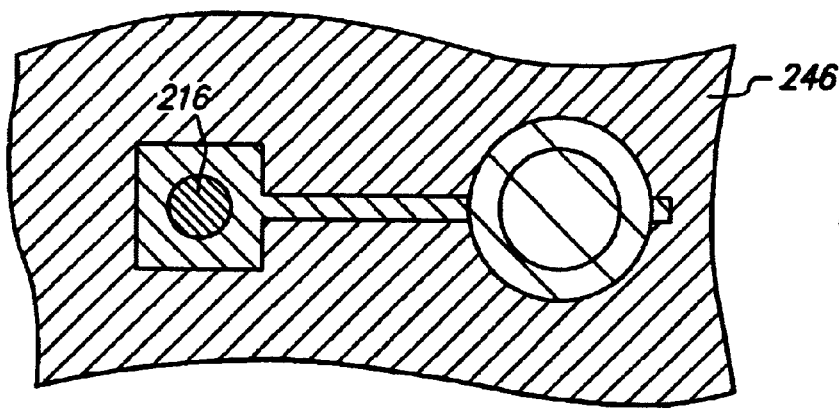
Figure 7L:
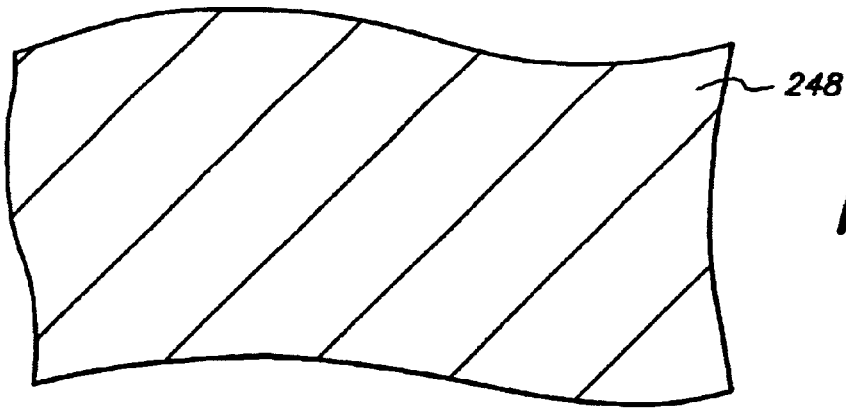

FIGS. 5L, 6L and 7L are cross-sectional, top and bottom views, respectively, of opening 250 formed in adhesive 246 by applying a selective laser etch. The combination of through-hole 244 and opening 250 expose pad 216.

Figure 5M:
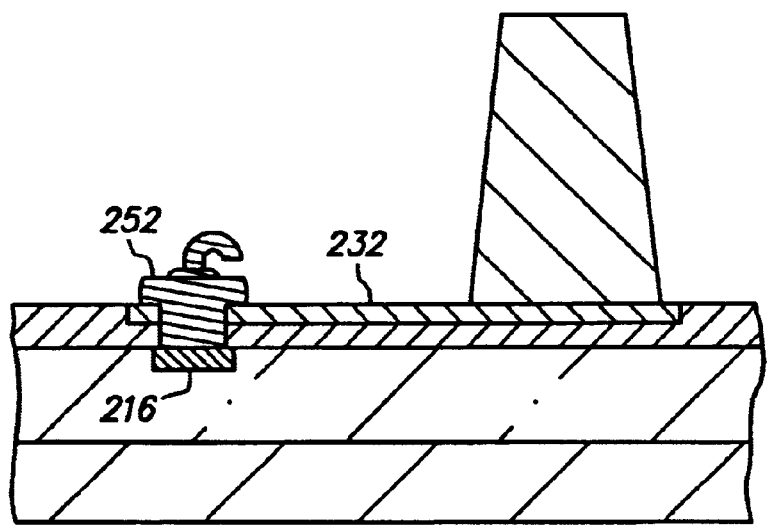
Figure 6M:
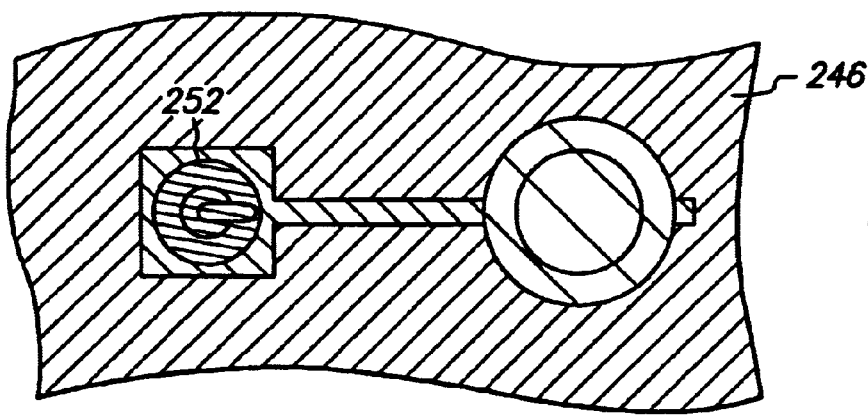
Figure 7M:
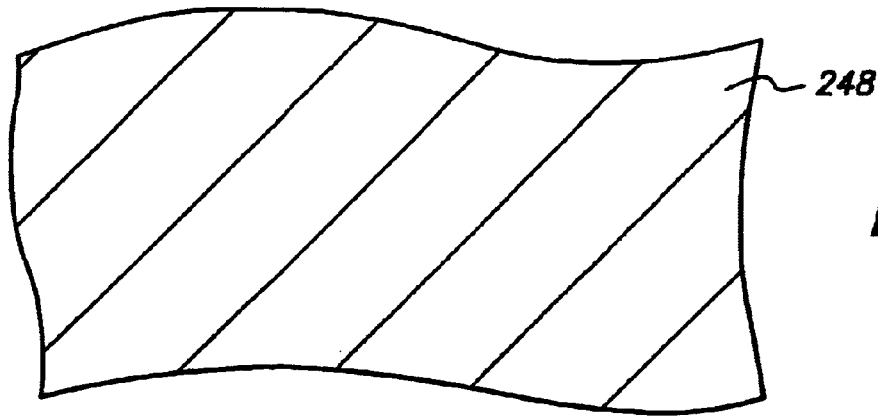

FIGS. 5M, 6M and 7M are cross-sectional, top and bottom views, respectively, of the partially completed assembly after connection joint 252 is formed by thermosonic ball bonding. Connection joint 252 is formed in through-hole 244 and opening 250, and contacts and electrically connects pad 216 and conductive trace 232. Since adhesive 246 is thinner than adhesive 146, opening 250 has a smaller volume than opening 150, and therefore a smaller wire ball (with a 50 micron diameter) can be used than wire ball 162 (with a 60 micron diameter).

Figure 5N:
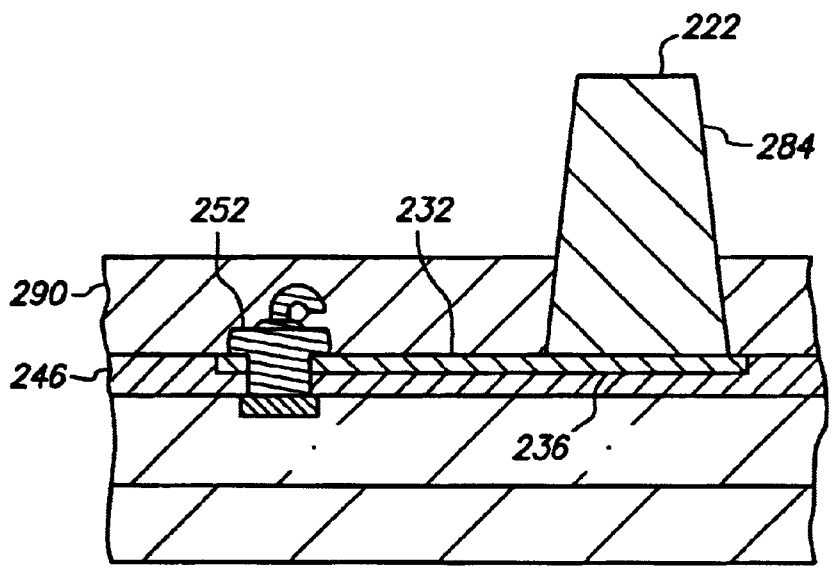
Figure 6N:
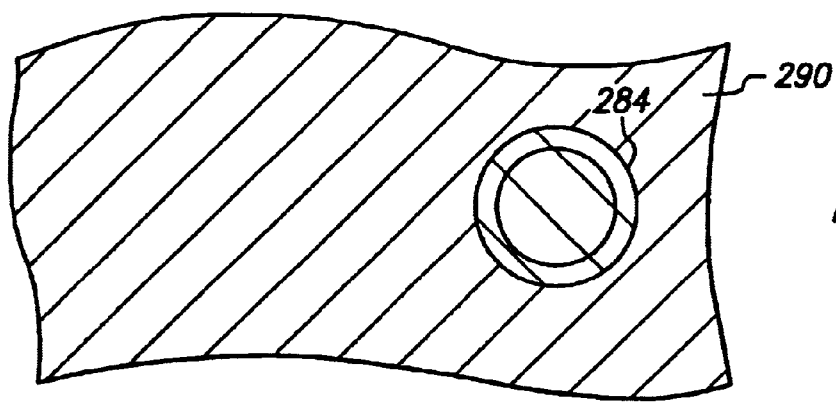
Figure 7N:
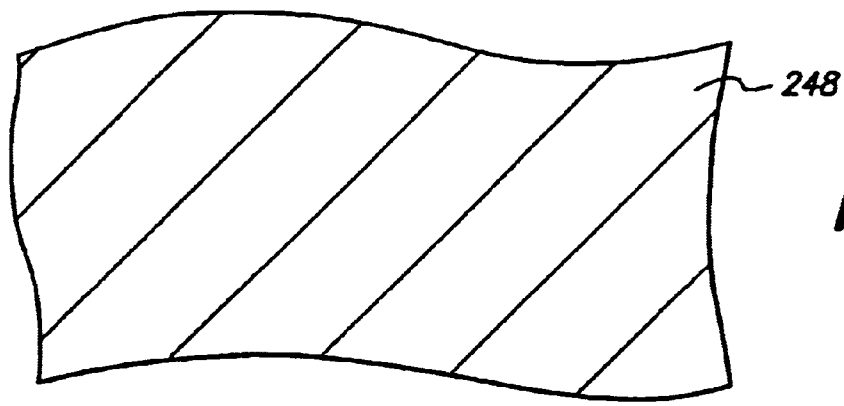
Figure 8A:
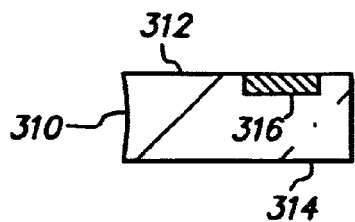
FIGS. 8A–8K are cross-sectional views showing a method of manufacturing a semiconductor chip assembly in accordance with a third embodiment of the present invention.
Figure 9A:
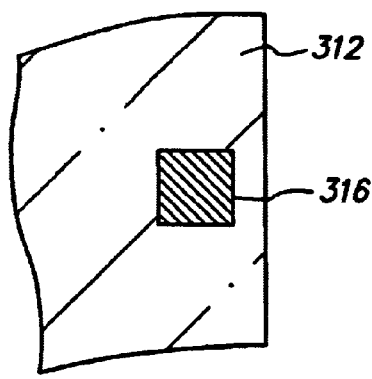
FIGS. 9A–9K are top plan views corresponding to FIGS. 8A–8K, respectively.
Figure 10A:
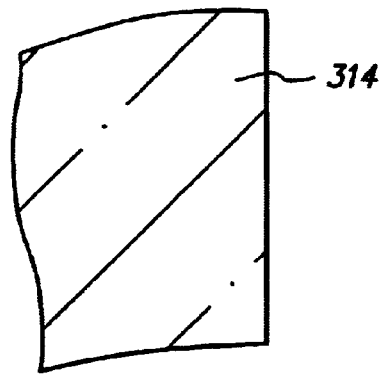
FIGS. 10A–10K are bottom plan views corresponding to FIGS. 8A–8K, respectively.
Figure 8B:
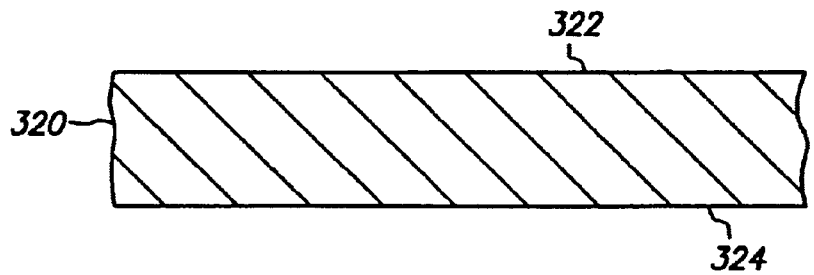
Figure 9B:
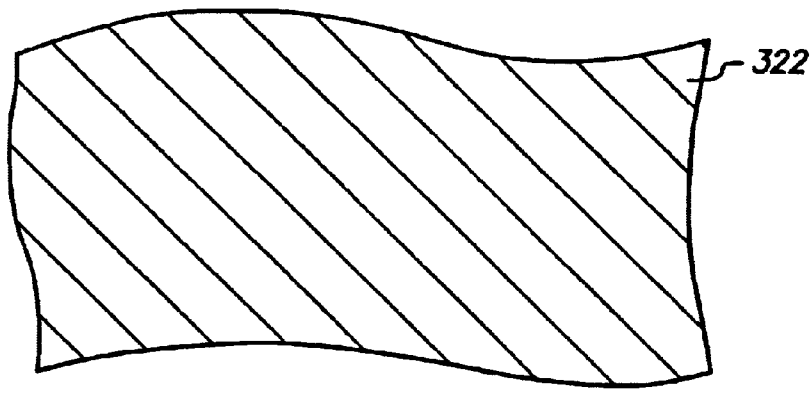
Figure 10B:
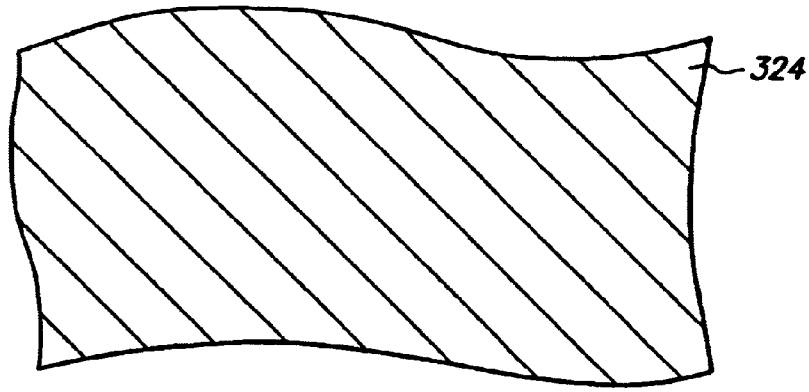
Figure 8C:
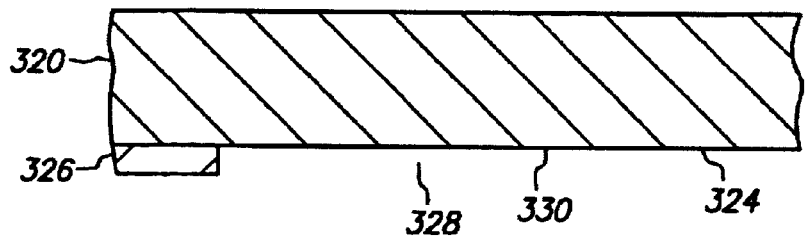
Figure 9C:
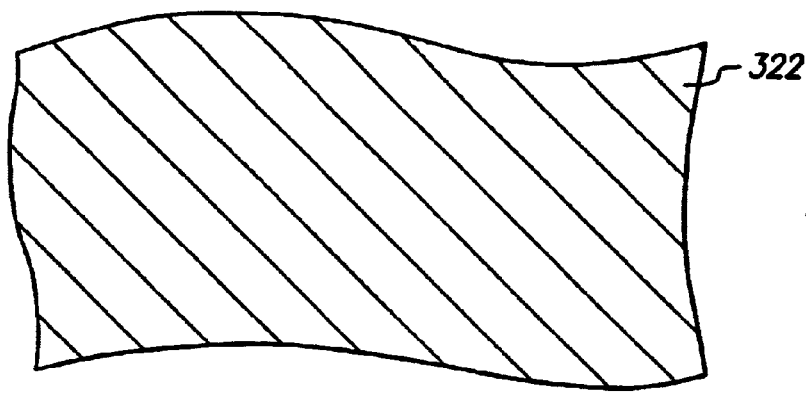
Figure 10C:
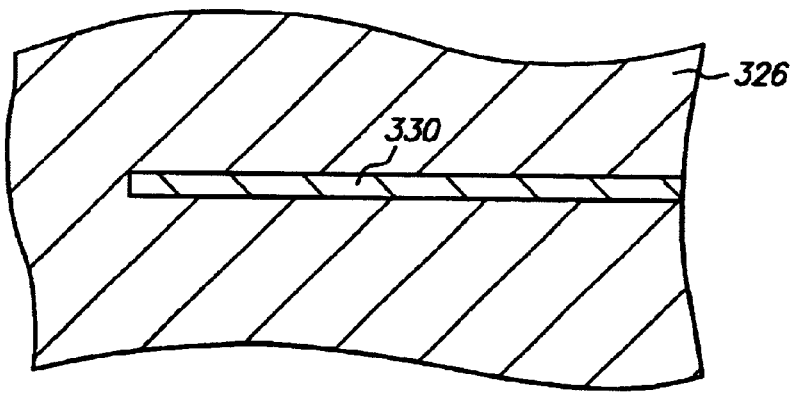
Figure 8D:
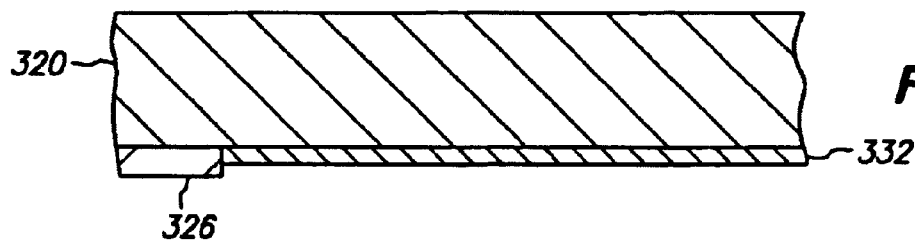
Figure 9D:
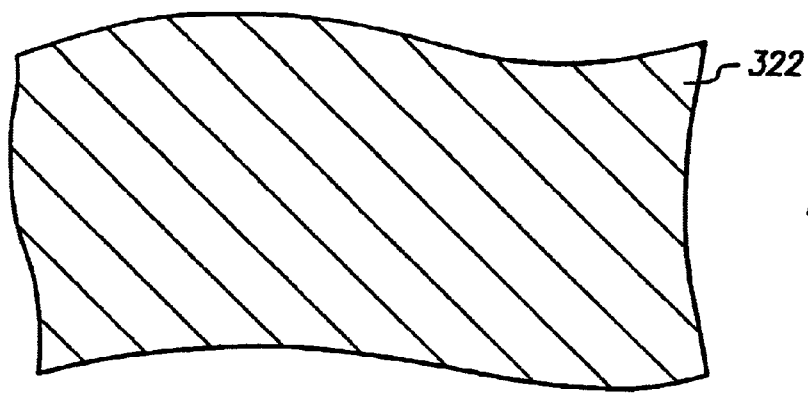
Figure 10D:
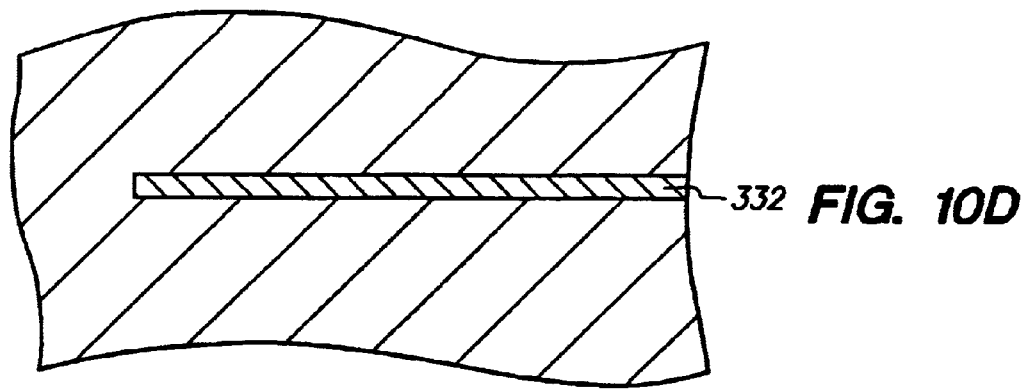
Figure 8E:
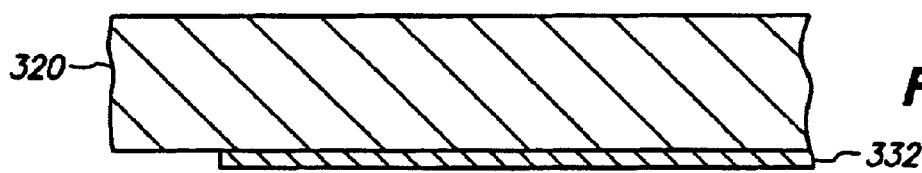
Figure 9E:
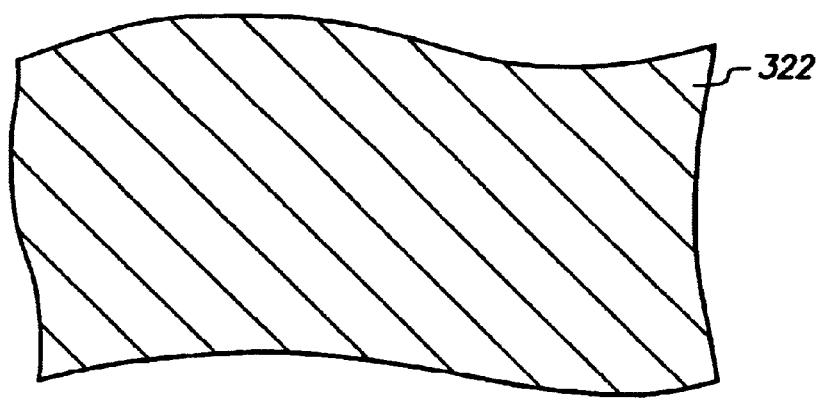
Figure 10E:
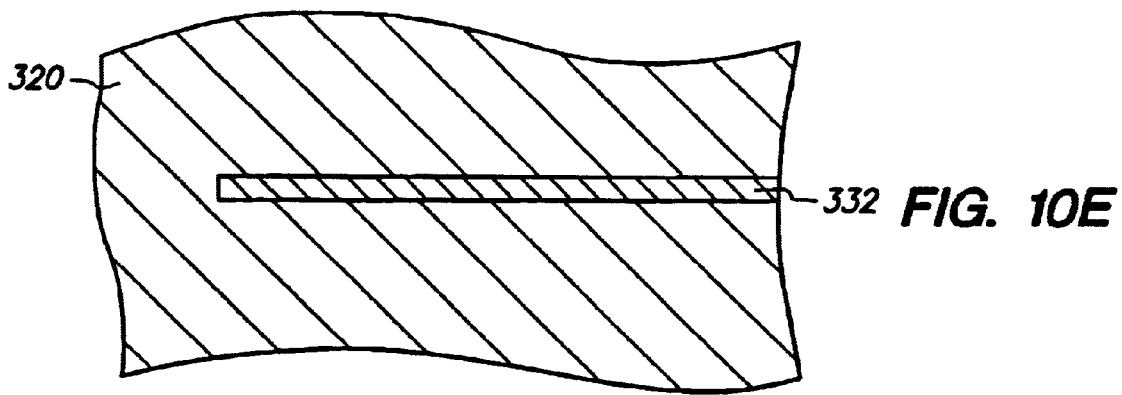
Figure 8F:
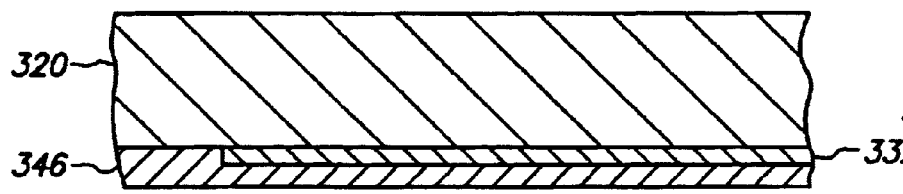
Figure 9F:
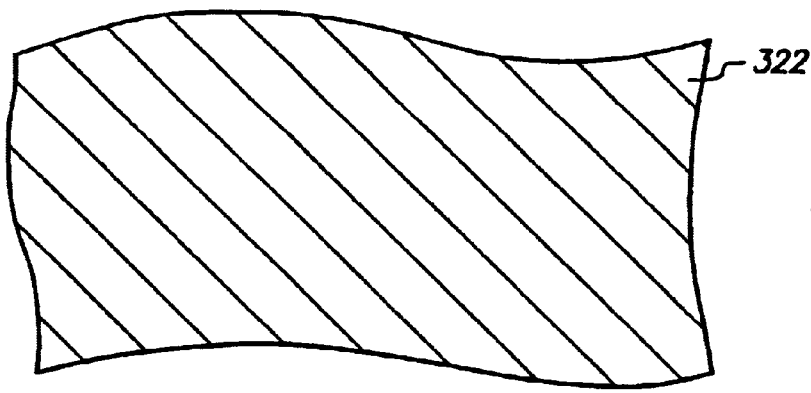
Figure 10F:
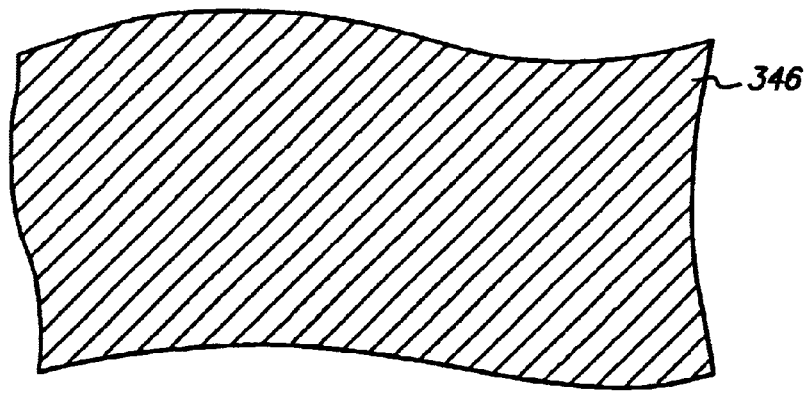
Figure 8G:
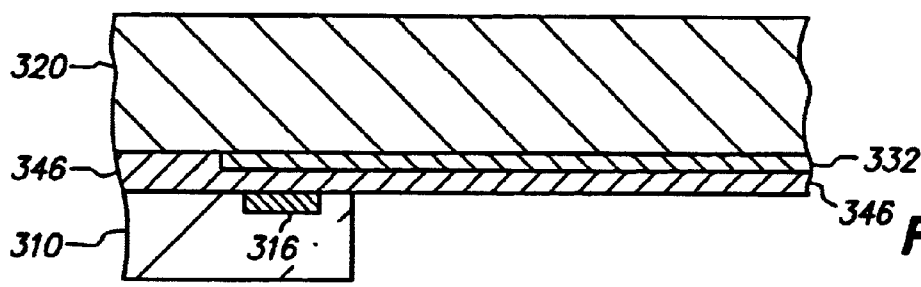
Figure 9G:
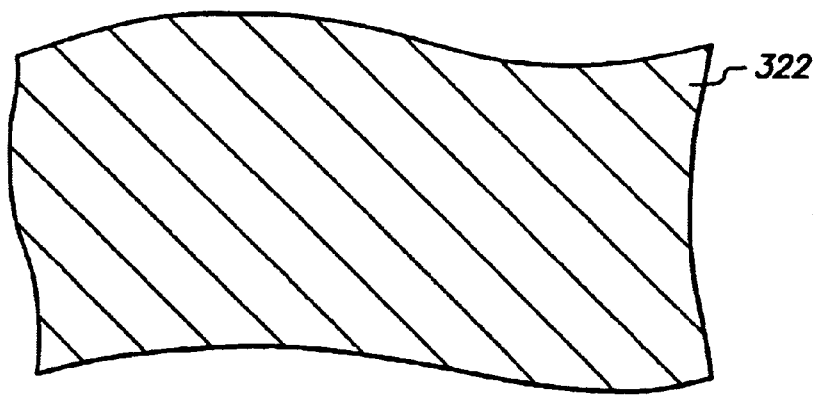
Figure 10G:
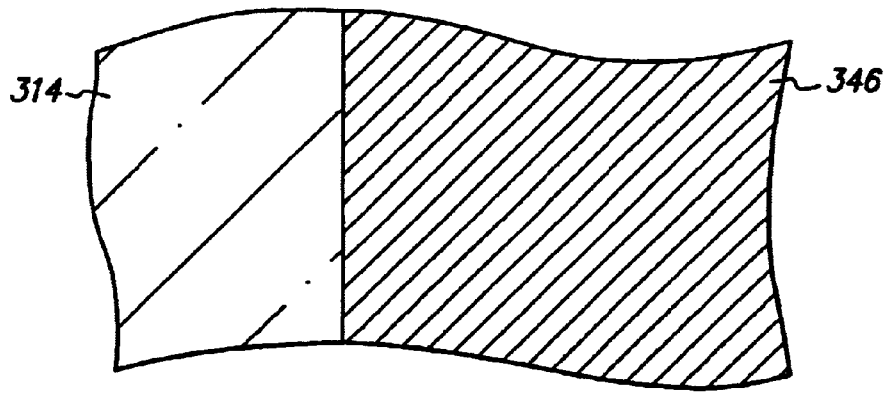
Figure 8H:
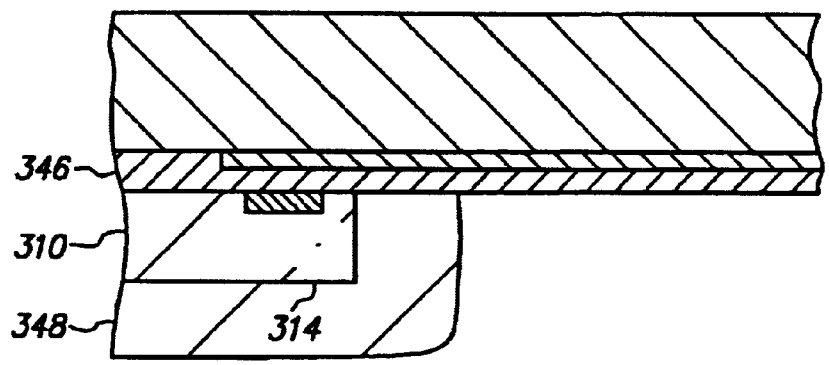
Figure 9H:
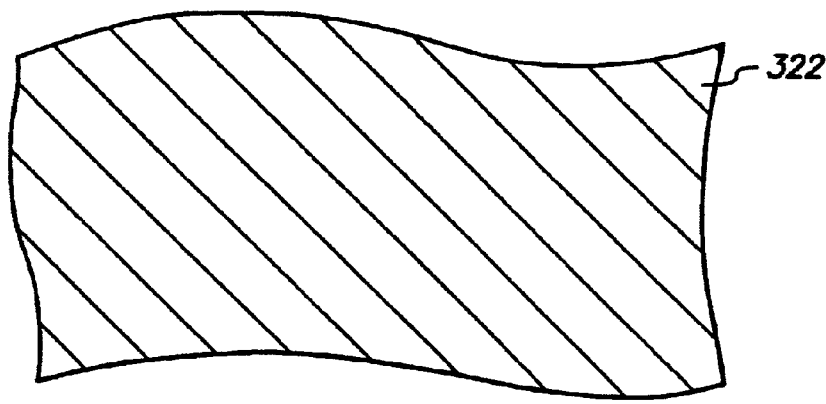
Figure 10H:
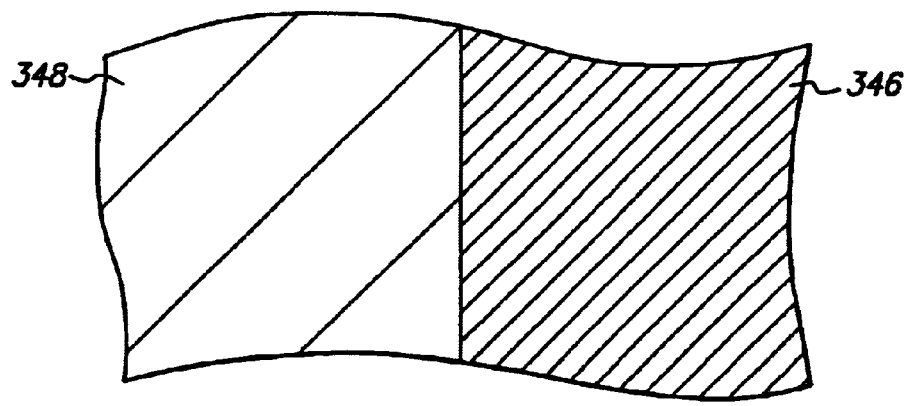
Figure 8I:
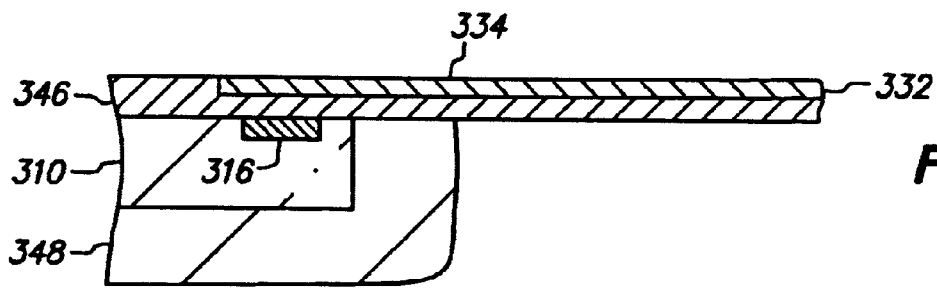
Figure 9I:
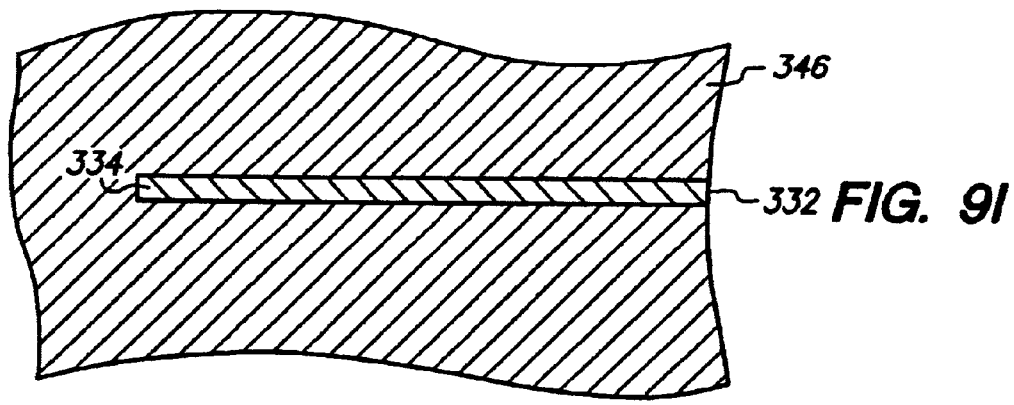
Figure 10I:
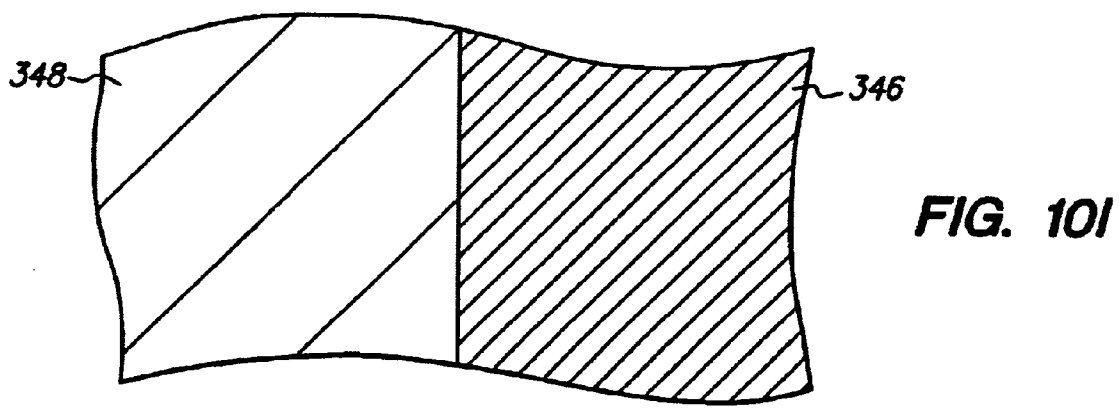
Figure 8J:
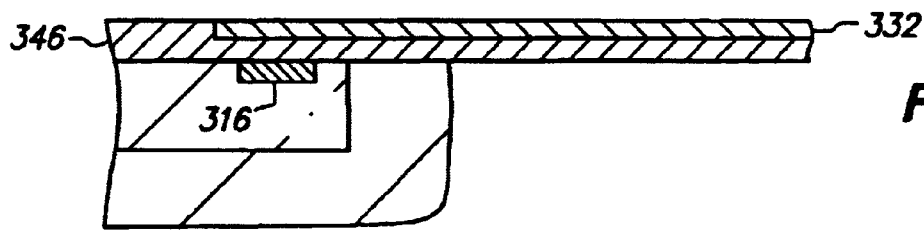
Figure 9J:
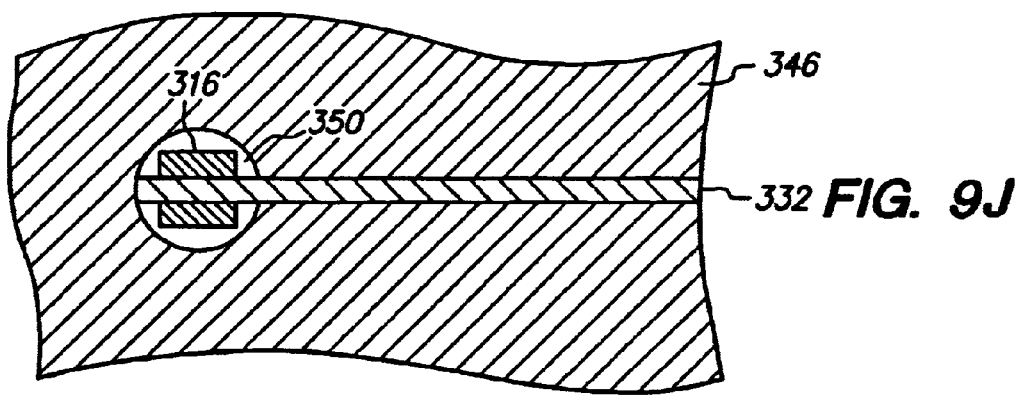
Figure 10J:
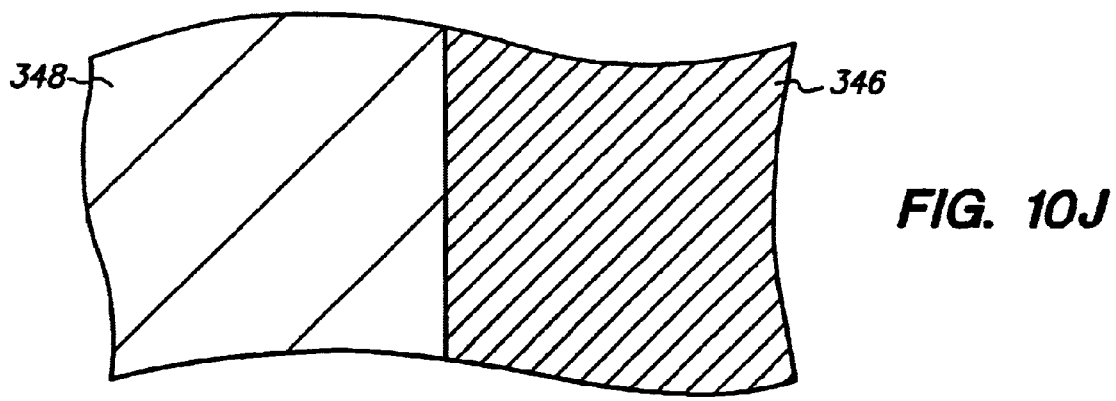
Figure 8K:
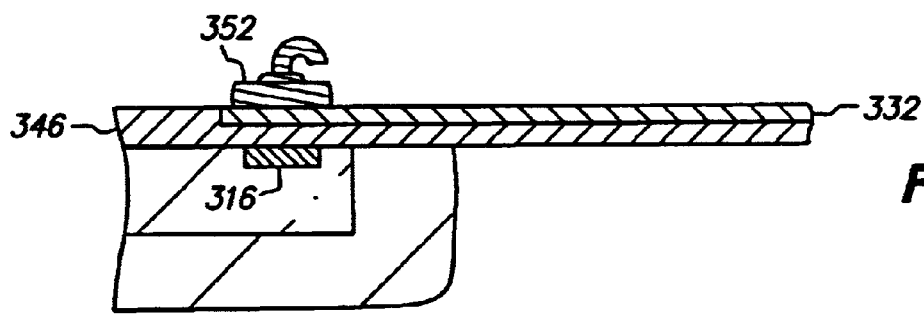
Figure 9K:
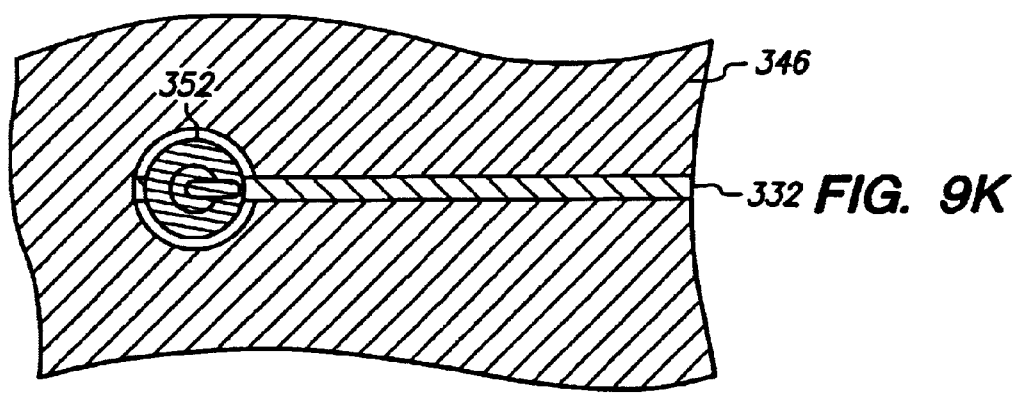
Figure 10K:
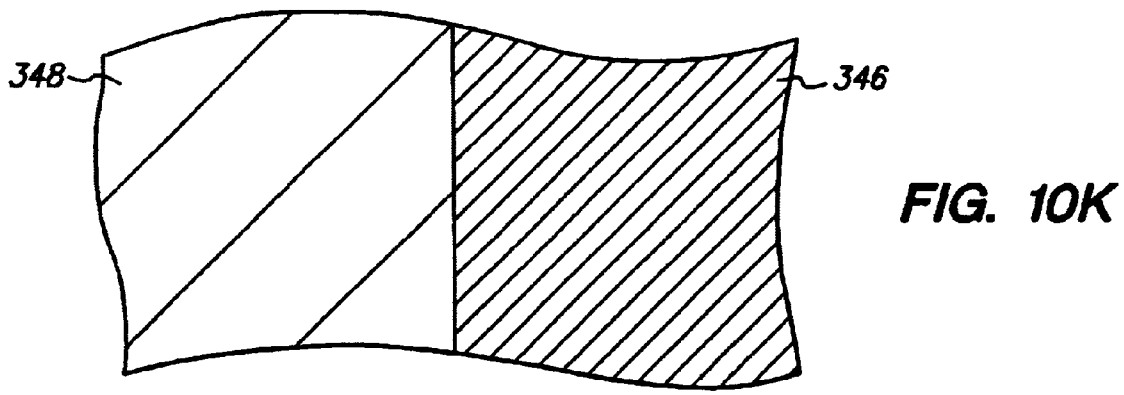
Figure 11A:
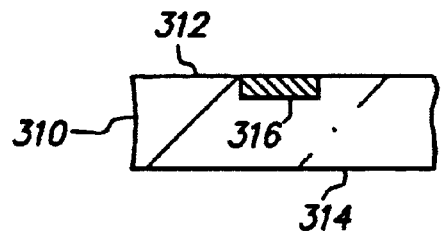
FIGS. 11A–11K are cross-sectional views corresponding to FIGS. 8A–8K, respectively.
Figure 11B:
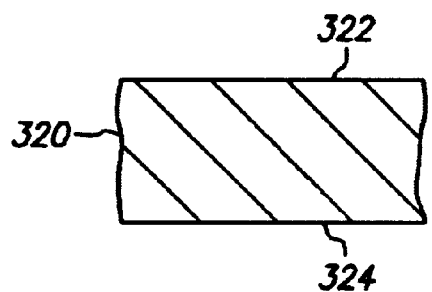
Figure 11C:
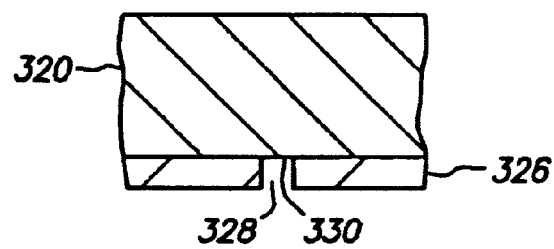
Figure 11D:
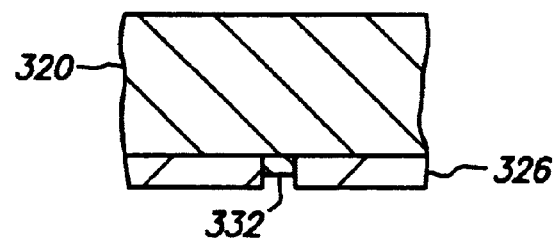
Figure 11E:
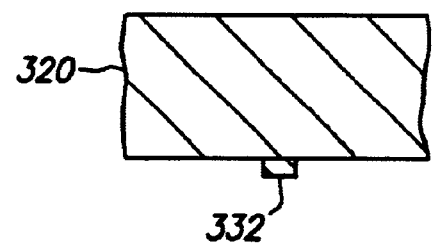
Figure 11F:
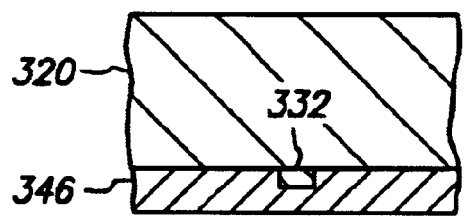
Figure 11G:
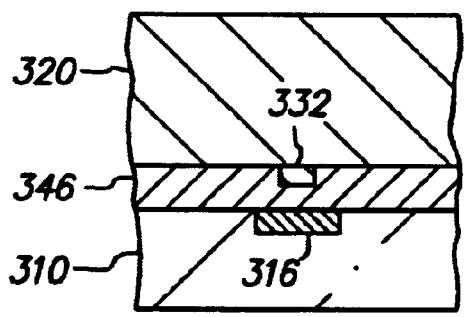
Figure 11H:
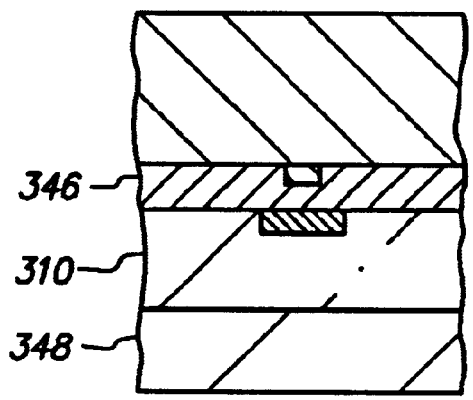
Figure 11I:
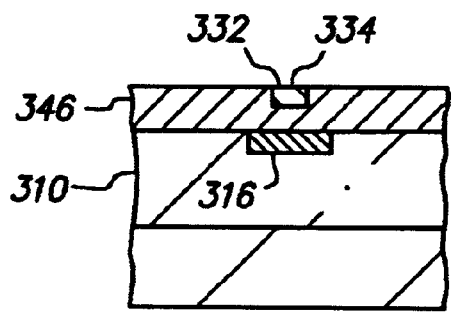
Figure 11J:
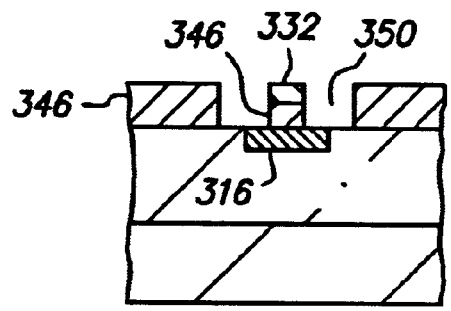
Figure 11K:
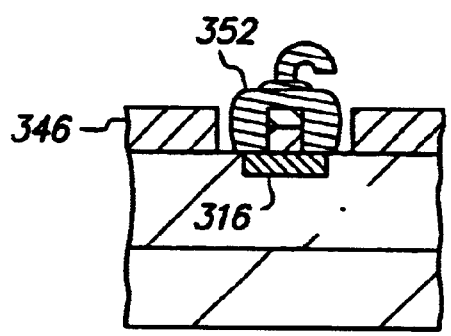

FIGS. 5N, 6N and 7N are cross-sectional, top and bottom views, respectively, of the fully completed assembly after insulative base 290 is formed over conductive trace 232 and connection joint 252. Insulative base 290 is relatively flat and has a thickness of 50 microns. Insulative base 290 contacts and adheres to conductive trace 232, adhesive 246, connection joint 252 and a lower portion of pillar 284. Although insulative base 290 covers conductive trace 232, adhesive 246, connection joint 252 and a lower portion of pillar 284, an upper portion of pillar 284 extends 100 microns above insulative base 290. Thus, insulative base 290 does not extend to top surface 222 or bottom surface 236. Preferably, insulative base 290 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively coated over conductive trace 232, adhesive 246, connection joint 252 and the lower portion of pillar 284 but not the upper portion of pillar 284 or top surface 222 using screen printing, and then the epoxy is cured or hardened at relatively low temperature in the range of 100–250° C. to form a solid adherent insulative layer that provides additional mechanical strength for conductive trace 232 and protection for connection joint 252. For instance, if a solder joint is subsequently formed at the top of pillar 284 during the next level assembly, insulative base 290 protects conductive trace 232 and connection joint 252 from solder reflow.

At this stage, the manufacture of a semiconductor chip assembly that includes chip 210, routing line 288 and insulative base 290 can be considered complete. Routing line 288 is mechanically and electrically coupled to chip 210 by adhesive 246 and connection joint 252, respectively. Conductive trace 232 extends towards the center of chip 210 and provides horizontal fan-in routing between pad 216 and pillar 284, and pillar 284 provides vertical routing between conductive trace 232 and top surface 222. Stated differently, the combination of conductive trace 232, connection joint 252 and pillar 284 provides horizontal and vertical routing between pad 216 and a terminal on a printed circuit board (not shown) above top surface 222 in a subsequent next level assembly.

The semiconductor chip assembly includes other conductive traces embedded in adhesive 246, and only a single conductive trace 232 is shown for convenience of illustration. The conductive traces are each connected to a respective pad on chip 210 by a respective connection joint in a respective through-hole, and are each directly connected at the opposite end to a respective pillar. Furthermore, the conductive traces and pillars provide horizontal fan-in routing and vertical routing for their respective pads. The conductive traces are electrically isolated from one another by adhesive 246 and insulative base 290. Advantageously, since base 220 provides a plating bus before it is etched, and the connection joints are formed by ball bonding, there is no plating bus or related circuitry that need be disconnected or severed from chip 210 or the conductive traces after base 220 is etched and the connection joints are formed. If desired, solder balls can be screen printed on the tops of the pillars to provide connections to the next level assembly. Finally, chip 210 is singulated from other chips on the wafer, thereby singulating the assembly from other assemblies, so that the assembly forms a chip size package.

FIGS. 8A–8K, 9A–9K, 10A–10K and 11A–11K are cross-sectional, top, bottom and cross-sectional views, respectively, of a method of manufacturing a semiconductor chip assembly in accordance with a third embodiment of the present invention. FIGS. 11A–11K are oriented orthogonally with respect to FIGS. 8A–8K and depict FIGS. 8A–8K as viewed from left-to-right. In the third embodiment, the routing line does not contain a through-hole or an enlarged rectangular portion that surrounds a through-hole. Instead, the conductive trace has a uniform width. The chip and the conductive trace are mechanically attached using the adhesive and positioned relative to one another so that the conductive trace is disposed above and overlaps the pad, an etch is applied that removes the base, another etch is applied that forms an opening in the adhesive that exposes the pad, and then the connection joint is formed in the opening and on the conductive trace and the pad. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, base 320 corresponds to base 120, etc.

FIGS. 8A, 9A, 10A and 11A are cross-sectional, top, bottom and cross-sectional views, respectively, of semiconductor chip 310 that includes upper surface 312, lower surface 314 and pad 316.

FIGS. 8B, 9B, 10B and 11B are cross-sectional, top, bottom and cross-sectional views, respectively, of base 320 that includes top surface 322 and bottom surface 324.

FIGS. 8C, 9C, 10C and 11C are cross-sectional, top, bottom and cross-sectional views, respectively, of photoresist layer 326 formed on bottom surface 324 of base 320. Photoresist layer 326 contains opening 328 that selectively exposes portion 330 of bottom surface 324.

FIGS. 8D, 9D, 10D and 11D are cross-sectional, top, bottom and cross-sectional views, respectively, of conductive trace 332 formed on base 320 by an electroplating operation.

FIGS. 8E, 9E, 10E and 11E are cross-sectional, top, bottom and cross-sectional views, respectively, of base 320 and conductive trace 332 after photoresist layer 326 is stripped.

FIGS. 8F, 9F, 10F and 11F are cross-sectional, top, bottom and cross-sectional views, respectively, of adhesive 346 attached to base 320 and conductive trace 332. Adhesive 346 is applied as a liquid resin and then cured to form a thermoplastic polyimide film.

FIGS. 8G, 9G, 10G and 11G are cross-sectional, top, bottom and cross-sectional views, respectively, of chip 310 mechanically attached to base 320 and conductive trace 332 by adhesive 346. Chip 310 and base 320 are positioned relative to one another so that conductive trace 332 is disposed above and overlaps and is electrically isolated from pad 316. Thereafter, adhesive 346 heated to its glass transition temperature and becomes molten then is cooled and solidifies to form a solid adhesive layer that mechanically fastens chip 310 to base 320 and conductive trace 332. At this stage, conductive trace 332 is covered from above by base 320 and covered from below by adhesive 346, pad 316 is covered from above by adhesive 346, and pad 316 is separated from conductive trace 332 by the thickness of adhesive 346.

FIGS. 8H, 9H, 10H and 11H are cross-sectional, top, bottom and cross-sectional views, respectively, of encapsulant 348 formed on lower surface 314 of chip 310.

FIGS. 8I, 9I, 10I and 11I are cross-sectional, top, bottom and cross-sectional views, respectively, of chip 310, conductive trace 332, adhesive 346 and encapsulant 348 after base 320 is removed by applying a front-side wet chemical etch to top surface 322 of base 320 that is highly selective of copper with respect to gold, polyimide and epoxy. At this stage, adhesive 346 continues to cover pad 316 and the entire top surface 334 of conductive trace 332 is exposed.

FIGS. 8J, 9J, 10J and 11J are cross-sectional, top, bottom and cross-sectional views, respectively, of opening 350 formed in adhesive 346 by applying a selective laser etch. The laser etch removes a portion of adhesive 346 above pad 316 and outside conductive trace 332. That is, conductive trace 332 shields the underlying adhesive 346 from the laser etch. Opening 350 is formed in adhesive 346 without damaging pad 316 or conductive trace 332 and exposes pad 316.

FIGS. 8K, 9K, 10K and 11K are cross-sectional, top, bottom and cross-sectional views, respectively, of the fully completed assembly after connection joint 352 is formed by thermosonic ball bonding. Connection joint 352 is formed in opening 350 in adhesive 346 and contacts and electrically connects pad 316 and conductive trace 332. Connection joint 352 contacts and covers portions of pad 316 beneath opening 350 in adhesive 346 and outside conductive trace 332 and portions of conductive trace 332 above pad 316. Thus, connection joint 352 provides a robust, permanent electrical connection between pad 316 and conductive trace 332. Connection joint 352 is the only electrical conductor external to chip 310 that contacts pad 316, adhesive 346 and connection joint 352 are the only materials external to chip 310 that contact pad 316, and adhesive 346 and connection joint 352 are the only materials that contact both pad 316 and conductive trace 332.

At this stage, the manufacture of a semiconductor chip assembly that includes chip 310 and conductive trace 332 can be considered complete. Conductive trace 332 is mechanically and electrically coupled to chip 310 by adhesive 346 and connection joint 352, respectively.

The semiconductor chip assemblies described above are merely exemplary. Numerous other embodiments are contemplated. For instance, various aspects of the first, second and third embodiments can be combined with one another.

Figure 12:
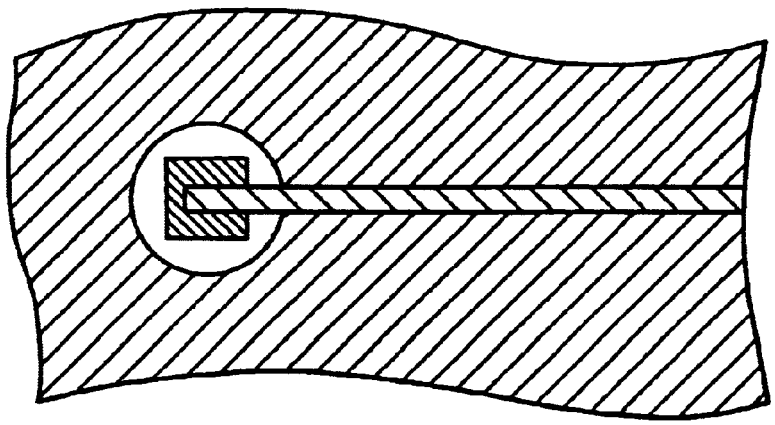
FIGS. 12–15 are top plan views of routing line variations in the third embodiment of the present invention.
Figure 13:
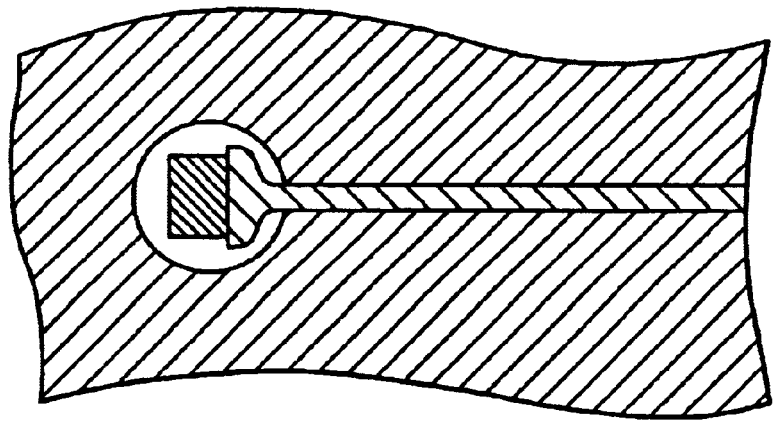
Figure 14:
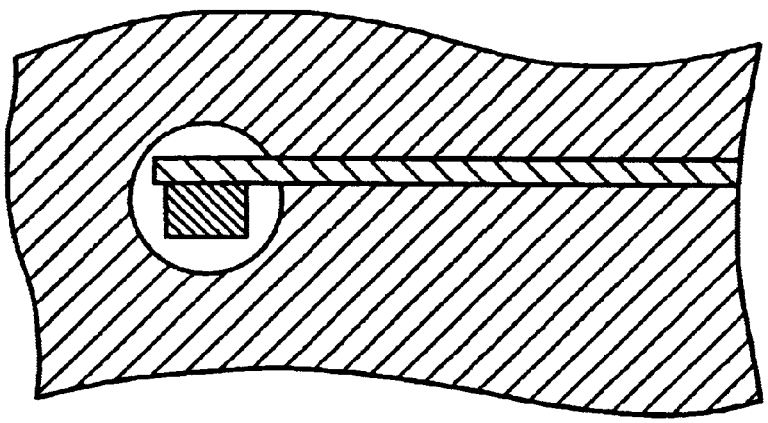
Figure 15:
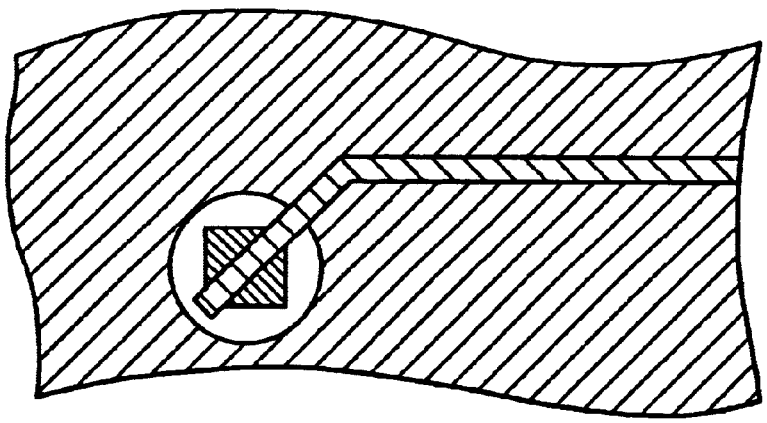

The conductive trace can have various shapes and sizes. The conductive trace can overlap various portions of the pad, such as four peripheral edges but not the center of the pad (FIGS. 2J and 6L), two opposing peripheral edges and the center of the pad (FIG. 9J), one peripheral edge and the center of the pad (FIG. 12), three peripheral edges but not the center of the pad (FIGS. 13 and 14), or two corners and the center of the pad (FIG. 15).

The conductive trace can be various conductive metals including copper, gold, nickel, aluminum, palladium, tin, combinations thereof, and alloys thereof. The preferred composition of the conductive trace will depend on the nature of the metal base and the connection joint as well as design and reliability factors. Furthermore, those skilled in the art will understand that in the context of a semiconductor chip assembly, a copper material is typically a copper alloy that is mostly copper but not pure elemental copper, such as copper-zirconium (99.9% copper), copper-silver-phosphorus-magnesium (99.7% copper), or copper-tin-iron-phosphorus (99.7% copper).

The conductive trace can be formed on the metal base by numerous deposition techniques including electroplating and electroless plating.

The conductive trace can be deposited as a single layer or multiple layers. For instance, the conductive trace can be a 5 micron layer of gold, or alternatively, a 4.5 micron layer of nickel electroplated on a 0.5 micron layer of gold electroplated on a copper base to reduce costs, or alternatively, a 4 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. If desired, the conductive trace can be spot plated near the pad to make it compatible with receiving the connection joint. For instance, a copper conductive trace can be spot plated with nickel and then silver to make it compatible with a gold ball bond connection joint and avoid the formation of brittle silver-copper intermetallic compounds.

As another example, the conductive trace can consist of a non-copper layer electroplated on a copper base and a copper layer electroplated on the non-copper layer. Suitable non-copper layers include nickel, gold, palladium and silver. After the conductive trace is attached to the chip by the adhesive, a wet chemical etch can be applied that is highly selective of copper with respect to the non-copper layer to remove the copper base (or the exposed portion of the copper base) without removing the copper or non-copper layers. The non-copper layer provides an etch stop that prevents the wet chemical etch from removing the copper layer. Furthermore, it is understood that in the context of the present invention, the conductive trace and the base are different metals (or metallic materials) even if a multi-layer conductive trace includes a single layer that is similar to the metal base (such as the example described above).

The conductive trace may function as a signal, power or ground layer depending on the purpose of the associated chip pad. The conductive trace need not necessarily extend above the top surface of the insulative base, and a ball, a pad, or a pillar (columnar post) can be deposited on the conductive trace or be a top portion of the conductive trace. A pillar is particularly well-suited for reducing thermal mismatch related stress in the next level assembly. A pillar can be formed in numerous manners, including additive and subtractive techniques. Likewise, the conductive trace can be fan-in or fan-out or both, regardless of whether it is connected to a pillar.

The metal base can be various metals including copper, copper alloys, iron-nickel alloys, aluminum, and so on.

The pad can have numerous shapes including a flat rectangular shape and a bumped shape. For instance, a bump-shaped pad may extend into the through-hole and may even extend above the conductive trace. The pad can either be partially or completely exposed prior to forming the connection joint. The pad can have a length and width that are larger than, equal to, or smaller than the diameter of the through-hole or the opening in the adhesive. Preferably, the pad and through-hole or opening have the same or similar size, and essentially all of the pad is directly beneath the through-hole or opening.

The through-hole can have a circular, ovular, square, rectangular or other shape (as viewed from the top surface). The through-hole and opening may be aligned with and expose a single pad or a plurality of pads. Furthermore, the through-hole sidewalls may have a wide variety of shapes and slopes including vertical sidewalls, tapered sidewalls, continuous sidewalls and stepped sidewalls.

Preferably, the insulative base has a thickness of 25 to 50 microns, the routing portion of the conductive trace has a width of 10 to 100 microns and a thickness of 5 to 40 microns, the pillar has a diameter of 300 to 500 microns that decreases with increasing height, a height of 150 to 300 microns and extends 50 to 250 microns aabove the insulative base, and the through-hole has a diameter of 50 to 100 microns. Of course, other dimensions are suitable.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important. The insulative base can be deposited only on the conductive trace, or alternatively, deposited over the pillar and the conductive trace and then etched back so that a top portion of the pillar is exposed.

Numerous adhesives can be applied between the chip and the conductive trace. For instance, the adhesive can be applied as a paste, a laminated layer, or a liquid applied by screen-printing, spin-on, or spray-on. If a paste or liquid adhesive is applied, the adhesive may fill the through-hole and be subsequently removed. If a laminated adhesive is applied then no appreciable amount of adhesive may reside inside the through-hole. Thermosetting adhesive liquids and pastes such as epoxies are generally suitable. Likewise, thermoplastic adhesives are also generally suitable. Furthermore, the opening in the adhesive may be formed either before or after mechanically attaching the conductive trace to the chip. For instance, the adhesive can be applied as a liquid or paste (A stage) to the bottom surface of the conductive trace, the adhesive can be partially cured (B stage), a back-side etch can form the opening in the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the chip to the conductive trace, and then a front-side etch can form the opening in the adhesive.

Numerous etches can be applied to form the pillar as well as the opening in the adhesive. For instance, the opening in the adhesive can be formed by laser direct write (without a mask) or a blanket plasma etch that removes portions of the adhesive not covered by the conductive trace. In addition, these etches can be performed in various sequences. For instance, the front-side etch that forms the pillar can be applied before or after the through-hole is exposed and before or after the connection joint is formed.

A ball bond connection joint may be formed by thermo-compression or thermosonic wire bonding and composed of any conventional bonding wire material including gold, silver, copper, palladium, and alloys thereof. For instance, gold alloyed with a small amount of beryllium exhibits grain growth at low temperature which enhances stability and increases strength by precipitation hardening. Gold alloyed with 5 to 10 ppm beryllium by weight or 30 to 100 ppm copper by weight is commonly used for thermocompression and thermosonic wire bonding. Similarly, gold alloyed with 1 percent palladium raises the recrystallization temperature so that the fully annealed area above the ball bond resulting from the thermal source (such as electronic flame-off, called the heat-affected zone (HAZ), is extremely short, resulting in a short tail or stump on the ball bond after the wire is broken from the ball bond with a simple upward vertical movement. Furthermore, aluminum alloyed with small amounts of silicon, magnesium or both has been proposed for thermosonic wire bonding.

A ball bond connection joint may be formed by initially contacting the wire ball to the pad, the conductive trace, or both, depending on the relative dimensions of the wire ball and the through-hole. Likewise, the diameter of the wire ball may be larger, smaller, or equal to the diameter of the through-hole. If, for instance, the diameter of the wire ball is smaller than the diameter of the through-hole and the wire ball initially contacts the pad without contacting the conductive trace, then it may be desirable to move the capillary in a horizontal loop to assure that the ball bond contacts the conductive trace and fills the through-hole. Furthermore, the capillary can be withdrawn (clamp open) and then reapplied (clamp closed) to supply additional gold to the ball bond.

A ball bond connection joint may completely or partially fill the through-hole. It is generally preferred that the ball bond connection joint completely fill the through-hole and contact a top surface of the conductive trace in order to maximize the contact area with the conductive trace and the pad. However, if the wire ball seals the through-hole before adequately contacting the pad, then trapped air between the wire ball and the pad may create a compressive force that prevents the wire ball from adequately contacting the pad. Trapped air can be reduced or eliminated by proper choice of shapes and dimensions. For example, if the through-hole has sidewalls that taper at an angle such as 45 degrees so that the diameter increases with increasing height, the opening in the adhesive has the same diameter as the bottom of the through-hole, and the wire ball contacts the pad before contacting the conductive trace, then little or no trapped air should occur. The through-hole sidewalls can be tapered in various manners such as tapering the sidewalls of the photoresist layer that defines the through-hole or applying a suitable etch to the conductive trace. See, for instance, U.S. application Ser. No. 09/665,931 filed Sep. 20, 2000 by Charles W. C. Lin entitled "Method of Making a Support Circuit with a Tapered Through-Hole for a Semiconductor Chip Assembly" which is incorporated by reference.

After a ball bond connection joint is formed, the tail can be reduced or eliminated. For instance, the tail can be flattened or "coined" using a secondary operation after cutting the wire. Alternatively, before moving or after slightly moving the capillary vertically upwards and away from the ball bond, the clamp can be closed and then the capillary can be moved horizontally to shear the wire from the ball bond at or near their juncture. This shearing operation requires that the capillary have adequate clearance for the horizontal motion, which will depend on the dimensions and shapes of the capillary and the ball bond as well as the amount of the upward vertical movement. As another example, the wire bonding equipment may include a blade that creates a notch in the wire to provide a weak point that subsequently breaks.

The connection joint can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The choice between a connection joint that partially or completely fills the through-hole and the shape and composition of the connection joint depends on design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference.

After the connection joint is formed, further encapsulation can be performed but is generally not necessary. In particular, it may not be necessary to fill a conductor or insulator into whatever space remains in the through-hole or deposit an insulator over the conductive trace and/or insulative base. However, it may be desirable to provide an encapsulant to enhance the mechanical strength of the assembly.

After the connection joint is formed, a soldering material or solder ball can be deposited over the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a printed circuit board. Similarly, the conductive trace is disposed "above" the chip when the bottom surface of the conductive trace faces the upper surface of the chip regardless of whether the assembly is inverted. Likewise, the metal base is shown above the conductive trace and the conductive trace is shown above the chip with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, ball grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The adhesive and/or insulative base protects the chip from handling damage and provides a known dielectric barrier for the conductive trace. The insulative base prevents solder reflow at the top surface from contacting or electrically shorting the underlying conductive trace. The tapered pillar yields enhanced reliability for the next level assembly that exceeds that of conventional BGA packages. The mode of the connection shifts from the initial mechanical coupling to metallurgical coupling to assure sufficient metallurgical bond strength. Furthermore, the conductive trace can be mechanically and metallurgically coupled to the chip without wire bonding, TAB, flip-chip bonding, plating, polishing, or solder joints, although the process is flexible enough to accommodate these techniques if desired. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of connecting a conductive trace to a semiconductor chip, comprising:

providing a semiconductor chip, a conductive trace and a base, wherein the chip includes a conductive pad, the conductive trace is proximate to the pad, the base contacts and covers the conductive trace on a side opposite the chip, and the conductive trace and the base are different metals; then etching the base, thereby exposing the conductive trace; and then forming a connection joint that contacts and electrically connects the conductive trace and the pad.

2. The method of claim 1, including mechanically attaching the chip to the conductive trace using an insulative adhesive before etching the base.

3. The method of claim 2, including etching the adhesive thereby exposing the pad after etching the base and before forming the connection joint.

4. The method of claim 3, wherein the adhesive contacts and is sandwiched between the conductive trace and the pad, and the conductive trace and the pad are electrically isolated from one another after etching the adhesive and before forming the connection joint.

5. The method of claim 1, including depositing the conductive trace on the base.

6. The method of claim 1, wherein etching the base includes applying a wet chemical etch that is selective of the base with respect to the conductive trace.

7. The method of claim 6, wherein etching the base includes selectively etching the base to remove a portion of the base that overlaps the pad and to form a pillar in the base that covers and is connected to a portion of the conductive trace and does not overlap the pad.

8. The method of claim 6, wherein etching the base includes removing all of the base.

9. The method of claim 1, wherein the conductive trace includes gold and the base is essentially copper.

10. The method of claim 1, wherein the chip includes a plurality of conductive pads, a plurality of conductive traces are proximate to the pads, the base covers the conductive traces before etching the base, and the conductive traces are exposed by etching the base.

11. A method of connecting a conductive trace to a semiconductor chip, comprising:

providing a semiconductor chip that includes a conductive pad;

attaching a conductive trace to a base, wherein the conductive trace and the base are different metals; then disposing an adhesive between the chip and the conductive trace, thereby mechanically attaching the chip to the conductive trace such that the conductive trace overlaps the pad; then etching the base, thereby exposing the conductive trace; then etching the adhesive, thereby exposing the pad while the conductive trace overlaps the pad; and then forming a connection joint that contacts and electrically connects the conductive trace and the pad.

12. The method of claim 11, wherein attaching the conductive trace to the base includes electroplating the conductive trace on the base.

13. The method of claim 11, wherein etching the adhesive includes applying a laser to the adhesive.

14. The method of claim 11, wherein the conductive trace overlaps only one peripheral edge of the pad.

15. The method of claim 11 wherein the conductive trace overlaps only two peripheral edges of the pad, and the two peripheral edges are opposite one another.

16. The method of claim 11, wherein the connection joint contacts a surface of the conductive trace that is disposed above and overlaps and faces away from the pad.

17. The method of claim 11, wherein the connection joint is the only electrical conductor external to the chip that contacts the pad.

18. The method of claim 11, wherein the connection joint and the adhesive are the only materials external to the chip that contact the pad.

19. The method of claim 11, wherein the connection joint and the adhesive are the only materials that contact both the conductive trace and the pad.

20. The method of claim 11, wherein the adhesive is a thermosetting epoxy.

21. The method of claim 11, wherein the adhesive is a thermoplastic polyimide.

22. The method of claim 11, wherein the connection joint is formed by electroplating.

23. The method of claim 11, wherein the connection joint is formed by electroless plating.

24. The method of claim 11, wherein the connection joint is a ball bond formed by thermocompression or thermosonic wire bonding.

25. The method of claim 24, wherein the ball bond consists of a deformed wire ball.

26. The method of claim 24, wherein the ball bond only contacts the conductive trace, the adhesive and the pad.

27. The method of claim 11, wherein the conductive trace includes gold, the connection joint is essentially gold, and the base is essentially copper.

28. The method of claim 11, wherein an assembly that includes the chip, the conductive trace, the adhesive and the connection joint is devoid of solder joints.

29. The method of claim 11, wherein an assembly that includes the chip, the conductive trace, the adhesive and the connection joint is devoid of wire bonds, TAB leads and solder joints.

30. The method of claim 11, wherein the chip includes a plurality of conductive pads, a plurality of conductive traces overlap the pads, the base covers the conductive traces before etching the base, and the conductive traces are exposed by etching the base.

31. A method of connecting a conductive trace to a semiconductor chip, comprising the following steps in the sequence set forth:

forming a conductive trace on a base, wherein the conductive trace and the base are different metallic materials;

disposing an insulative adhesive between a chip and the conductive trace, thereby mechanically attaching the chip to the conductive trace, wherein the chip includes upper and lower surfaces, the upper surface includes a pad, the conductive trace includes top and bottom surfaces, the conductive trace is disposed above and overlaps the pad, and the adhesive contacts the upper and bottom surfaces;

applying an etch to the base that is selective of the base with respect to the conductive trace and the adhesive, thereby exposing the conductive trace;

applying an etch to the adhesive, thereby exposing the pad; and forming a connection joint that contacts and electrically connects the conductive trace and the pad.

32. The method of claim 31, wherein forming the conductive trace on the base includes electroplating the conductive trace on the base.

33. The method of claim 32, including forming a photoresist layer on the base that selectively exposes a portion of the base that defines the conductive trace, and electroplating the conductive trace on the selectively exposed portion of the base.

34. The method of claim 31, wherein the conductive trace overlaps only one peripheral edge of the pad.

35. The method of claim 31 wherein the conductive trace overlaps only two peripheral edges of the pad, and the two peripheral edges are opposite one another.

36. The method of claim 31, wherein applying the etch to the base forms a pillar in the base that covers and is connected to a portion of the conductive trace and does not overlap the pad.

37. The method of claim 31, wherein applying the etch to the base removes all of the base.

38. The method of claim 31, wherein applying the etch to the base includes applying a wet chemical etch that is selective of the base with respect to the conductive trace.

39. The method of claim 31, wherein applying the etch to the adhesive includes applying a laser etch that ablates the adhesive.

40. The method of claim 31, wherein applying the etch to the adhesive includes applying a blanket plasma etch.

41. The method of claim 31, wherein forming the connection joint includes electroplating a metal on the conductive trace and the pad.

42. The method of claim 31, wherein forming the connection joint includes electrolessly plating a metal on the conductive trace and the pad.

43. The method of claim 31, wherein forming the connection joint includes applying thermocompression or thermosonic wire bonding using a capillary that presses a wire ball against the conductive trace and the pad to form a ball bond that contacts and bonds to the conductive trace and the pad.

44. The method of claim 31, wherein the connection joint contacts a surface of the conductive trace that is disposed above and overlaps and faces away from the pad.

45. The method of claim 31, wherein the connection joint is the only electrical conductor external to the chip that contacts the pad.

46. The method of claim 31, wherein the connection joint and the adhesive are the only materials external to the chip that contact the pad.

47. The method of claim 31, wherein the connection joint and the adhesive are the only materials that contact both the conductive trace and the pad.

48. The method of claim 31, wherein the conductive trace includes gold, the connection joint is essentially gold, and the base is essentially copper.

49. The method of claim 31, wherein the connection joint is devoid of a solder joint.

50. The method of claim 31, wherein the chip includes a plurality of conductive pads, a plurality of conductive traces are disposed above and overlap the pads, the base covers the conductive traces before applying the etch to the base, and the conductive traces are exposed by applying the etch to the base.

51. A method of connecting a conductive trace to a semiconductor chip, comprising the following steps in the sequence set forth:

providing a metal layer base;

providing a plating mask on the base, wherein the plating mask includes an opening that exposes a portion of the base;

electroplating a conductive trace on the exposed portion of the base through the opening in the plating mask, wherein the conductive trace includes top and bottom surfaces, the top surface contacts the base, and the bottom surface is exposed;

removing the plating mask, thereby exposing outer edges of the conductive trace between the top and bottom surfaces;

mechanically attaching a chip to the conductive trace using an insulative adhesive, wherein the chip includes upper and lower surfaces, the upper surface includes a pad, the conductive trace is disposed above and overlaps the pad, and the adhesive contacts the upper and bottom surfaces;

applying an etch that is selective of the base with respect to the conductive trace and the adhesive, thereby exposing the top surface;

applying an etch that is selective of the adhesive with respect to the conductive trace and the pad, thereby removing a portion of the adhesive and exposing the pad; and forming a connection joint that contacts and electrically connects the conductive trace and the pad.

52. The method of claim 51, wherein the plating mask is photoresist.

53. The method of claim 51, wherein the adhesive is thermoplastic polyimide.

54. The method of claim 51, wherein applying the etch that is selective of the base includes applying a wet chemical etch that is highly selective of copper with respect to gold.

55. The method of claim 51, wherein applying the etch that is selective of the adhesive includes applying a laser that ablates the adhesive.

56. The method of claim 51, wherein forming the connection joint includes plating a metal on the conductive trace and the pad.

57. The method of claim 51, wherein forming the connection joint includes wire bonding a ball bond on the conductive trace and the pad.

58. The method of claim 51, wherein the conductive trace provides horizontal fan-out routing between the pad and an outer edge of the chip.

59. The method of claim 51, wherein the conductive trace and the chip are devoid of solder joints.

60. The method of claim 51, wherein the conductive trace is an inner lead of a TAB lead.

61. A method of connecting a conductive trace to a semiconductor chip, comprising the following steps in the sequence set forth:

providing a metal layer base;

providing a plating mask on the base, wherein the plating mask includes an opening that exposes a portion of the base;

electroplating a conductive trace on the exposed portion of the base through the opening in the plating mask, wherein the conductive trace includes top and bottom surfaces, the top surface contacts the base, and the bottom surface is exposed;

removing the plating mask, thereby exposing outer edges of the conductive trace between the top and bottom surfaces;

mechanically attaching a chip to the conductive trace using an insulative adhesive, wherein the chip includes upper and lower surfaces, the upper surface includes a pad, the conductive trace is disposed above and overlaps the pad, and the adhesive contacts the upper and bottom surfaces;

applying an etch that is selective of the base with respect to the conductive trace and the adhesive, thereby removing a portion of the base above the conductive trace and the pad and forming a pillar in the base that covers and is connected to a portion of the conductive trace and does not overlap the pad;

applying an etch that is selective of the adhesive with respect to the conductive trace and the pad, thereby removing a portion of the adhesive and exposing the pad; and forming a connection joint that contacts and electrically connects the conductive trace and the pad.

62. The method of claim 61, wherein the plating mask is photoresist.

63. The method of claim 61, wherein the adhesive is thermoplastic polyimide.

64. The method of claim 61, wherein applying the etch that is selective of the base includes applying a wet chemical etch that is highly selective of copper with respect to gold.

65. The method of claim 61, wherein applying the etch that is selective of the adhesive includes applying a laser that ablates the adhesive.

66. The method of claim 61, wherein forming the connection joint includes plating a metal on the conductive trace and the pad.

67. The method of claim 61, wherein forming the connection joint includes wire bonding a ball bond on the conductive trace and the pad.

68. The method of claim 61, wherein the conductive trace provides horizontal fan-in routing between the pad and a center of the chip.

69. The method of claim 61, wherein the conductive trace and the chip are devoid of solder joints.

70. The method of claim 61, wherein the conductive trace and the chip are part of a chip size package.

71. A method of connecting a conductive trace to a semiconductor chip, comprising the following steps in the sequence set forth:
providing an adhesive between and in contact with a semiconductor chip and a conductive trace, wherein the chip includes a conductive pad, the conductive trace is disposed above and overlaps and is proximate to the pad, a base contacts and covers a top surface of the conductive trace opposite the chip and covers the pad, and the base and the conductive trace are different metals;
etching and removing at least a portion of the base from the conductive trace, thereby exposing a portion of the conductive trace that is disposed above and overlaps the pad;
positioning a capillary with a wire ball extending therefrom over the conductive trace, wherein the wire ball is connected to a wire that is fed through the capillary;
moving the capillary towards the pad so that the wire ball contacts the conductive trace without contacting the pad;
moving the capillary further towards the pad so that the wire ball contacts the pad and forms a ball bond on the conductive trace and the pad that remains connected to the wire; and
moving the capillary away from the pad, disconnecting the ball bond from the wire, and cooling the ball bond so that the ball bond forms a connection joint that contacts and electrically connects the conductive trace and the pad.

72. The method of claim 71, wherein the capillary forms the ball bond using thermocompression wire bonding.

73. The method of claim 71, wherein the capillary forms the ball bond using thermosonic wire bonding.

74. The method of claim 71, wherein the connection joint contacts a surface of the conductive trace that is disposed above and overlaps and faces away from the pad.

75. The method of claim 71, wherein the connection joint is the only electrical conductor external to the chip that contacts the pad.

76. The method of claim 71, wherein the connection joint and the adhesive are the only materials external to the chip that contact the pad.

77. The method of claim 71, wherein the connection joint and the adhesive are the only materials that contact both the conductive trace and the pad.

78. The method of claim 71, wherein the connection joint only contacts the chip, the adhesive and the conductive trace.

79. The method of claim 71, including moving the capillary in a horizontal loop to form the connection joint.

80. The method of claim 71, including opening a clamp that releases the wire as the capillary is moved towards and away from the pad, and closing the clamp thereby holding the wire as the connection joint is disconnected from the wire.

81. A method of connecting a conductive trace to a semiconductor chip, comprising:
providing a semiconductor chip, a conductive trace and a base, wherein the chip includes a conductive pad, the conductive trace is proximate to the pad, the base contacts and covers the conductive trace on a side opposite the chip, and the conductive trace and the base are different metals; then
etching the base, thereby removing a portion of the base that overlaps the pad and exposing the conductive trace; and then
forming a connection joint that contacts and electrically connects the conductive trace and the pad.

82. The method of claim 81, including mechanically attaching the chip to the conductive trace using an insulative adhesive before etching the base.

83. The method of claim 82, including etching the adhesive thereby exposing the pad after etching the base and before forming the connection joint.

84. The method of claim 83, wherein the adhesive contacts and is sandwiched between the conductive trace and the pad, and the conductive trace and the pad are electrically isolated from one another after etching the adhesive and before forming the connection joint.

85. The method of claim 81, including depositing the conductive trace on the base.

86. The method of claim 81, wherein etching the base includes applying a wet chemical etch that is selective of the base with respect to the conductive trace.

87. The method of claim 86, wherein etching the base includes selectively etching the base to remove a portion of the base that overlaps the pad and to form a pillar in the base that covers and is connected to a portion of the conductive trace and does not overlap the pad.

88. The method of claim 81, wherein the conductive trace includes a non-copper layer and a copper layer, the base is copper, the non-copper layer contacts the base and the copper layer is spaced from the base.

89. The method of claim 81, wherein the conductive trace includes gold and the base is essentially copper.

90. The method of claim 81, wherein the chip includes a plurality of conductive pads, a plurality of conductive traces are proximate to the pads, the base covers the conductive traces before etching the base, and the conductive traces are exposed by etching the base.

91. A method of connecting a conductive trace to a semiconductor chip, comprising:
providing a semiconductor chip that includes a conductive pad;
attaching a conductive trace to a base, wherein the conductive trace and the base are different metals; then
disposing an adhesive between the chip arid the conductive trace, thereby mechanically attaching the chip to the conductive trace such that the conductive trace overlaps the pad; then
etching the base, thereby removing a portion of the base that overlaps the pad and exposing the conductive trace and the adhesive; then
etching the adhesive, thereby exposing the pad while the conductive trace overlaps the pad; and then forming a connection joint that contacts and electrically connects the conductive trace and the pad.

92. The method of claim 91, wherein attaching the conductive trace to the base includes electroplating the conductive trace on the base.

93. The method of claim 91, wherein etching the adhesive includes applying a laser to the adhesive.

94. The method of claim 91, wherein the conductive trace overlaps only one peripheral edge of the pad.

95. The method of claim 91 wherein the conductive trace overlaps only two peripheral edges of the pad, and the two peripheral edges are opposite one another.

96. The method of claim 91, wherein the connection joint contacts a surface of the conductive trace that is disposed above and overlaps and faces away from the pad.

97. The method of claim 91, wherein the connection joint is the only electrical conductor external to the chip that contacts the pad.

98. The method of claim 91, wherein the connection joint and the adhesive are the only materials external to the chip that contact the pad.

99. The method of claim 91, wherein the connection joint and the adhesive are the only materials that contact both the conductive trace and the pad.

100. The method of claim 91, wherein the adhesive is a thermosetting epoxy.

101. The method of claim 91, wherein the adhesive is a thermoplastic polyimide.

102. The method of claim 91, wherein the connection joint is formed by electroplating.

103. The method of claim 91, wherein the connection joint is formed by electroless plating.

104. The method of claim 91, wherein the connection joint is a ball bond formed by thermocompression or thermosonic wire bonding.

105. The method of claim 104, wherein the ball bond consists of a deformed wire ball.

106. The method of claim 104, wherein the ball bond only contacts the conductive trace, the adhesive and the pad.

107. The method of claim 91, wherein the conductive trace includes gold, the connection joint is essentially gold, and the base is essentially copper.

108. The method of claim 91, wherein an assembly that includes the chip, the conductive trace, the adhesive and the connection joint is devoid of solder joints.

109. The method of claim 91, wherein an assembly that includes the chip, the conductive trace, the adhesive and the connection joint is devoid of wire bonds, TAB leads and solder joints.

110. The method of claim 91, wherein the chip includes a plurality of conductive pads, a plurality of conductive traces overlap the pads, the base covers the conductive traces before etching the base, and the conductive traces are exposed by etching the base.

111. A method of connecting a conductive trace to a semiconductor chip, comprising the following steps in the sequence set forth:

forming a conductive trace on a base, wherein the conductive trace and the base are different metallic materials;

disposing an insulative adhesive between a chip and the conductive trace, thereby mechanically attaching the chip to the conductive trace, wherein the chip includes upper and lower surfaces, the upper surface includes a pad, the conductive trace includes top and bottom surfaces, the conductive trace is disposed above and overlaps the pad, and the adhesive contacts the upper and bottom surfaces;

applying an etch to the base that is selective of the base with respect to the conductive trace and the adhesive, thereby removing a portion of the base that overlaps the pad and exposing the conductive trace and the adhesive;

applying an etch to the adhesive, thereby exposing the pad; and forming a connection joint that contacts and electrically connects the conductive trace and the pad.

112. The method of claim 111, wherein forming the conductive trace on the base includes electroplating the conductive trace on the base.

113. The method of claim 112, including forming a photoresist layer on the base that selectively exposes a portion of the base that defines the conductive trace, and electroplating the conductive trace on the selectively exposed portion of the base.

114. The method of claim 111, wherein the conductive trace overlaps only one peripheral edge of the pad.

115. The method of claim 111 wherein the conductive trace overlaps only two peripheral edges of the pad, and the two peripheral edges are opposite one another.

116. The method of claim 111, wherein applying the etch to the base forms a pillar in the base that covers and is connected to a portion of the conductive trace and does not overlap the pad.

117. The method of claim 116, wherein the pillar overlaps the chip.

118. The method of claim 111, wherein applying the etch to the base includes applying a wet chemical etch that is selective of the base with respect to the conductive trace.

119. The method of claim 111, wherein applying the etch to the adhesive includes applying a laser etch that ablates the adhesive.

120. The method of claim 111, wherein applying the etch to the adhesive includes applying a blanket plasma etch.

121. The method of claim 111, wherein forming the connection joint includes electroplating a metal on the conductive trace and the pad.

122. The method of claim 111, wherein forming the connection joint includes electrolessly plating a metal on the conductive trace and the pad.

123. The method of claim 111, wherein forming the connection joint includes applying thermocompression or thermosonic wire bonding using a capillary that presses a wire ball against the conductive trace and the pad to form a ball bond that contacts and bonds to the conductive trace and the pad.

124. The method of claim 111, wherein the connection joint contacts a surface of the conductive trace that is disposed above and overlaps and faces away from the pad.

125. The method of claim 111, wherein the connection joint is the only electrical conductor external to the chip that contacts the pad.

126. The method of claim 111, wherein the connection joint and the adhesive are the only materials external to the chip that contact the pad.

127. The method of claim 111, wherein the connection joint and the adhesive are the only materials that contact both the conductive trace and the pad.

128. The method of claim 111, wherein the conductive trace includes gold, the connection joint is essentially gold, and the base is essentially copper.

129. The method of claim 111, wherein the connection joint is devoid of a solder joint.

130. The method of claim 111, wherein the chip includes a plurality of conductive pads, a plurality of conductive traces are disposed above and overlap the pads, the base covers the conductive traces before applying the etch to the base, and the conductive traces are exposed by applying the etch to the base.

131. A method of connecting a conductive trace to a semiconductor chip, comprising the following steps in the sequence set forth:
  providing a metal layer base;
  providing a plating mask on the base, wherein the plating mask includes an opening that exposes a portion of the base;
  electroplating a conductive trace on the exposed portion of the base through the opening in the plating mask, wherein the conductive trace includes top and bottom surfaces, the top surface contacts the base, and the bottom surface is exposed;
  removing the plating mask, thereby exposing outer edges of the conductive trace between the top and bottom surfaces;
  mechanically attaching a chip to the conductive trace using an insulative adhesive, wherein the chip includes upper and lower surfaces, the upper surface includes a pad, the conductive trace is disposed above and overlaps the pad, and the adhesive contacts the upper and bottom surfaces;
  applying an etch that is selective of the base with respect to the conductive trace and the adhesive, thereby removing a portion of the base that overlaps the pad and exposing the top surface;
  applying an etch that is selective of the adhesive with respect to the conductive trace and the pad, thereby removing a portion of the adhesive and exposing the pad; and
  forming a connection joint that contacts and electrically connects the conductive trace and the pad.

132. The method of claim 131, wherein the plating mask is photoresist.

133. The method of claim 131, wherein the adhesive is thermoplastic polyimide.

134. The method of claim 131, wherein applying the etch that is selective of the base includes applying a wet chemical etch that is highly selective of copper with respect to gold.

135. The method of claim 131, wherein applying the etch that is selective of the adhesive includes applying a laser that ablates the adhesive.

136. The method of claim 131, wherein forming the connection joint includes plating a metal on the conductive trace and the pad.

137. The method of claim 131, wherein forming the connection joint includes wire bonding a ball bond on the conductive trace and the pad.

138. The method of claim 131, wherein the conductive trace provides horizontal fan-out routing between the pad and an outer edge of the chip.

139. The method of claim 131, wherein the conductive trace and the chip are devoid of solder joints.

140. The method of claim 131, wherein the conductive trace is an inner lead of a TAB lead.

141. A method of connecting a conductive trace to a semiconductor chip, comprising:
  providing a semiconductor chip, a conductive trace and a base, wherein the chip includes a conductive pad, the conductive trace is proximate to the pad, the base contacts and covers the conductive trace on a side opposite the chip, and the conductive trace and the base are different metals; then
  etching the base, thereby removing the base and exposing the conductive trace; and then
  forming a connection joint that contacts and electrically connects the conductive trace and the pad.

142. The method of claim 141, including mechanically attaching the chip to the conductive trace using an insulative adhesive before etching the base.

143. The method of claim 142, including etching the adhesive thereby exposing the pad after etching the base and before forming the connection joint.

144. The method of claim 143, wherein the adhesive contacts and is sandwiched between the conductive trace and the pad, and the conductive trace and the pad are electrically isolated from one another after etching the adhesive and before forming the connection joint.

145. The method of claim 141, including depositing the conductive trace on the base.

146. The method of claim 141, wherein etching the base includes applying a wet chemical etch that is selective of the base with respect to the conductive trace.

147. The method of claim 141, wherein the conductive trace includes a non-copper layer and a copper layer, the base is copper, the non-copper layer contacts the base and the copper layer is spaced from the base.

148. The method of claim 147, wherein the non-copper layer is nickel, gold, palladium or silver.

149. The method of claim 141, wherein the conductive trace includes gold and the base is essentially copper.

150. The method of claim 141, wherein the chip includes a plurality of conductive pads, a plurality of conductive traces are proximate to the pads, the base covers the conductive traces before etching the base, and the conductive traces are exposed by etching the base.

151. A method of connecting a conductive trace to a semiconductor chip, comprising:
  providing a semiconductor chip that includes a conductive pad;
  attaching a conductive trace to a base, wherein the conductive trace and the base are different metals; then
  disposing an adhesive between the chip and the conductive trace, thereby mechanically attaching the chip to the conductive trace such that the conductive trace overlaps the pad; then
  etching the base, thereby removing the base and exposing the conductive trace and the adhesive; then
  etching the adhesive, thereby exposing the pad while the conductive trace overlaps the pad; and then
  forming a connection joint that contacts and electrically connects the conductive trace and the pad.

152. The method of claim 151, wherein attaching the conductive trace to the base includes electroplating the conductive trace on the base.

153. The method of claim 151, wherein etching the adhesive includes applying a laser to the adhesive.

154. The method of claim 151, wherein the conductive trace overlaps only one peripheral edge of the pad.

155. The method of claim 151 wherein the conductive trace overlaps only two peripheral edges of the pad, and the two peripheral edges are opposite one another.

156. The method of claim 151, wherein the connection joint contacts a surface of the conductive trace that is disposed above and overlaps and faces away from the pad.

157. The method of claim 151, wherein the connection joint is the only electrical conductor external to the chip that contacts the pad.

158. The method of claim 151, wherein the connection joint and the adhesive are the only materials external to the chip that contact the pad.

159. The method of claim 151, wherein the connection joint and the adhesive are the only materials that contact both the conductive trace and the pad.

160. The method of claim 151, wherein the adhesive is a thermosetting epoxy.

161. The method of claim 151, wherein the adhesive is a thermoplastic polyimide.

162. The method of claim 151, wherein the connection joint is formed by electroplating.

163. The method of claim 151, wherein the connection joint is formed by electroless plating.

164. The method of claim 151, wherein the connection joint is a ball bond formed by thermocompression or thermosonic wire bonding.

165. The method of claim 164, wherein the ball bond consists of a deformed wire ball.

166. The method of claim 164, wherein the ball bond only contacts the conductive trace, the adhesive and the pad.

167. The method of claim 151, wherein the conductive trace includes gold, the connection joint is essentially gold, and the base is essentially copper.

168. The method of claim 151, wherein an assembly that includes the chip, the conductive trace, the adhesive and the connection joint is devoid of solder joints.

169. The method of claim 151, wherein an assembly that includes the chip, the conductive trace, the adhesive and the connection joint is devoid of wire bonds, TAB leads and solder joints.

170. The method of claim 151, wherein the chip includes a plurality of conductive pads, a plurality of conductive traces overlap the pads, the base covers the conductive traces before etching the base, and the conductive traces are exposed by etching the base.

171. A method of connecting a conductive trace to a semiconductor chip, comprising the following steps in the sequence set forth:

forming a conductive trace on a base, wherein the conductive trace and the base are different metallic materials;

disposing an insulative adhesive between a chip and the conductive trace, thereby mechanically attaching the chip to the conductive trace, wherein the chip includes upper and lower surfaces, the upper surface includes a pad, the conductive trace includes top and bottom surfaces, the conductive trace is disposed above and overlaps the pad, and the adhesive contacts the upper and bottom surfaces;

applying an etch to the base that is selective of the base with respect to the conductive trace and the adhesive, thereby removing the base and exposing the conductive trace and the adhesive;

applying an etch to the adhesive, thereby exposing the pad; and forming a connection joint that contacts and electrically connects the conductive trace and the pad.

172. The method of claim 171, wherein forming the conductive trace on the base includes electroplating the conductive trace on the base.

173. The method of claim 172, including forming a photoresist layer on the base that selectively exposes a portion of the base that defines the conductive trace, and electroplating the conductive trace on the selectively exposed portion of the base.

174. The method of claim 171, wherein the conductive trace overlaps only one peripheral edge of the pad.

175. The method of claim 171 wherein the conductive trace overlaps only two peripheral edges of the pad, and the two peripheral edges are opposite one another.

176. The method of claim 171, wherein the conductive trace overlaps only three peripheral edges of the pad.

177. The method of claim 171, wherein the conductive trace overlaps only two corners of the pad, and the two corners are opposite one another.

178. The method of claim 171, wherein applying the etch to the base includes applying a wet chemical etch that is selective of the base with respect to the conductive trace.

179. The method of claim 171, wherein applying the etch to the adhesive includes applying a laser etch that ablates the adhesive.

180. The method of claim 171, wherein applying the etch to the adhesive includes applying a blanket plasma etch.

181. The method of claim 171, wherein forming the connection joint includes electroplating a metal on the conductive trace and the pad.

182. The method of claim 171, wherein forming the connection joint includes electrolessly plating a metal on the conductive trace and the pad.

183. The method of claim 171, wherein forming the connection joint includes applying thermocompression or thermosonic wire bonding using a capillary that presses a wire ball against the conductive trace and the pad to form a ball bond that contacts and bonds to the conductive trace and the pad.

184. The method of claim 171, wherein the connection joint contacts a surface of the conductive trace that is disposed above and overlaps and faces away from the pad.

185. The method of claim 171, wherein the connection joint is the only electrical conductor external to the chip that contacts the pad.

186. The method of claim 171, wherein the connection joint and the adhesive are the only materials external to the chip that contact the pad.

187. The method of claim 171, wherein the connection joint and the adhesive are the only materials that contact both the conductive trace and the pad.

188. The method of claim 171, wherein the conductive trace includes gold, the connection joint is essentially gold, and the base is essentially copper.

189. The method of claim 171, wherein the connection joint is devoid of a solder joint.

190. The method of claim 171, wherein the chip includes a plurality of conductive pads, a plurality of conductive traces are disposed above and overlap the pads, the base covers the conductive traces before applying the etch to the base, and the conductive traces are exposed by applying the etch to the base.

191. A method of connecting a conductive trace to a semiconductor chip, comprising the following steps in the sequence set forth:

providing a metal layer base;

providing a plating mask on the base, wherein the plating mask includes an opening that exposes a portion of the base;

electroplating a conductive trace on the exposed portion of the base through the opening in the plating mask, wherein the conductive trace includes top and bottom surfaces, the top surface contacts the base, and the bottom surface is exposed;

removing the plating mask, thereby exposing outer edges of the conductive trace between the top and bottom surfaces;

mechanically attaching a chip to the conductive trace using an insulative adhesive, wherein the chip includes upper and lower surfaces, the upper surface includes a pad, the conductive trace is disposed above and overlaps the pad, and the adhesive contacts the upper and bottom surfaces;

applying an etch that is selective of the base with respect to the conductive trace and the adhesive, thereby removing the base and exposing the top surface;

applying an etch that is selective of the adhesive with respect to the conductive trace and the pad, thereby removing a portion of the adhesive and exposing the pad; and forming a connection joint that contacts and electrically connects the conductive trace and the pad.

192. The method of claim 191, wherein the plating mask is photoresist.

193. The method of claim 191, wherein the adhesive is thermoplastic polyimide.

194. The method of claim 191, wherein applying the etch that is selective of the base includes applying a wet chemical etch that is highly selective of copper with respect to gold.

195. The method of claim 191, wherein applying the etch that is selective of the adhesive includes applying a laser that ablates the adhesive.

196. The method of claim 191, wherein forming the connection joint includes plating a metal on the conductive trace and the pad.

197. The method of claim 191, wherein forming the connection joint includes wire bonding a ball bond on the conductive trace and the pad.

198. The method of claim 191, wherein the conductive trace provides horizontal fan-out routing between the pad and an outer edge of the chip.

199. The method of claim 191, wherein the conductive trace and the chip are devoid of solder joints.

200. The method of claim 191, wherein the conductive trace is an inner lead of a TAB lead.

201. A method of connecting a conductive trace to a semiconductor chip, comprising:

providing a semiconductor chip, a conductive trace and a base, wherein the chip includes a conductive pad, the conductive trace is proximate to the pad, the base contacts and covers the conductive trace on a side opposite the chip, and the conductive trace and the base are different metals; then forming an encapsulant that covers the chip on a side opposite the base; then etching the base, thereby exposing the conductive trace; and then forming a connection joint that contacts and electrically connects the conductive trace and the pad.

202. The method of claim 201, including mechanically attaching the chip to the conductive trace using an insulative adhesive before forming the encapsulant.

203. The method of claim 202, including etching the adhesive thereby exposing the pad after etching the base and before forming the connection joint.

204. The method of claim 203, wherein the adhesive contacts and is sandwiched between the conductive trace and the pad, and the conductive trace and the pad are electrically isolated from one another after etching the adhesive and before forming the connection joint.

205. The method of claim 201, including depositing the conductive trace on the base.

206. The method of claim 201, wherein etching the base includes applying a wet chemical etch that is selective of the base with respect to the conductive trace.

207. The method of claim 201, wherein the conductive trace includes a non-copper layer and a copper layer, the base is copper, the non-copper layer contacts the base and the copper layer is spaced from the base.

208. The method of claim 207, wherein the non-copper layer is nickel, gold, palladium or silver.

209. The method of claim 201, wherein the conductive trace includes gold and the base is essentially copper.

210. The method of claim 201, wherein the chip includes a plurality of conductive pads, a plurality of conductive traces are proximate to the pads, the base covers the conductive traces before etching the base, and the conductive traces are exposed by etching the base.

211. A method of connecting a conductive trace to a semiconductor chip, comprising:

providing a semiconductor chip that includes a conductive pad;

attaching a conductive trace to a base, wherein the conductive trace and the base are different metals; then disposing an adhesive between the chip and the conductive trace, thereby mechanically attaching the chip to the conductive trace such that the conductive trace overlaps the pad; then forming an encapsulant over a side of the chip opposite the pad; then etching the base, thereby exposing the conductive trace and the adhesive; then etching the adhesive, thereby exposing the pad while the conductive trace overlaps the pad; and then forming a connection joint that contacts and electrically connects the conductive trace and the pad.

212. The method of claim 211, wherein attaching the conductive trace to the base includes electroplating the conductive trace on the base.

213. The method of claim 211, wherein etching the adhesive includes applying a laser to the adhesive.

214. The method of claim 211, wherein the conductive trace overlaps only one peripheral edge of the pad.

215. The method of claim 211 wherein the conductive trace overlaps only two peripheral edges of the pad, and the two peripheral edges are opposite one another.

216. The method of claim 211, wherein the connection joint contacts a surface of the conductive trace that is disposed above and overlaps and faces away from the pad.

217. The method of claim 211, wherein the connection joint is the only electrical conductor external to the chip that contacts the pad.

218. The method of claim 211, wherein the connection joint and the adhesive are the only materials external to the chip that contact the pad.

219. The method of claim 211, wherein the connection joint and the adhesive are the only materials that contact both the conductive trace and the pad.

220. The method of claim 211, wherein the adhesive is a thermosetting epoxy.

221. The method of claim 211, wherein the adhesive is a thermoplastic polyimide.

222. The method of claim 211, wherein the connection joint is formed by electroplating.

223. The method of claim 211, wherein the connection joint is formed by electroless plating.

224. The method of claim 211, wherein the connection joint is a ball bond formed by thermocompression or thermosonic wire bonding.

225. The method of claim 224, wherein the ball bond consists of a deformed wire ball.

226. The method of claim 224, wherein the ball bond only contacts the conductive trace, the adhesive and the pad.

227. The method of claim 211, wherein the conductive trace includes gold, the connection joint is essentially gold, and the base is essentially copper.

228. The method of claim 211, wherein an assembly that includes the chip, the conductive trace, the adhesive, the encapsulant and the connection joint is devoid of solder joints.

229. The method of claim 211, wherein an assembly that includes the chip, the conductive trace, the adhesive, the encapsulant and the connection joint is devoid of wire bonds, TAB leads and solder joints.

230. The method of claim 211, wherein the chip includes a plurality of conductive pads, a plurality of conductive traces overlap the pads, the base covers the conductive traces before etching the base, and the conductive traces are exposed by etching the base.

231. A method of connecting a conductive trace to a semiconductor chip, comprising the following steps in the sequence set forth:

forming a conductive trace on a base, wherein the conductive trace and the base are different metallic materials;

disposing an insulative adhesive between a chip and the conductive trace, thereby mechanically attaching the chip to the conductive trace, wherein the chip includes upper and lower surfaces, the upper surface includes a pad, the conductive trace includes top and bottom surfaces, the conductive trace is disposed above and overlaps the pad, and the adhesive contacts the upper and bottom surfaces;

forming an encapsulant that contacts and covers the lower surface;

applying an etch to the base that is selective of the base with respect to the conductive trace and the adhesive, thereby exposing the conductive trace and the adhesive;

applying an etch to the adhesive, thereby exposing the pad; and forming a connection joint that contacts and electrically connects the conductive trace and the pad.

232. The method of claim 231, wherein forming the conductive trace on the base includes electroplating the conductive trace on the base.

233. The method of claim 232, including forming a photoresist layer on the base that selectively exposes a portion of the base that defines the conductive trace, and electroplating the conductive trace on the selectively exposed portion of the base.

234. The method of claim 231, wherein the conductive trace overlaps only one peripheral edge of the pad.

235. The method of claim 231 wherein the conductive trace overlaps only two peripheral edges of the pad, and the two peripheral edges are opposite one another.

236. The method of claim 231, wherein the conductive trace overlaps only three peripheral edges of the pad.

237. The method of claim 231, wherein the conductive trace overlaps only two corners of the pad, and the two corners are opposite one another.

238. The method of claim 231, wherein applying the etch to the base includes applying a wet chemical etch that is selective of the base with respect to the conductive trace.

239. The method of claim 231, wherein applying the etch to the adhesive includes applying a laser etch that ablates the adhesive.

240. The method of claim 231, wherein applying the etch to the adhesive includes applying a blanket plasma etch.

241. The method of claim 231, wherein forming the connection joint includes electroplating a metal on the conductive trace and the pad.

242. The method of claim 231, wherein forming the connection joint includes electrolessly plating a metal on the conductive trace and the pad.

243. The method of claim 231, wherein forming the connection joint includes applying thermocompression or thermosonic wire bonding using a capillary that presses a wire ball against the conductive trace and the pad to form a ball bond that contacts and bonds to the conductive trace and the pad.

244. The method of claim 231, wherein the connection joint contacts a surface of the conductive trace that is disposed above and overlaps and faces away from the pad.

245. The method of claim 231, wherein the connection joint is the only electrical conductor external to the chip that contacts the pad.

246. The method of claim 231, wherein the connection joint and the adhesive are the only materials external to the chip that contact the pad.

247. The method of claim 231, wherein the connection joint and the adhesive are the only materials that contact both the conductive trace and the pad.

248. The method of claim 231, wherein the conductive trace includes gold, the connection joint is essentially gold, and the base is essentially copper.

249. The method of claim 231, wherein the connection joint is devoid of a solder joint.

250. The method of claim 231, wherein the chip includes a plurality of conductive pads, a plurality of conductive traces are disposed above and overlap the pads, the base covers the conductive traces before applying the etch to the base, and the conductive traces are exposed by applying the etch to the base.

251. A method of connecting a conductive trace to a semiconductor chip, comprising the following steps in the sequence set forth:

providing a metal layer base;

providing a plating mask on the base, wherein the plating mask includes an opening that exposes a portion of the base;

electroplating a conductive trace on the exposed portion of the base through the opening in the plating mask, wherein the conductive trace includes top and bottom surfaces, the top surface contacts the base, and the bottom surface is exposed;

removing the plating mask, thereby exposing outer edges of the conductive trace between the top and bottom surfaces;

mechanically attaching a chip to the conductive trace using an insulative adhesive, wherein the chip includes upper and lower surfaces, the upper surface includes a pad, the conductive trace is disposed above and overlaps the pad, and the adhesive contacts the upper and bottom surfaces;

forming an encapsulant that contacts and covers the lower surface;

applying an etch that is selective of the base with respect to the conductive trace and the adhesive, thereby exposing the top surface;

applying an etch that is selective of the adhesive with respect to the conductive trace and the pad, thereby removing a portion of the adhesive and exposing the pad; and forming a connection joint that contacts and electrically connects the conductive trace and the pad.

252. The method of claim 251, wherein the plating mask is photoresist.

253. The method of claim 251, wherein the adhesive is thermoplastic polyimide.

254. The method of claim 251, wherein applying the etch that is selective of the base includes applying a wet chemical etch that is highly selective of copper with respect to gold.

255. The method of claim 251, wherein applying the etch that is selective of the adhesive includes applying a laser that ablates the adhesive.

256. The method of claim 251, wherein forming the connection joint includes plating a metal on the conductive trace and the pad.

257. The method of claim 251, wherein forming the connection joint includes wire bonding a ball bond on the conductive trace and the pad.

258. The method of claim 251, wherein the conductive trace provides horizontal fan-out routing between the pad and an outer edge of the chip.

259. The method of claim 251, wherein the conductive trace and the chip are devoid of solder joints.

260. The method of claim 251, wherein the conductive trace is an inner lead of a TAB lead.

261. A method of connecting a conductive trace to a semiconductor chip, comprising:

providing a semiconductor chip, a conductive trace, a base and an adhesive, wherein the chip includes a conductive pad, the conductive trace is proximate to the pad, the base contacts and covers the conductive trace on a side opposite the chip, the adhesive contacts and is sandwiched between the conductive trace and the pad, and the conductive trace and the base are different metals; then etching the base, thereby exposing the conductive trace;

etching the adhesive, thereby exposing the chip; and electrically connecting the conductive trace and the pad.

262. The method of claim 261, wherein the base overlaps the pad before etching the base.

263. The method of claim 262, wherein the base overlaps an outer edge of the chip before etching the base.

264. The method of claim 263, wherein the conductive trace and the pad are electrically isolated from one another after etching the base and etching the adhesive and before electrically connecting the conductive trace and the pad.

265. The method of claim 261, including depositing the conductive trace on the base.

266. The method of claim 261, wherein etching the base includes applying a wet chemical etch that is selective of the base with respect to the conductive trace.

267. The method of claim 261, wherein the conductive trace includes a non-copper layer and a copper layer, the base is copper, the non-copper layer contacts the base and the copper layer is spaced from the base.

268. The method of claim 267, wherein the non-copper layer is nickel, gold, palladium or silver.

269. The method of claim 261, wherein the conductive trace includes gold and the base is essentially copper.

270. The method of claim 261, wherein the chip includes a plurality of conductive pads, a plurality of conductive traces are proximate to the pads, the base covers the conductive traces before etching the base, and the conductive traces are exposed by etching the base.

271. A method of connecting a conductive trace to a semiconductor chip, comprising:

providing a semiconductor chip that includes a conductive pad;

attaching a conductive trace to a base, wherein the conductive trace and the base are different metals; then disposing an adhesive between the chip and the conductive trace, thereby mechanically attaching the chip to the conductive trace such that the conductive trace overlaps the pad and the adhesive contacts and is sandwiched between the conductive trace and the pad;

etching the base, thereby exposing the conductive trace and the adhesive while the conductive trace overlaps the pad and the adhesive contacts and is sandwiched between the conductive trace and the pad;

etching the adhesive, thereby exposing the chip while the conductive trace overlaps the pad and the adhesive contacts and is sandwiched between the conductive trace and the pad; and electrically connecting the conductive trace and the pad.

272. The method of claim 271, wherein attaching the conductive trace to the base includes electroplating the conductive trace on the base.

273. The method of claim 271, wherein etching the adhesive includes applying a laser to the adhesive.

274. The method of claim 271, wherein the conductive trace overlaps only one peripheral edge of the pad.

275. The method of claim 271 wherein the conductive trace overlaps only two peripheral edges of the pad, and the two peripheral edges are opposite one another.

276. The method of claim 271, wherein electrically connecting the conductive trace and the pad includes forming a connection joint that contacts a surface of the conductive trace that is disposed above and overlaps and faces away from the pad.

277. The method of claim 276, wherein the connection joint is the only electrical conductor external to the chip that contacts the pad.

278. The method of claim 276, wherein the connection joint and the adhesive are the only materials external to the chip that contact the pad.

279. The method of claim 276, wherein the connection joint and the adhesive are the only materials that contact both the conductive trace and the pad.

280. The method of claim 276, wherein the adhesive is a thermosetting epoxy.

281. The method of claim 276, wherein the adhesive is a thermoplastic polyimide.

282. The method of claim 276, wherein the connection joint is formed by electroplating.

283. The method of claim 276, wherein the connection joint is formed by electroless plating.

284. The method of claim 276, wherein the connection joint is a ball bond formed by thermocompression or thermosonic wire bonding.

285. The method of claim 284, wherein the ball bond consists of a deformed wire ball.

286. The method of claim 284, wherein the ball bond only contacts the conductive trace, the adhesive and the pad.

287. The method of claim 271, wherein the conductive trace includes gold, and the base is essentially copper.

288. The method of claim 271, wherein an assembly that includes the chip, the conductive trace and the adhesive is devoid of solder joints.

289. The method of claim 271, wherein an assembly that includes the chip, the conductive trace and the adhesive is devoid of wire bonds, TAB leads and solder joints.

290. The method of claim 271, wherein the chip includes a plurality of conductive pads, a plurality of conductive traces overlap the pads, the base covers the conductive traces before etching the base, and the conductive traces are exposed by etching the base.

291. A method of connecting a conductive trace to a semiconductor chip, comprising:

forming a conductive trace on a base, wherein the conductive trace and the base are different metallic materials; then disposing an adhesive between a chip and the conductive trace, thereby mechanically attaching the chip to the conductive trace, wherein the chip includes upper and lower surfaces, the upper surface includes a pad, the conductive trace includes top and bottom surfaces, the conductive trace is disposed above and overlaps the pad, the adhesive contacts the upper and bottom surfaces and the adhesive contacts and is sandwiched between the conductive trace and the pad;

applying an etch to the base that is selective of the base with respect to the conductive trace and the adhesive, thereby exposing the conductive trace and the adhesive while the conductive trace overlaps the pad and the adhesive contacts and is sandwiched between the conductive trace and the pad;

applying an etch to the adhesive, thereby exposing the chip while the conductive trace overlaps the pad and the adhesive contacts and is sandwiched between the conductive trace and the pad; and electrically connecting the conductive trace and the pad.

292. The method of claim 291, wherein forming the conductive trace on the base includes electroplating the conductive trace on the base.

293. The method of claim 292, including forming a photoresist layer on the base that selectively exposes a portion of the base that defines the conductive trace, and electroplating the conductive trace on the selectively exposed portion of the base.

294. The method of claim 291, wherein the conductive trace overlaps only one peripheral edge of the pad.

295. The method of claim 291 wherein the conductive trace overlaps only two peripheral edges of the pad, and the two peripheral edges are opposite one another.

296. The method of claim 291, wherein the conductive trace overlaps only three peripheral edges of the pad.

297. The method of claim 291, wherein the conductive trace overlaps only two corners of the pad, and the two corners are opposite one another.

298. The method of claim 291, wherein applying the etch to the base includes applying a wet chemical etch that is selective of the base with respect to the conductive trace.

299. The method of claim 291, wherein applying the etch to the adhesive includes applying a laser etch that ablates the adhesive.

300. The method of claim 291, wherein applying the etch to the adhesive includes applying a blanket plasma etch.

301. The method of claim 291, wherein electrically connecting the conductive trace and the pad includes electroplating a metal on the conductive trace and the pad.

302. The method of claim 291, wherein electrically connecting the conductive trace and the pad includes electrolessly plating a metal on the conductive trace and the pad.

303. The method of claim 291, wherein electrically connecting the conductive trace and the pad includes applying thermocompression or thermosonic wire bonding using a capillary that presses a wire ball against the conductive trace and the pad to form a ball bond that contacts and bonds to the conductive trace and the pad.

304. The method of claim 291, wherein electrically connecting the conductive trace and the pad includes forming a connection joint that contacts a surface of the conductive trace that is disposed above and overlaps and faces away from the pad.

305. The method of claim 304, wherein the connection joint is the only electrical conductor external to the chip that contacts the pad.

306. The method of claim 304, wherein the connection joint and the adhesive are the only materials external to the chip that contact the pad.

307. The method of claim 304, wherein the connection joint and the adhesive are the only materials that contact both the conductive trace and the pad.

308. The method of claim 291, wherein the conductive trace includes gold, and the base is essentially copper.

309. The method of claim 291, wherein an assembly that includes the chip, the conductive trace and the adhesive is devoid of solder joints.

310. The method of claim 291, wherein the chip includes a plurality of conductive pads, a plurality of conductive traces are disposed above and overlap the pads, the base covers the conductive traces before applying the etch to the base, and the conductive traces are exposed by applying the etch to the base.

311. A method of connecting a conductive trace to a semiconductor chip, comprising:

providing a metal layer base;

providing a plating mask on the base, wherein the plating mask includes an opening that exposes a portion of the base;

electroplating a conductive trace on the exposed portion of the base through the opening in the plating mask, wherein the conductive trace includes top and bottom surfaces, the top surface contacts the base, and the bottom surface is exposed;

removing the plating mask, thereby exposing outer edges of the conductive trace between the top and bottom surfaces; then mechanically attaching a chip to the conductive trace using an adhesive, wherein the chip includes upper and lower surfaces, the upper surface includes a pad, the conductive trace is disposed above and overlaps the pad, the adhesive contacts the upper and bottom surfaces and the adhesive contacts and is sandwiched between the conductive trace and the pad;

applying an etch that is selective of the base with respect to the conductive trace and the adhesive, thereby exposing the top surface while the conductive trace overlaps the pad and the adhesive contacts and is sandwiched between the conductive trace and the pad;

applying an etch that is selective of the adhesive with respect to the conductive trace and the pad, thereby removing a portion of the adhesive and exposing the chip while the conductive trace overlaps the pad and the adhesive contacts and is sandwiched between the conductive trace and the pad; and electrically connecting the conductive trace and the pad.

312. The method of claim 311, wherein the plating mask is photoresist.

313. The method of claim 311, wherein the adhesive is thermoplastic polyimide.

314. The method of claim 311, wherein applying the etch that is selective of the base includes applying a wet chemical etch that is highly selective of copper with respect to gold.

315. The method of claim 311, wherein applying the etch that is selective of the adhesive includes applying a laser that ablates the adhesive.

316. The method of claim 311, wherein electrically connecting the conductive trace and the pad includes plating a metal on the conductive trace and the pad.

317. The method of claim 311, wherein electrically connecting the conductive trace and the pad includes wire bonding a ball bond on the conductive trace and the pad.

318. The method of claim 311, wherein the conductive trace provides horizontal fan-out routing between the pad and an outer edge of the chip.

319. The method of claim 311, wherein the conductive trace and the chip are devoid of solder joints.

320. The method of claim 311, wherein the conductive trace is an inner lead of a TAB lead.

321. A method of connecting conductive traces to a semiconductor chip, comprising:

providing a semiconductor chip, first and second conductive traces and a base, wherein the chip includes first and second conductive pads, the first and second conductive traces are proximate to the first and second pads respectively, the base contacts and covers and electrically connects the conductive traces, the conductive traces are sandwiched between the base and the chip, and the conductive traces are different metals than the base; then etching the base, thereby removing a portion of the base that overlaps the pads, exposing the conductive traces and electrically isolating the conductive traces; and then forming first and second connection joints that contact and electrically connect the first and second conductive traces respectively and the first and second pads respectively.

322. The method of claim 321, including mechanically attaching the chip to the conductive traces using an insulative adhesive before etching the base.

323. The method of claim 322, including etching the adhesive thereby exposing the pads after etching the base and before forming the connection joints.

324. The method of claim 323, wherein the adhesive contacts and is sandwiched between the conductive traces and the pads, and the conductive traces and the pads are electrically isolated from one another after etching the adhesive and before forming the connection joints.

325. The method of claim 321, including depositing the conductive traces on the base.

326. The method of claim 321, wherein etching the base includes applying a wet chemical etch that is selective of the base with respect to the conductive traces.

327. The method of claim 326, wherein etching the base includes selectively etching the base to form first and second pillars in the base that cover and are electrically connected to the first and second conductive traces respectively.

328. The method of claim 321, wherein the conductive traces include a non-copper layer and a copper layer, the base is copper, the non-copper layer contacts the base and the copper layer is spaced from the base.

329. The method of claim 321, wherein the conductive traces include gold and the base is essentially copper.

330. The method of claim 321, wherein an assembly that includes the chip, the conductive traces, the adhesive and the connection joints is devoid of wire bonds, TAB leads and solder joints.

331. A method of connecting conductive traces to a semiconductor chip, comprising:

providing a semiconductor chip that includes first and second conductive pads;

attaching first and second conductive traces to a base, wherein the base electrically connects the conductive traces, and the conductive traces are different metals than the base; then disposing an adhesive between the chip and the conductive traces, thereby mechanically attaching the chip to the conductive traces such that the first and second conductive traces are proximate to the first and second pads respectively; then etching the base, thereby removing a portion of the base that overlaps the pads, exposing the conductive traces and the adhesive and electrically isolating the conductive traces; then etching the adhesive, thereby exposing the pads while the first and second conductive traces are proximate to the first and second pads respectively; and then forming first and second connection joints that contact and electrically connect the first and second conductive traces respectively and the first and second pads respectively.

332. The method of claim 331, wherein attaching the conductive traces to the base includes electroplating the conductive traces on the base.

333. The method of claim 331, wherein etching the adhesive includes applying a laser to the adhesive.

334. The method of claim 331, wherein the first and second conductive traces overlap only one peripheral edge of the first and second pads respectively.

335. The method of claim 331 wherein the first and second conductive traces overlap only two peripheral edges of the first and second pads respectively, and the two peripheral edges are opposite one another.

336. The method of claim 331, wherein the first and second connection joints contact a surface of the first and second conductive traces respectively that is disposed above and overlaps and faces away from the first and second pads respectively.

337. The method of claim 331, wherein the first and second connection joints are the only electrical conductors external to the chip that contact the first and second pads respectively.

338. The method of claim 331, wherein the first and second connection joints and the adhesive are the only materials external to the chip that contact the first and second pads respectively.

339. The method of claim 331, wherein the first and second connection joints and the adhesive are the only materials that contact both the first and second conductive traces respectively and the first and second pads respectively.

340. The method of claim 331, wherein the adhesive is a thermosetting epoxy.

341. The method of claim 331, wherein the adhesive is a thermoplastic polyimide.

342. The method of claim 331, wherein the connection joints are formed by electroplating.

343. The method of claim 331, wherein the connection joints are formed by electroless plating.

344. The method of claim 331, wherein the connection joints are ball bonds formed by thermocompression or thermosonic wire bonding.

345. The method of claim 344, wherein the ball bonds consist of a deformed wire ball.

346. The method of claim 344, wherein the ball bonds contact the adhesive.

347. The method of claim 331, wherein the conductive traces include gold, the connection joints are essentially gold, and the base is essentially copper.

348. The method of claim 331, wherein an assembly that includes the chip, the conductive traces, the adhesive and the connection joints is devoid of wire bonds and TAB leads.

349. The method of claim 331, wherein an assembly that includes the chip, the conductive traces, the adhesive and the connection joints is devoid of solder joints.

350. The method of claim 331, wherein an assembly that includes the chip, the conductive traces, the adhesive and the connection joints is devoid of wire bonds, TAB leads and solder joints.

351. A method of connecting conductive traces to a semiconductor chip, comprising the following steps in the sequence set forth:
forming first and second conductive traces on a base, wherein the base electrically connects the conductive traces, and the conductive traces are different metallic materials from the base;
disposing an insulative adhesive between a chip and the conductive traces, thereby mechanically attaching the chip to the conductive traces, wherein the chip includes upper and lower surfaces, the upper surface includes first and second pads, the conductive traces include top and bottom surfaces, the first and second conductive traces are disposed above and overlap the first and second pads respectively, and the adhesive contacts the upper and bottom surfaces;
applying an etch to the base that is selective of the base with respect to the conductive traces and the adhesive, thereby removing a portion of the base that overlaps the pads, exposing the conductive traces and the adhesive and electrically isolating the conductive traces;
applying an etch to the adhesive, thereby exposing the pads; and
forming first and second connection joints that contact and electrically connect the first and second conductive traces respectively and the first and second pads respectively.

352. The method of claim 351, wherein forming the conductive traces on the base includes electroplating the conductive traces on the base.

353. The method of claim 352, including forming a photoresist layer on the base that selectively exposes portions of the base that define the conductive traces, and electroplating the conductive traces on the selectively exposed portions of the base.

354. The method of claim 351, wherein the first and second conductive traces overlap only one peripheral edge of the first and second pads respectively.

355. The method of claim 351 wherein the first and second conductive traces overlap only two peripheral edges of the first and second pads respectively, and the two peripheral edges are opposite one another.

356. The method of claim 351, wherein applying the etch to the base forms first and second pillars in the base that cover and are electrically connected to the first and second conductive traces respectively.

357. The method of claim 356, wherein the pillars overlap the chip.

358. The method of claim 351, wherein applying the etch to the base includes applying a wet chemical etch that is selective of the base with respect to the conductive traces.

359. The method of claim 351, wherein applying the etch to the adhesive includes applying a laser etch that ablates the adhesive.

360. The method of claim 351, wherein applying the etch to the adhesive includes applying a blanket plasma etch.

361. The method of claim 351, wherein forming the connection joints includes electroplating a metal on the conductive traces and the pads.

362. The method of claim 351, wherein forming the connection joints includes electrolessly plating a metal on the conductive traces and the pads.

363. The method of claim 351, wherein forming the connection joints includes applying thermocompression or thermosonic wire bonding using a capillary that presses first and second wire balls against the first and second conductive traces respectively and the first and second pads respectively to form first and second ball bonds that contact and bond to the first and second conductive traces respectively and the first and second pads respectively.

364. The method of claim 351, wherein the first and second connection joints contact a surface of the first and second conductive traces respectively that is disposed above and overlaps and faces away from the first and second pads respectively.

365. The method of claim 351, wherein the first and second connection joints are the only electrical conductors external to the chip that contact the first and second pads respectively.

366. The method of claim 351, wherein the first and second connection joints and the adhesive are the only materials external to the chip that contact the first and second pads respectively.

367. The method of claim 351, wherein the first and second connection joints and the adhesive are the only materials that contact both the first and second conductive traces respectively and the first and second pads respectively.

368. The method of claim 351, wherein the conductive traces include gold, the connection joints are essentially gold, and the base is essentially copper.

369. The method of claim 351, wherein the connection joints are devoid of solder joints.

370. The method of claim 351, wherein an assembly that includes the chip, the conductive traces, the adhesive and the connection joints is devoid of wire bonds, TAB leads and solder joints.

371. A method of connecting conductive traces to a semiconductor chip, comprising the following steps in the sequence set forth:
providing a metal layer base;
providing a plating mask on the base, wherein the plating mask includes first and second openings that expose first and second portions of the base;
electroplating first and second conductive traces on the first and second exposed portions of the base through the first and second openings in the plating mask, wherein the base electrically connects the conductive traces, the conductive traces include top and bottom surfaces, the top surface contacts the base, and the bottom surface is exposed;
removing the plating mask, thereby exposing outer edges of the conductive traces between the top and bottom surfaces;
mechanically attaching a chip to the conductive traces using an insulative adhesive, wherein the chip includes upper and lower surfaces, the upper surface includes first and second pads, the first and second conductive traces are disposed above and overlap the first and second pads respectively, and the adhesive contacts and is sandwiched between the chip and the conductive traces;
applying an etch that is selective of the base with respect to the conductive traces and the adhesive, thereby removing a portion of the base that overlaps the pads, exposing the conductive traces and the adhesive and electrically isolating the conductive traces;

applying an etch that is selective of the adhesive with respect to the conductive traces and the pads, thereby removing portions of the adhesive and exposing the pads; and forming first and second connection joints that contact and electrically connect the first and second conductive traces respectively and the first and second pads respectively.

372. The method of claim 371, wherein the plating mask is photoresist.

373. The method of claim 371, wherein the adhesive is thermoplastic polyimide.

374. The method of claim 371, wherein applying the etch that is selective of the base includes applying a wet chemical etch that is highly selective of copper with respect to gold.

375. The method of claim 371, wherein applying the etch that is selective of the adhesive includes applying a laser that ablates the adhesive.

376. The method of claim 371, wherein forming the connection joints includes plating a metal on the conductive traces and the pads.

377. The method of claim 371, wherein forming the connection joints includes wire bonding first and second ball bonds on the first and second conductive traces respectively and the first and second pads respectively.

378. The method of claim 371, wherein the conductive traces provide horizontal fan-out routing between the pads and an outer edge of the chip.

379. The method of claim 371, wherein the conductive traces, the connection joints and the chip are devoid of solder joints.

380. The method of claim 371, wherein the conductive traces are inner leads of TAB leads.

* * * * *

UNITED STATES PATENT AND TRADEMARK OFFICE
CERTIFICATE OF CORRECTION

PATENT NO. : 6,653,217 B1
DATED : November 25, 2003
INVENTOR(S) : Charles W.C. Lin It is certified that error appears in the above-identified patent and that said Letters Patent is hereby corrected as shown below:

Column 18,
Lines 56-57, change "the conductive trace on a side opposite" to -- a side of the conductive trace that faces away from --.

Column 24,
Lines 13-14, change "the conductive trace on a side opposite" to -- a side of the conductive trace that faces away from --.

Column 27,
Lines 64-65, change "the conductive trace on a side opposite" to -- a side of the conductive trace that faces away from --.

Column 31,
Lines 41-42, change "the conductive trace on a side opposite" to -- a side of the conductive trace that faces away from --.

Column 35,
Lines 27-28, change "the conductive trace on a side opposite" to -- a side of the conductive trace that faces away from --.

Signed and Sealed this

Twenty-fifth Day of May, 2004

JON W. DUDAS
*Acting Director of the United States Patent and Trademark Office*